US011183087B1

(12) United States Patent
Timmins et al.

(10) Patent No.: US 11,183,087 B1
(45) Date of Patent: Nov. 23, 2021

(54) SUPPORT SYSTEM FOR MODULAR DISPLAY SYSTEM

(71) Applicant: Draper, Inc., Spiceland, IN (US)

(72) Inventors: Adam Timmins, Noblesville, IN (US); Steven E. Enochs, New Palestine, IN (US)

(73) Assignee: Draper, Inc., Spiceland, IN (US)

( * ) Notice: Subject to any disclaimer, the term of this patent is extended or adjusted under 35 U.S.C. 154(b) by 23 days.

(21) Appl. No.: 16/862,714

(22) Filed: Apr. 30, 2020

(51) Int. Cl.
*H05K 7/02* (2006.01)
*H05K 7/04* (2006.01)
*G09F 9/302* (2006.01)
*H05K 5/02* (2006.01)
*H05K 5/00* (2006.01)

(52) U.S. Cl.
CPC ......... *G09F 9/3026* (2013.01); *H05K 5/0017* (2013.01); *H05K 5/0021* (2013.01); *H05K 5/0204* (2013.01)

(58) Field of Classification Search
USPC ....................................................... 361/809
See application file for complete search history.

(56) References Cited

U.S. PATENT DOCUMENTS

| | | | |
|---|---|---|---|
| 3,584,350 A | 6/1971 | Schenk | |
| 4,067,090 A | 1/1978 | Schenk | |
| 5,586,852 A | 12/1996 | Ganter | |
| 5,654,876 A * | 8/1997 | Sathe | H01L 23/4006 257/718 |
| 6,170,793 B1 | 1/2001 | Clarke | |
| 6,279,257 B1 | 8/2001 | Lemire | |
| 7,316,379 B1 | 1/2008 | Graham | |
| 7,694,444 B2 * | 4/2010 | Miller | H05K 7/183 40/446 |
| 7,926,213 B1 * | 4/2011 | Kludt | H05K 5/0017 40/605 |
| 8,456,808 B2 | 6/2013 | Grey et al. | |
| 8,542,499 B2 | 9/2013 | Skull | |
| 8,844,180 B2 | 9/2014 | Kludt et al. | |
| 8,910,804 B2 | 12/2014 | Kim et al. | |
| 9,195,281 B2 | 11/2015 | Hall | |
| 9,299,868 B2 | 3/2016 | Thomas | |
| 9,416,810 B2 | 8/2016 | Swinderman | |
| 9,416,912 B2 | 8/2016 | Grziwok et al. | |
| 9,577,571 B2 | 2/2017 | Atia et al. | |
| 9,879,821 B2 | 1/2018 | Kludt et al. | |

(Continued)

FOREIGN PATENT DOCUMENTS

CN 201723943 U 1/2011
CN 205745925 U 11/2016
(Continued)

OTHER PUBLICATIONS

Installation Methods for LED Signs, EBSCO Signs & Displays, © 2016 EBSCO Sign Group, LLC, https://ebscosigns.com/installation, available Apr. 7, 2016, 5 pages.
(Continued)

*Primary Examiner* — Hung S. Bui
(74) *Attorney, Agent, or Firm* — Faegre Drinker Biddle & Reath LLP

(57) ABSTRACT

Systems and methods for supporting a plurality of display units are disclosed. The systems and methods may support the plurality of display units to form an overall display wall.

36 Claims, 42 Drawing Sheets

(56) References Cited

U.S. PATENT DOCUMENTS

| | | |
|---|---|---|
| 10,527,080 B2 | 1/2020 | Bigot |
| 10,537,032 B2 | 1/2020 | Ran |
| 2005/0087661 A1 | 4/2005 | Rabenius |
| 2006/0171148 A1 | 8/2006 | Huang |
| 2007/0131826 A1 | 6/2007 | Valkai |
| 2019/0179592 A1* | 6/2019 | Hyeon .................. G09G 3/006 |

FOREIGN PATENT DOCUMENTS

| | | |
|---|---|---|
| GB | 2528029 A | 1/2016 |
| WO | WO2010128782 A1 | 11/2010 |

OTHER PUBLICATIONS

Tiled LED Video Wall Mounting System, TIL Series, CHIEF, © 2018 Milestone AV Technologies, https://www.legrandav.com/products/chief/mounts/display/wall-fixed/til, available Aug. 15, 2018, 11 pages.

Peerless 3x3 Video Wall Bolt Down Stand DS-S555-3x3, Peerless-AV, Stands&Mounts.com,https://www.standsandmounts.com/PeerlessVideoWallStand-DS-S555-3x3aspx?gclid=Cj0KCQiAwP3yBRCkARIsAABGiPqHfDBaffFV37z, available Mar. 4, 2020, © 2019 StandsandMounts.com, 3 pages.

\* cited by examiner

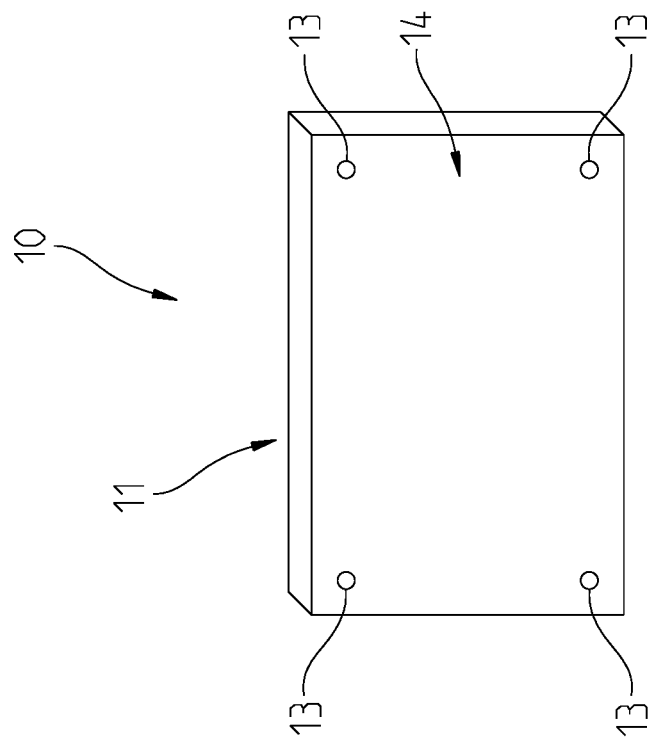
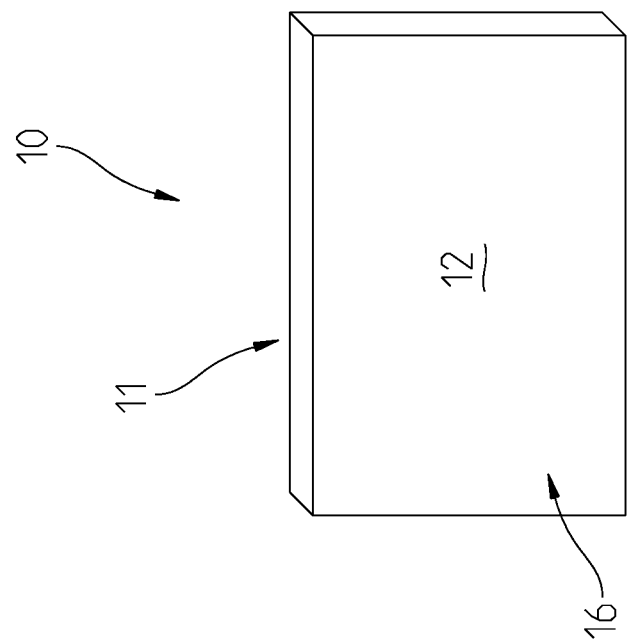

Fig. 3

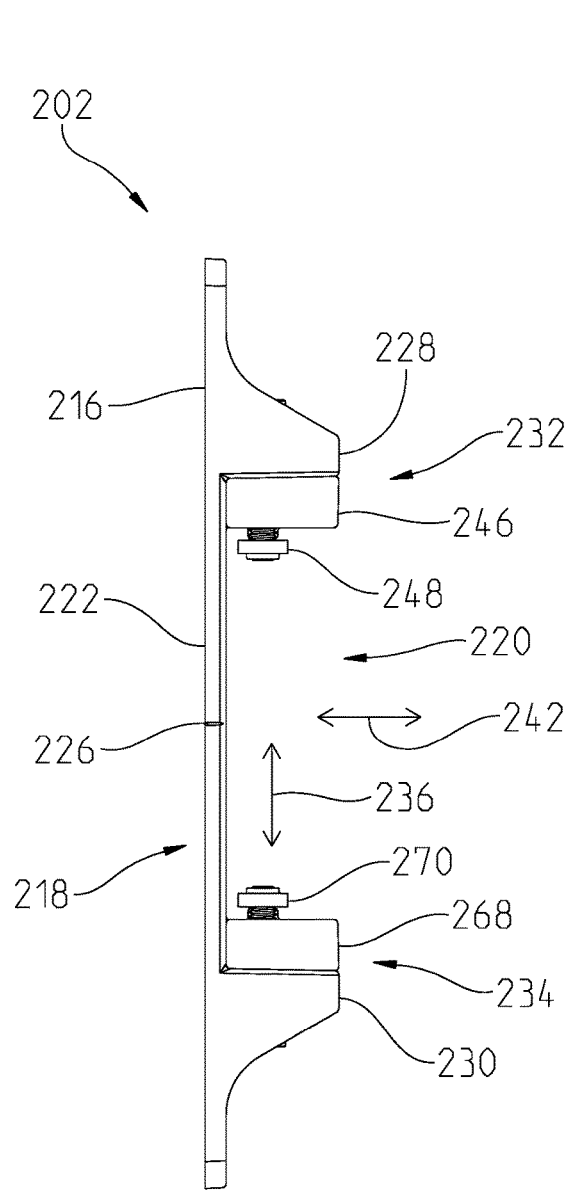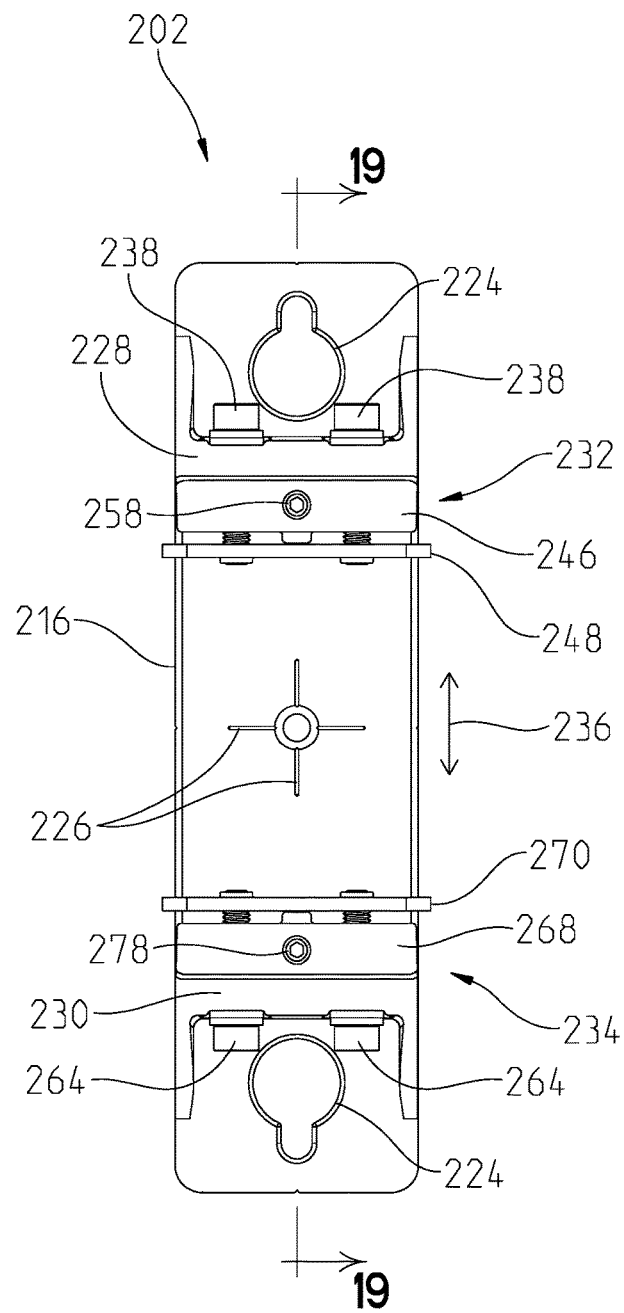
Fig. 17
Fig. 18

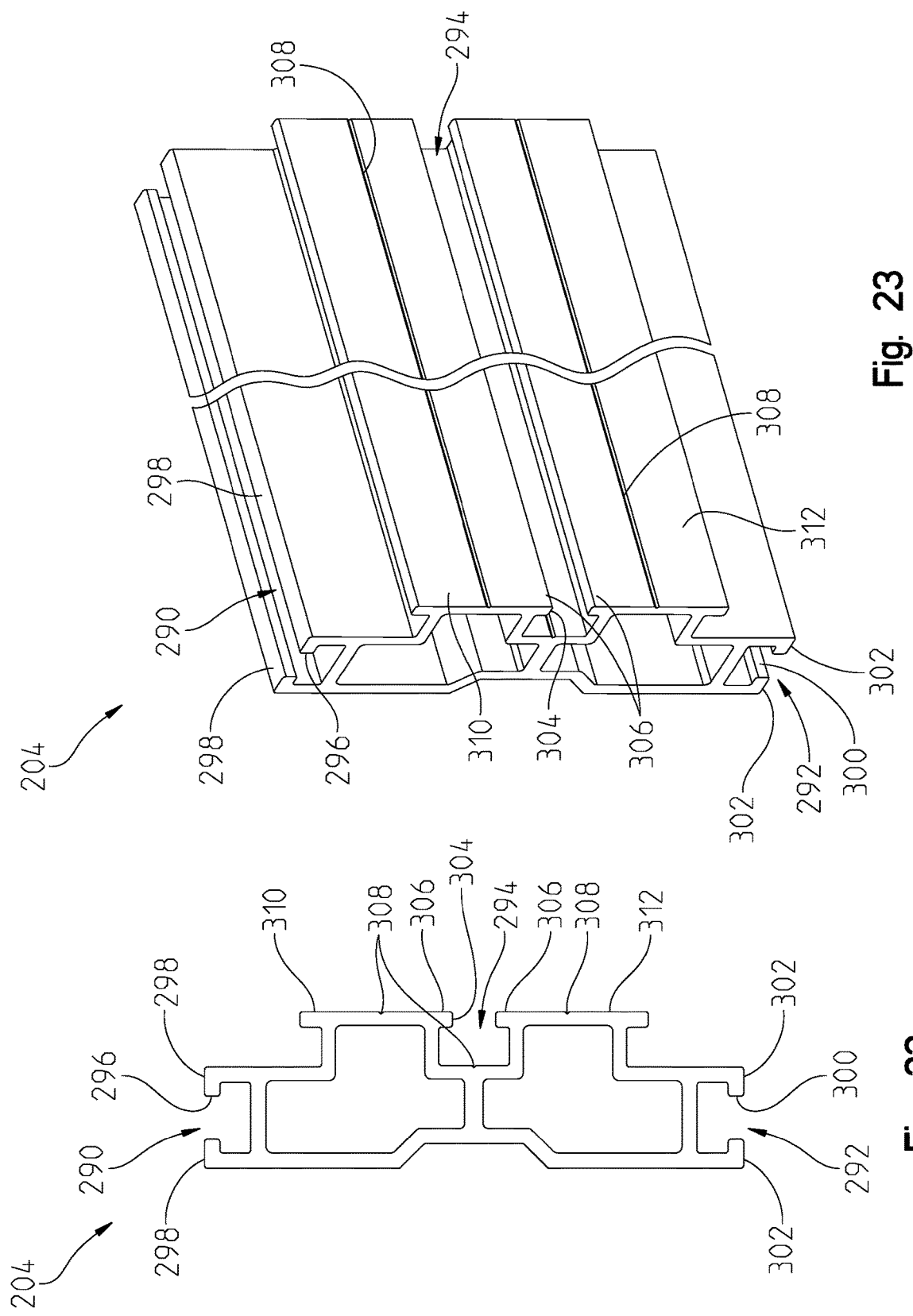

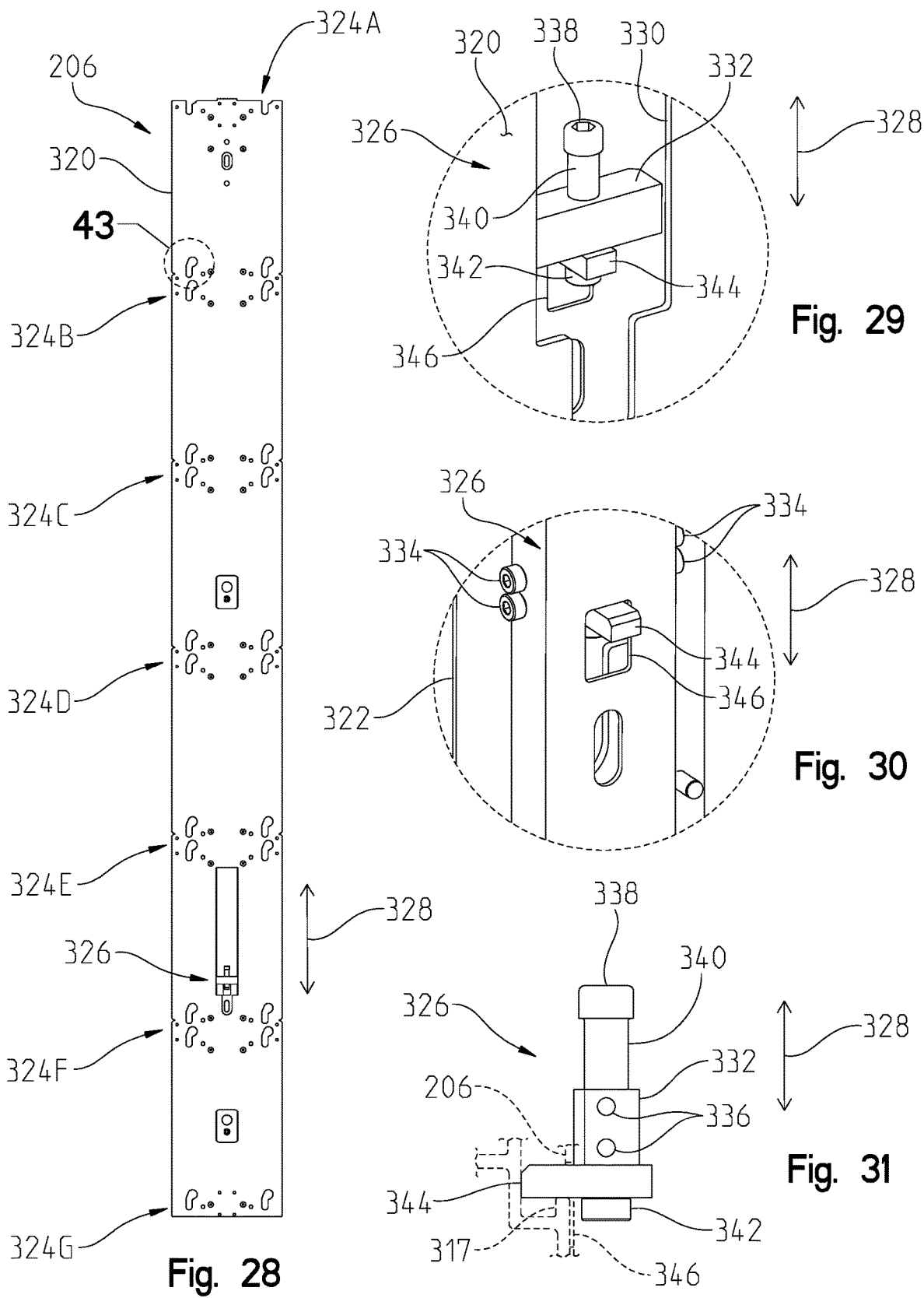

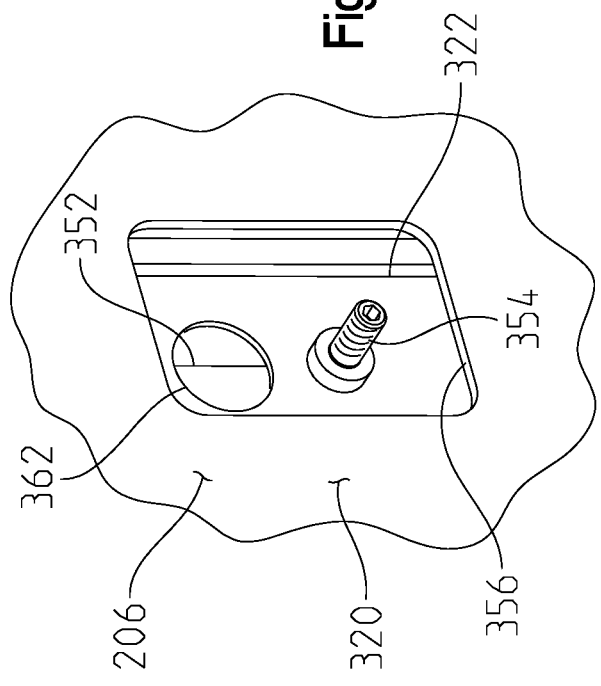
Fig. 36
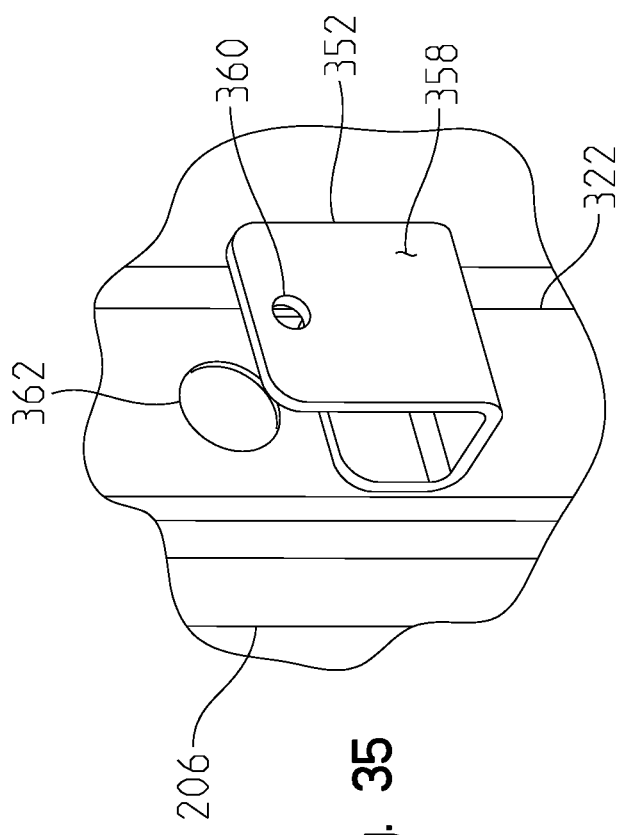
Fig. 35
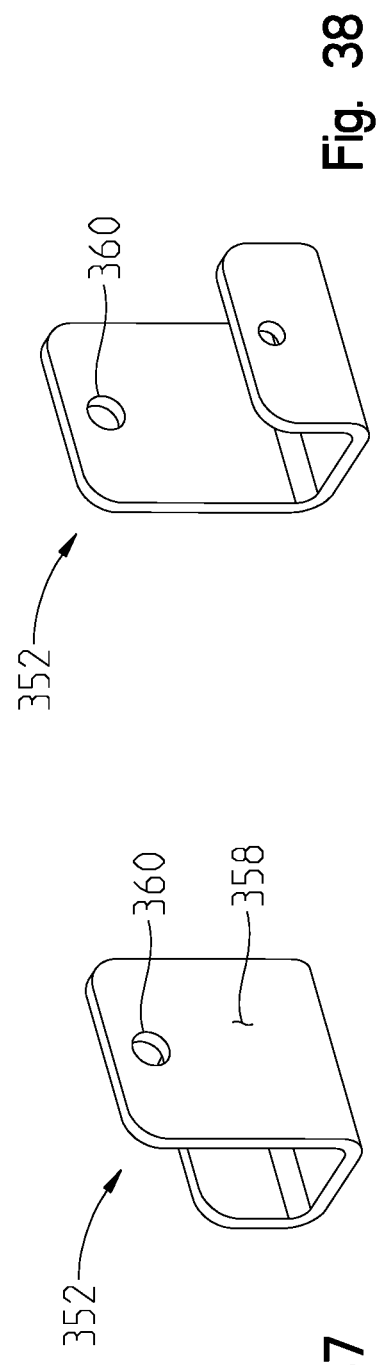
Fig. 38
Fig. 37

SUPPORT SYSTEM FOR MODULAR DISPLAY SYSTEM

FIELD OF THE DISCLOSURE

The present disclosure relates to systems and methods for supporting a plurality of display units, and in particular to systems and methods for supporting a plurality of display units to form an overall display.

BACKGROUND OF THE DISCLOSURE

It is known to position a plurality of display units adjacent each other to form an overall display. Exemplary display units include various digital displays including any number of image formation devices, including light emitting diode (LED) displays, plasma displays, laser phosphor displays (LPD), liquid crystal displays, and other suitable types of digital displays. Each display unit includes a viewing screen. By positioning the display units adjacent to each other the viewing faces of the individual displays may be coordinated to form an overall display. A need exists for a support system which enables precise alignment of the plurality of display units relative to each other.

SUMMARY

The present disclosure provides support systems and methods for supporting a plurality of display units.

In an exemplary embodiment of the present disclosure, a support system for a plurality of display units is provided. The support system is adapted to be coupled to an environmental support structure. The support system includes a frame that is adapted to support the plurality of display units. The frame includes a first frame member and a second frame member spaced apart from the first frame member. The first frame member defines a first support plane and the second frame member defines a second support plane, and a viewing direction of the plurality of display units is angled relative to the second support plane. The support system further includes a plurality of mounts that are adapted to be supported by the environmental support structure and to support the frame. The plurality of mounts includes a first mount and a second mount. The first mount includes a first side that defines an environmental mounting plane, and the first side is adapted to be positionable adjacent the environmental support structure. The first mount further includes a second side, and the first frame member is coupled to the second side of the first mount. The first mount further includes an adjustment assembly that provides an offset adjustment of the first support plane relative to the environmental mounting plane and an angular adjustment of the first support plane relative to the environmental mounting plane. The second mount includes a first side that is adapted to be positionable adjacent the environmental support structure. The second mount further includes a second side, and the second frame member is coupled to the second side of the second mount. The adjustment assembly of the first mount is adapted to position the first support plane of the first frame member parallel to the second support plane of the second frame member and angled relative to the environmental mounting plane of the first mount.

In an example thereof, the viewing direction of the plurality of display units is substantially perpendicular to the second support plane.

In another example thereof, the adjustment assembly of the first mount is adapted to position the first support plane of the first frame member in a coplanar orientation relative to the second support plane of the second frame member and angled relative to the environmental mounting plane of the first mount.

In another example thereof, the support system further includes a display mount adapted to support the plurality of display units. The display mount is coupled to the first frame member and the second frame member, and the display mount defines a mounting plane parallel to the second support plane of the second frame member. In a variation thereof, the display mount includes a main body and an adjuster. The main body is adapted to support the plurality of display units. The adjuster is coupled to the main body, and the adjuster provides a transverse adjustment of the display mount relative to the first frame member and the second frame member in the mounting plane.

In another exemplary embodiment of the present disclosure, a support system for a plurality of display units is provided. The support system is adapted to be coupled to an environmental support structure. The support system includes a frame that is adapted to support the plurality of display units, and the frame includes a first frame member. The support system further includes a plurality of mounts that are adapted to be supported by the environmental support structure and to support the frame. The plurality of mounts include a first mount, and the first mount includes a first side portion and a second side portion. The first side portion includes a mounting surface that is adapted to be positioned adjacent the environmental support structure. The second side portion includes an adjustment mounting assembly that supports the first frame member. The adjustment mounting assembly is movable in an adjustment direction relative to the mounting surface to move the first frame member in the adjustment direction relative to the mounting surface. The adjustment direction is substantially perpendicular to the mounting surface.

In an example thereof, the first frame member is slidable along the adjustment mounting assembly in a transverse direction that is substantially perpendicular to the adjustment direction.

In another example thereof, the adjustment mounting assembly is a first adjustment mounting assembly, and the second side portion further includes a second adjustment mounting assembly supporting the first frame member. The second adjustment mounting assembly is movable in the adjustment direction relative to the mounting surface to move the first frame member in the adjustment direction relative to the mounting surface.

In another example thereof, the adjustment mounting assembly includes a differential screw. The differential screw is adjustable in the adjustment direction relative to the mounting surface to move the first frame member in the adjustment direction relative to the mounting surface. In a variation thereof, the differential screw includes left-handed threads on a first end and right-handed threads on a second end opposite the first end.

In yet another exemplary embodiment of the present disclosure, a support system for a plurality of display units is provided. The support system is adapted to be coupled to an environmental support structure. The support system includes a frame that is adapted to support the plurality of display units, and the frame includes a first frame member. The support system further includes a plurality of mounts that are adapted to be supported by the environmental support structure and to support the frame. The plurality of mounts include a first mount. The first mount includes a base that is adapted to be positioned adjacent the environmental support structure. The first mount further includes an adjustment mounting assembly that is movably coupled to the base. The adjustment mounting assembly slidably supports the first frame member relative to the base in a first direction. The adjustment mounting assembly is movable in a second direction relative to the base to move the first frame member in the second direction relative to the base, the second direction being substantially perpendicular to the first direction.

In an example thereof, the support system further includes a display mount that is adapted to be supported by the frame and adapted to support the plurality of display units. The display mount is adjustable relative to the frame in a third direction, the third direction being substantially perpendicular to the first direction and the second direction.

In an example thereof, the adjustment mounting assembly includes a differential screw. The differential screw is adjustable in the second direction relative to the base to move the first frame member in the second direction relative to the base.

In still another exemplary embodiment of the present disclosure, a support system for a plurality of display units is provided. The support system includes a plurality of mounts that are adapted to support the plurality of display units. A first mount of the plurality of mounts includes a plurality of display unit interfaces. A first display unit interface of the plurality of display unit interfaces includes a receiver that receives a coupler, the coupler being adapted to be coupled to a first display unit of the plurality of display units. The receiver includes a receiver portion that is adapted to receive the coupler upon the coupler moving in a first direction relative to the first mount. The receiver further includes an intermediate portion that is accessible from the receiver portion. The receiver further includes a securement portion that is accessible from the intermediate portion. The securement portion is offset from the receiver portion in (1) a second direction transverse relative to the first direction, and (2) a third direction transverse relative to the first direction and the second direction.

In an example thereof, the receiver portion receives the coupler such that a coupler axis is in a first orientation, and the securement portion holds the coupler relative to the first mount while the coupler axis is in a second orientation different from the first orientation in a plurality of degrees of freedom.

In an example thereof, the receiver portion is enlarged relative to the securement portion.

In yet another exemplary embodiment of the present disclosure, a support system for a plurality of display units is provided. The support system is adapted to be coupled to an environmental support structure. The support system includes a plurality of structural mounts that are adapted to be supported by the environmental support structure. A first structural mount of the plurality of structural mounts includes a base that is adapted to be positioned adjacent the environmental support structure and an adjustment mounting assembly that is movably coupled to the base. The support system further includes a frame that is supported by the plurality of structural mounts. The frame includes a first frame member that is slidably supported by the adjustment mounting assembly of the first structural mount in a first direction relative to the base of the first structural mount. The adjustment mounting assembly is movable in a second direction relative to the base of the first structural mount to move the first frame member in the second direction relative to the base of the first structural mount, the second direction being substantially perpendicular to the first direction. The support system further includes a plurality of display mounts that are supported by the frame. A first display mount of the plurality of display mounts includes a main body that is adapted to support the plurality of display units. The first display mount further includes an adjuster that is coupled to the main body. The adjuster is adjustable to move the first display mount in a third direction relative to the frame, the third direction being substantially perpendicular to the first direction and the second direction.

In an example thereof, the adjustment mounting assembly is a first adjustment mounting assembly, and the first structural mount further includes a second adjustment mounting assembly that slidably supports the first frame member in the first direction relative to the base of the first structural mount. The second adjustment mounting assembly is movable in the second direction relative to the base of the first structural mount to move the first frame member in the second direction relative to the base of the first structural mount. In a variation thereof, the first adjustment mounting assembly includes a first differential screw and the second adjustment mounting assembly includes a second differential screw. The first differential screw is adjustable in the second direction relative to the base of the first structural mount to move the first frame member in the second direction relative to the base of the first structural mount. The second differential screw is adjustable in the second direction relative to the base of the second structural mount to move the second frame member in the second direction relative to the base of the second structural mount.

In another exemplary embodiment of the present disclosure, a coupler for coupling a display unit to a mount is provided. One of the display unit and the mount includes an aperture. The coupler includes a first end portion that is adapted to be received by the aperture, and the first end portion includes a first shoulder. The coupler further includes a second end portion opposite the first end portion. The second end portion is adapted to couple to the other of the display unit and the mount. The coupler further includes a second shoulder that is movable relative to the first shoulder. The coupler further includes a biasing element that biases the second shoulder toward the first shoulder such that the coupler is adapted to compressively engage the one of the display unit and the mount between the first shoulder and the second shoulder.

In an example thereof, the coupler further includes a third shoulder, and the biasing element is compressed between the second shoulder and the third shoulder.

In an example thereof, the biasing element includes a compression spring. In a variation thereof, the compression spring includes a crest-to-crest wave spring.

In yet another exemplary embodiment of the present disclosure, a method of forming a display wall with a plurality of display units on an environmental support structure is provided. The method includes: (a) coupling a support system to the environmental support structure; the support system including a plurality of display unit interfaces, each display unit interface including a plurality of elongated receivers; (b) assembling a first display unit to a first group of the display unit interfaces including a first display unit interface, wherein the first display unit is coupled to the first display unit interface with a first receiver of the first display unit interface, the first group of display unit interfaces supporting the first display unit; (c) assembling a second display of the plurality of display units to a second group of the display unit interfaces different than the first group of display unit interfaces, the second group of display unit interfaces including the first display unit interface, wherein the second display unit is coupled to the first display unit interface with a second receiver of the first display unit interface, the second group of display unit interfaces supporting the second display unit; and (d) prior to steps (b) and (c) adjusting the support system to position the first group of display unit interfaces and the second group of display unit interfaces to support the first display unit and the second display unit with parallel viewing directions.

In an example thereof, step (a) includes coupling a first mount and a second mount of the support system to the environmental support structure, and coupling a first frame member and a second frame member of the support system to the first mount and the second mount, respectively; and step (d) includes prior to steps (b) and (c) adjusting the first frame member via the first mount to position a first support plane of the first frame member parallel to a second support plane of the second frame member. In a variation thereof, step (a) further includes coupling a display mount to the first frame member and the second frame member, the display mount including the first display unit interface; and step (d) further includes prior to steps (b) and (c) adjusting the display mount in a mounting plane defined by the display mount and parallel to the second support plane of the second frame member.

In still another exemplary embodiment of the present disclosure, a method of forming a display wall with a plurality of display units on an environmental support structure is provided. The method includes (a) coupling a support system to the environmental support structure, the support system having an outer envelope and the environmental support having a non-planar contour within the outer envelope of the support system; the support system including a plurality of display unit interfaces; (b) supporting a first display unit of the plurality of display units with a first group of the display unit interfaces including a first display unit interface; (c) supporting a second display of the plurality of display units with a second group of the display unit interfaces different than the first group of display unit interfaces; and (d) prior to steps (b) and (c) adjusting the support system to position the first group of display unit interfaces and the second group of display unit interfaces to support the first display unit and the second display unit with parallel viewing directions.

In an example thereof, step (a) includes coupling a first mount and a second mount of the support system to the environmental support structure, and coupling a first frame member and a second frame member of the support system to the first mount and the second mount, respectively; and step (d) includes prior to steps (b) and (c) adjusting the first frame member via the first mount to position a first support plane of the first frame member parallel to a second support plane of the second frame member and angled relative to the non-planar contour of the environmental support. In a variation thereof, the first mount includes a differential screw, and step (d) includes prior to steps (b) and (c) adjusting the first frame member by adjusting the differential screw.

In yet another exemplary embodiment of the present disclosure, a method of forming a display wall with a plurality of display units is provided. The method includes assembling a support system including a plurality of mounts; assembling the plurality of display units to the support system, including piloting a first display unit of the plurality of display units, along a first direction, to a securable position relative to the plurality of mounts; and securing the first display unit by moving the first display unit from the securable position to a secured position along (1) a second direction transverse relative to the first direction, the second direction including a downward component, and (2) a third direction transverse relative to the first direction and the second direction, the third direction including a horizontal component, wherein the secured position is offset from the securable position in both the second direction and the third direction.

In an example thereof, securing the first display unit by moving the first display unit from the securable position to the secured position includes receiving a coupler in a receiver. In a variation thereof, the receiver includes a receiver portion, an intermediate portion accessible from the receiver portion, and a securement portion accessible from the intermediate portion, and wherein receiving the coupler in the receiver includes moving the coupler in the intermediate portion while moving the coupler in both the second direction and the third direction.

In yet another exemplary embodiment of the present disclosure, a method of forming a display wall with a plurality of display units is provided. The method includes assembling a support system. Assembling the support system includes providing a frame member; providing a plurality of mounts, a first mount of the plurality of mounts including a base and an adjustment mounting assembly movably coupled to the base; slidably coupling the frame member to the adjustment mounting assembly in a first direction; coupling the first mount to an environmental support structure; and moving the adjustment mounting assembly in a second direction relative to the base to move the first frame member in the second direction relative to the base, the second direction being substantially perpendicular to the first direction. The method further includes assembling the plurality of display units to the support system.

In an example thereof, the frame member is a first frame member, and further including coupling a second frame member to a second mount of the plurality of mounts; and coupling the second mount to the environmental support structure. Moving the adjustment mounting assembly in the second direction relative to the base to move the first frame member in the second direction relative to the base includes aligning the first frame member with the second frame member. In a variation thereof, coupling the first mount to the environmental support structure includes coupling the first mount to a non-planar contour of the environmental support structure.

In another example thereof, moving the adjustment mounting assembly in the second direction relative to the base to move the first frame member in the second direction relative to the base includes moving a differential screw in the second direction relative to the base.

BRIEF DESCRIPTION OF THE DRAWINGS

The above-mentioned and other features and advantages of this disclosure, and the manner of attaining them, will become more apparent and will be better understood by reference to the following description of exemplary embodiments taken in conjunction with the accompanying drawings, wherein:

FIG. 1 illustrates a representative front, perspective view of an exemplary display unit;

FIG. 2 illustrates a representative rear, perspective view of the exemplary display unit of FIG. 1;

FIG. 3 illustrates a representative front view of an exemplary display wall formed by a plurality of display units;

FIG. 17 illustrates a side view of the structural mount of FIG. 15;

FIG. 18 illustrates a front view of the structural mount of FIG. 15;

FIG. 22 illustrates a side view of an exemplary frame member of the support system of FIG. 9;

FIG. 23 illustrates a front, perspective view of the frame member of FIG. 22;

FIG. 28 illustrates a front view of the display mount of FIG. 26;

FIG. 29 illustrates an exemplary adjuster of the display mount within detail area 29 of FIG. 26;

FIG. 30 illustrates the adjuster of the display mount within detail area 30 of FIG. 27;

FIG. 31 illustrates a side view of the adjuster of FIGS. 29-30 and the display mount of FIG. 26 and a frame member of FIG. 22 (illustrated with phantom lines);

FIG. 35 illustrates a partial rear, perspective view of the display mount of FIG. 26 and an exemplary adjustment bracket;

FIG. 36 illustrates a partial front, perspective view of the display mount of FIG. 26 and the adjustment bracket of FIG. 35;

FIG. 37 illustrates a rear, perspective view of the adjustment bracket of FIG. 35;

FIG. 38 illustrates a front, perspective view of the adjustment bracket of FIG. 35;

Corresponding reference characters indicate corresponding parts throughout the several views. The exemplification set out herein illustrates an exemplary embodiment of the invention and such exemplification is not to be construed as limiting the scope of the invention in any manner.

DETAILED DESCRIPTION OF THE DRAWINGS

Figure 4:
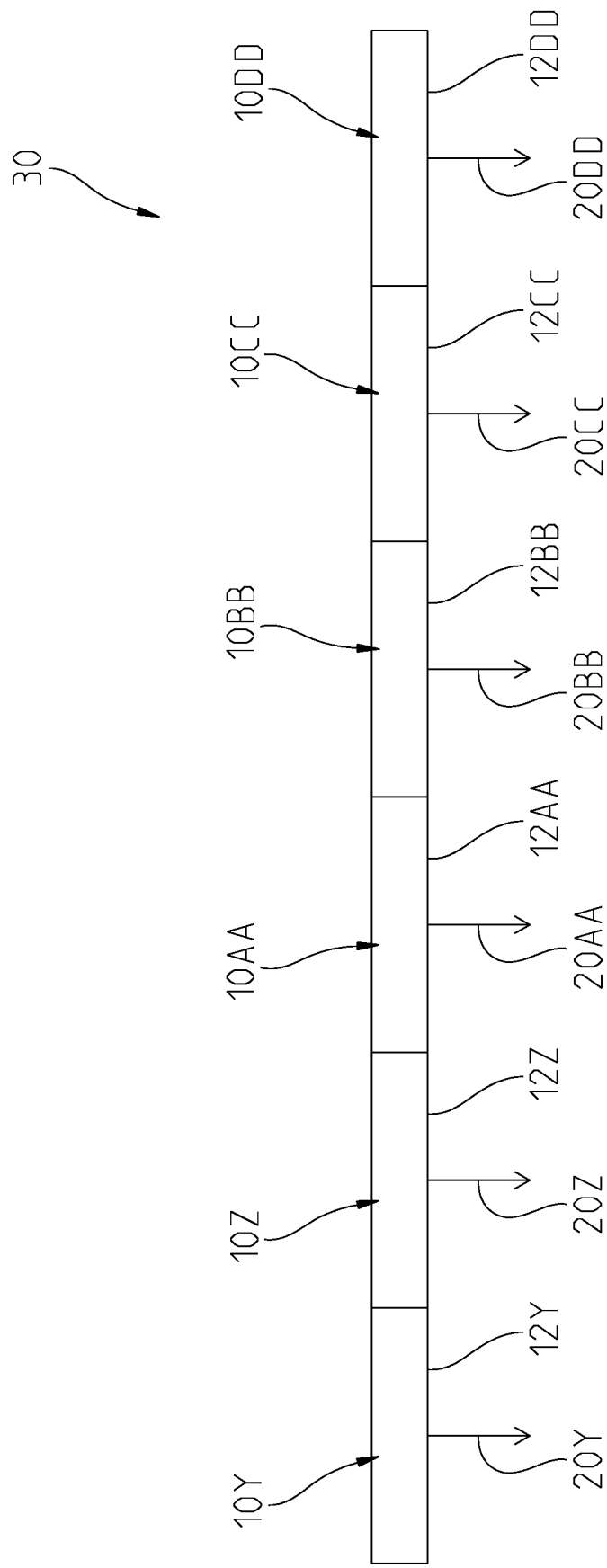
FIG. 4 illustrates a representative top view of the display wall of FIG. 3.

For the purposes of promoting an understanding of the principles of the present disclosure, reference is now made to the embodiments illustrated in the drawings, which are described below. The embodiments disclosed below are not intended to be exhaustive or limit the present disclosure to the precise form disclosed in the following detailed description. Rather, the embodiments are chosen and described so that others skilled in the art may utilize their teachings. Therefore, no limitation of the scope of the present disclosure is thereby intended. Corresponding reference characters indicate corresponding parts throughout the several views.

In some instances throughout this disclosure and in the claims, numeric terminology, such as first, second, third, and fourth, is used in reference to various components, inputs, and other items. Such use is not intended to denote an ordering of the components. Rather, numeric terminology is used to assist the reader in identifying the component being referenced and should not be narrowly interpreted as providing a specific order of components.

The present disclosure relates to systems and methods for supporting a plurality of display units. Exemplary display units include various digital displays including any number of image formation devices, including light emitting diode (LED) displays, plasma displays, laser phosphor displays (LPD), liquid crystal displays, and other suitable types of digital displays.

Referring to FIGS. 1 and 2, representative views of a display unit 10 are provided. Display unit 10 includes a chassis 11 and a viewing screen 12 on a front side 16 of display unit 10. Chassis 11 houses image formation devices, such as light emitting diode display devices, plasma display devices, laser phosphor display devices, liquid crystal display devices, and other suitable types of display devices, and electronics which control the image displayed on viewing screen 12. On a rear side 14 of display unit 10, interfaces 13 are provided which may couple to display mounts or stands to position display unit 10. Interfaces 13 may include one or more recesses and/or one or more protrusions which cooperate with corresponding features on a coupler to secure display unit 10 to the respective mount or stand.

Figure 3:
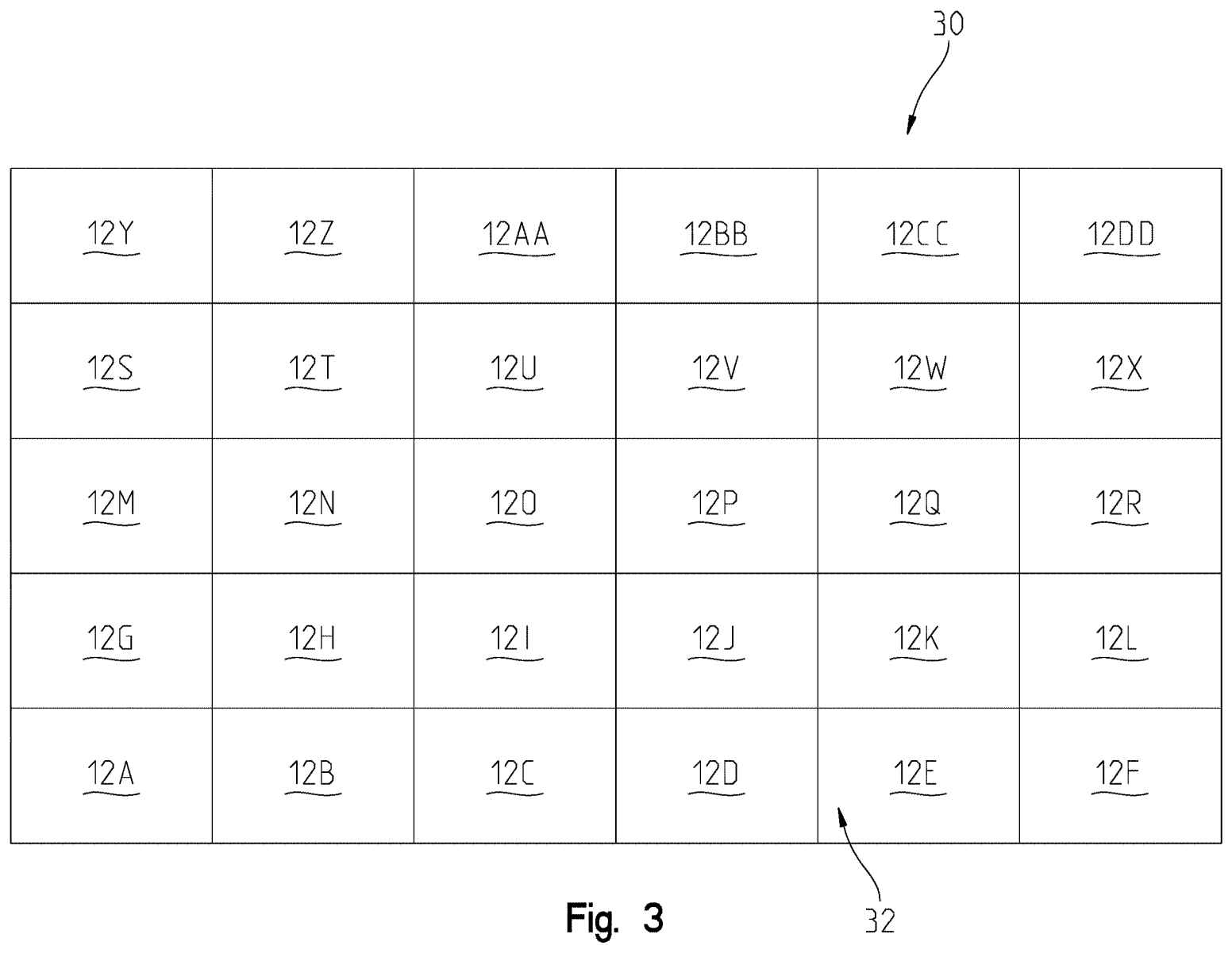

A plurality of display units 10 may be positioned to form a display wall. FIG. 3 illustrates an exemplary display wall 30 formed from thirty display units 10 positioned generally edge-to-edge in five rows of six display units 10. The viewing screens 12A-12DD of the thirty display units 10 form a larger viewing screen 32. As is known in the art, the image formation devices of the various display units 10 may be controlled to display portions of an image so that the larger viewing screen 32 of display wall 30 displays the entire image.

Referring to FIG. 4, a top view of display wall 30 is shown. As illustrated in FIG. 4, each display unit 10 has a flat viewing screen 12 with a viewing direction 20 normal to viewing screen 12. Each of viewing directions 20 are parallel to each other. As such, larger viewing screen 32 is flat.

Figure 5:
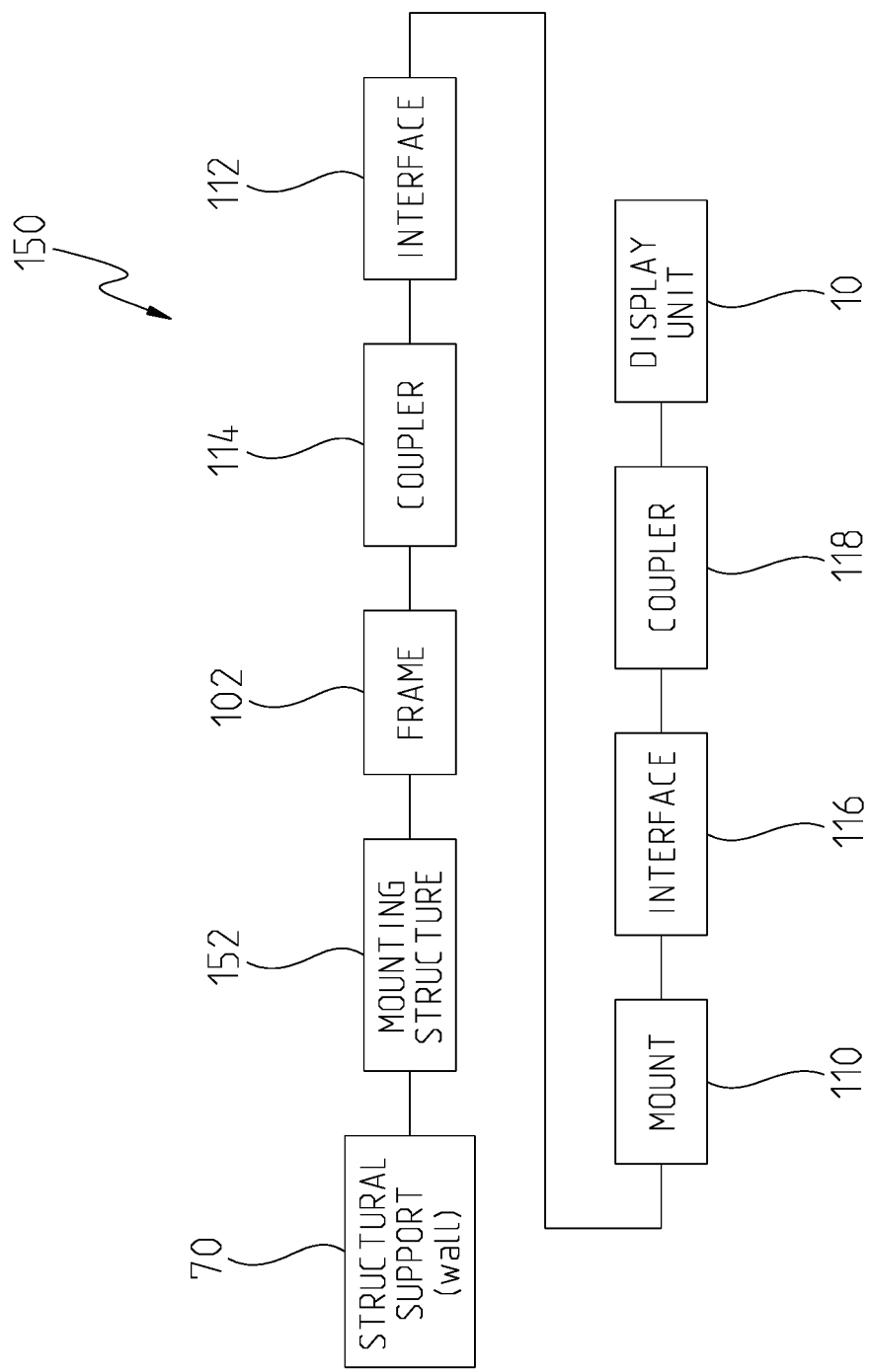
FIG. 5 illustrates a representative view of an exemplary support system for a display unit which is supported by a support structure.

Referring to FIG. 5, an exemplary support system 150 for display unit 10 is represented. In some embodiments, support system 150 may be disassembled to facilitate ease of transport and storage. Further, support system 150 may have a modular design which permits additional columns of display units 10 to be added to a display wall 30 or columns to be removed from a display wall 30. Additionally, support system 150 includes adjustability to accommodate different versions of display units 10.

Support system 150 includes a frame 102. Frame 102 is coupled to a mounting structure 152 which in turn couples frame 102 to a vertically extending environmental support structure 70, such as a wall or other structural components (for example, beams, pillars, and the like). Frame 102 is secured to mounting structure 152.

Each of display units 10 is coupled to frame 102 through one or more display mounts 110. A mount 110 is secured to frame 102 through a respective coupler 114. In turn, a display unit 10 is secured to mount 110 through a respective coupler 118.

Mount 110 has a first interface 112 which cooperates with coupler 114 to secure mount 110 to coupler 114. Interface 112 may include one or more recesses and/or one or more protrusions which cooperate with corresponding features on coupler 114 to secure mount 110 to frame 102. In some embodiments, coupler 114 is a separate component or an assembly of components coupled to frame 102. In another embodiment, coupler 114 is an integral portion of one or more components of frame 102.

Mount 110 has a second interface 116 which cooperates with coupler 118 to secure coupler 118 to mount 110. Interface 116 may include one or more recesses and/or one or more protrusions which cooperate with corresponding features on coupler 118 to secure coupler 118 to mount 110. In some embodiments, coupler 118 is a separate component or an assembly of components coupled to display unit 10. In another embodiment, coupler 118 is an integral portion of one or more components of display unit 10.

Figure 6:
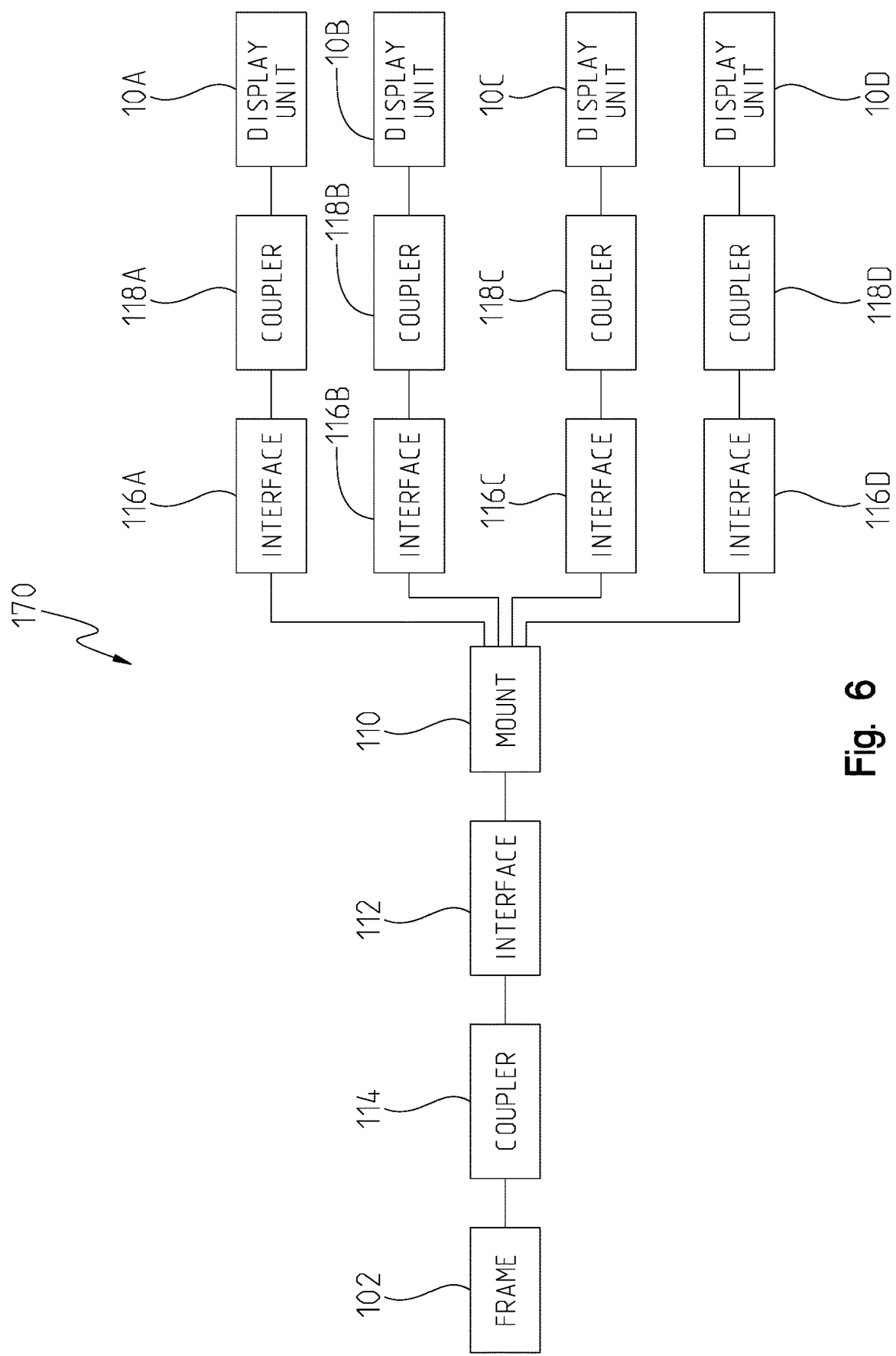
FIG. 6 illustrates a representative view of an exemplary support system for a plurality of display units coupled to a frame through a common mount.

Referring to FIG. 6, another exemplary support system 170 for display unit 10 is represented. Support system 170 may be coupled to, for example, mounting structure 152 (shown elsewhere). In support system 170, mount 110 includes first interface 112 to couple coupler 114 and a plurality of interfaces 116A-D each for coupling a respective display unit 10A-D to mount 110 through couplers 118A-D.

Figure 7:
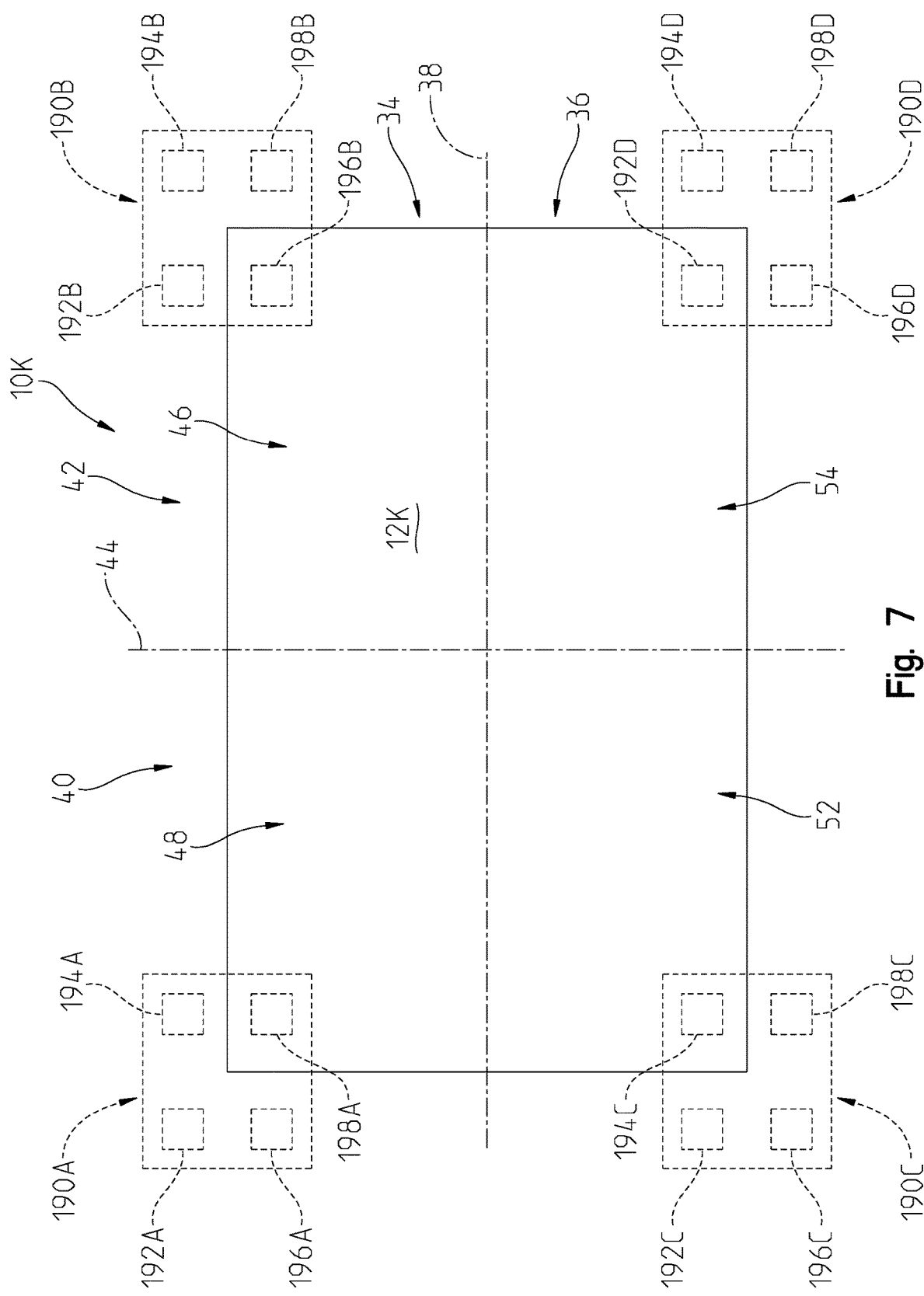
FIG. 7 illustrates a representative front view of a display unit and a plurality of display mounts to support the display unit.

Referring to FIG. 7, an exemplary positioning of a display unit 10K relative to four display mounts 190A-D is shown. Display mounts 190A-D are exemplary embodiments of mount 110. Each of display mounts 190A-D includes a first interface 192, a second interface 194, a third interface 196, and a four interface 198. Each of first interface 192, second interface 194, third interface 196, and fourth interface 198 are adapted to couple a portion of display unit 10K to the respective display mount 190 through a coupler 118 (not shown).

Viewing screen 12K of display unit 10K is divided into an upper half 34 and a lower half 36 by a horizontal centerline 38 and is divided into a left side half 40 and a right side half 42 by a vertical centerline 44. As such, horizontal centerline 38 and vertical centerline 44 divide viewing screen 12K of display unit 10K into an upper right quadrant 46, an upper left quadrant 48, a lower left quadrant 52, and a lower right quadrant 54. As shown, each of display mounts 190A-D are positioned in only one of the quadrants 46, 48, 52, and 54 of viewing screen 12K of display unit 10K. An advantage, among others, for this arrangement is that display mounts 190A-D may be used to couple adjacent display units 10 to frame 102 since none of the display mounts extend over one of horizontal centerline 38 or vertical centerline 44. In an alternative embodiment, at least one display mount 190 spans at least one of horizontal centerline 38 or vertical centerline 44.

Figure 8:
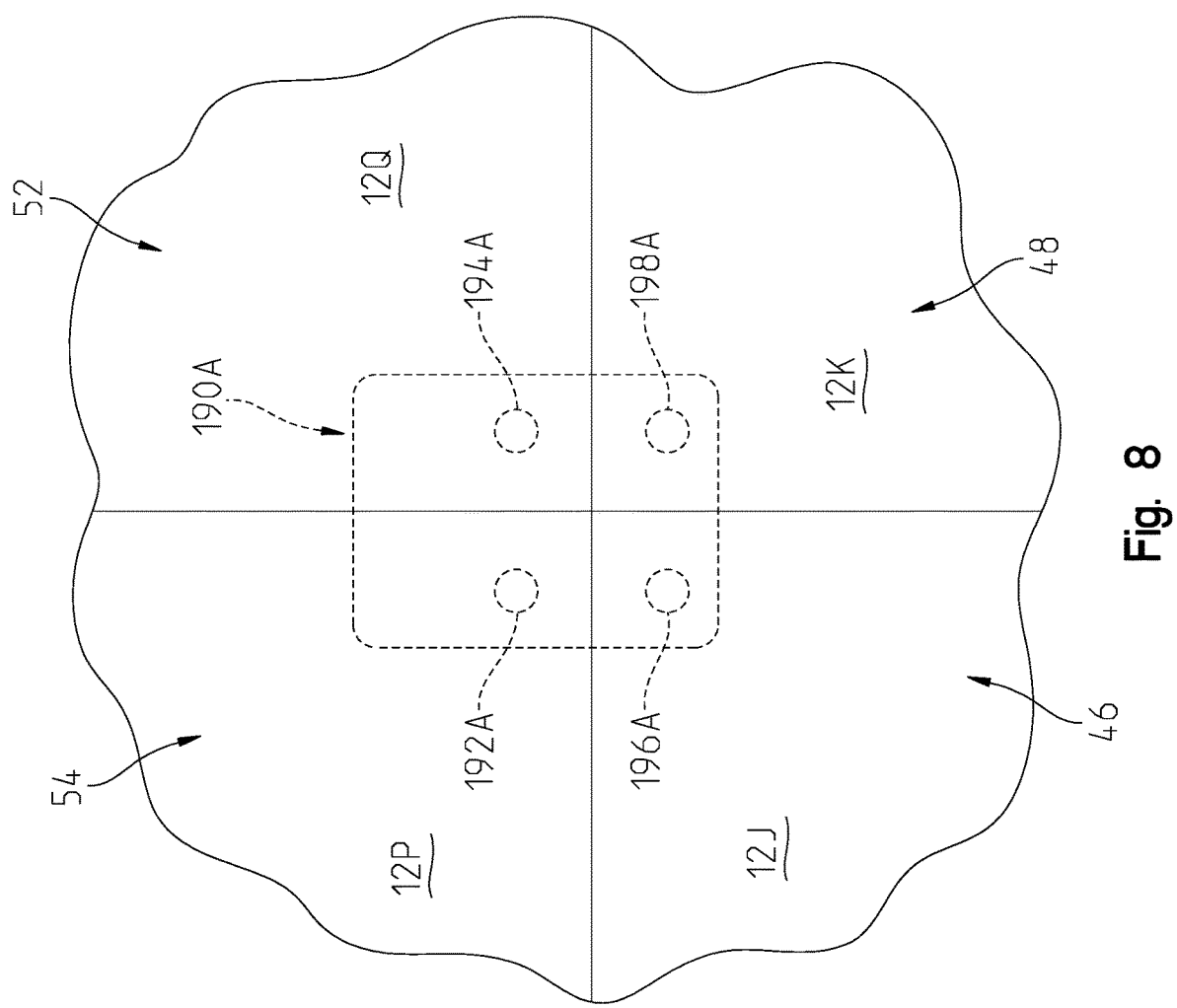
FIG. 8 illustrates a representative front view of a plurality of display units and a common display mount to support each of the display units.

Referring to FIG. 8, display mount 190A is positioned overlapping the respective viewing screens 12P, 12Q, 12J, and 12K of display units 10P, 10Q, 10J, and 10K. Display mount 190A is positioned in upper right quadrant 46 of viewing screens 12J of display units 10J, in upper left quadrant 48 of viewing screen 12K of display unit 10K, in lower left quadrant 52 of viewing screens 12Q of display units 10Q, and in lower right quadrant 54 of viewing screens 12P of display units 10P.

Figure 9:
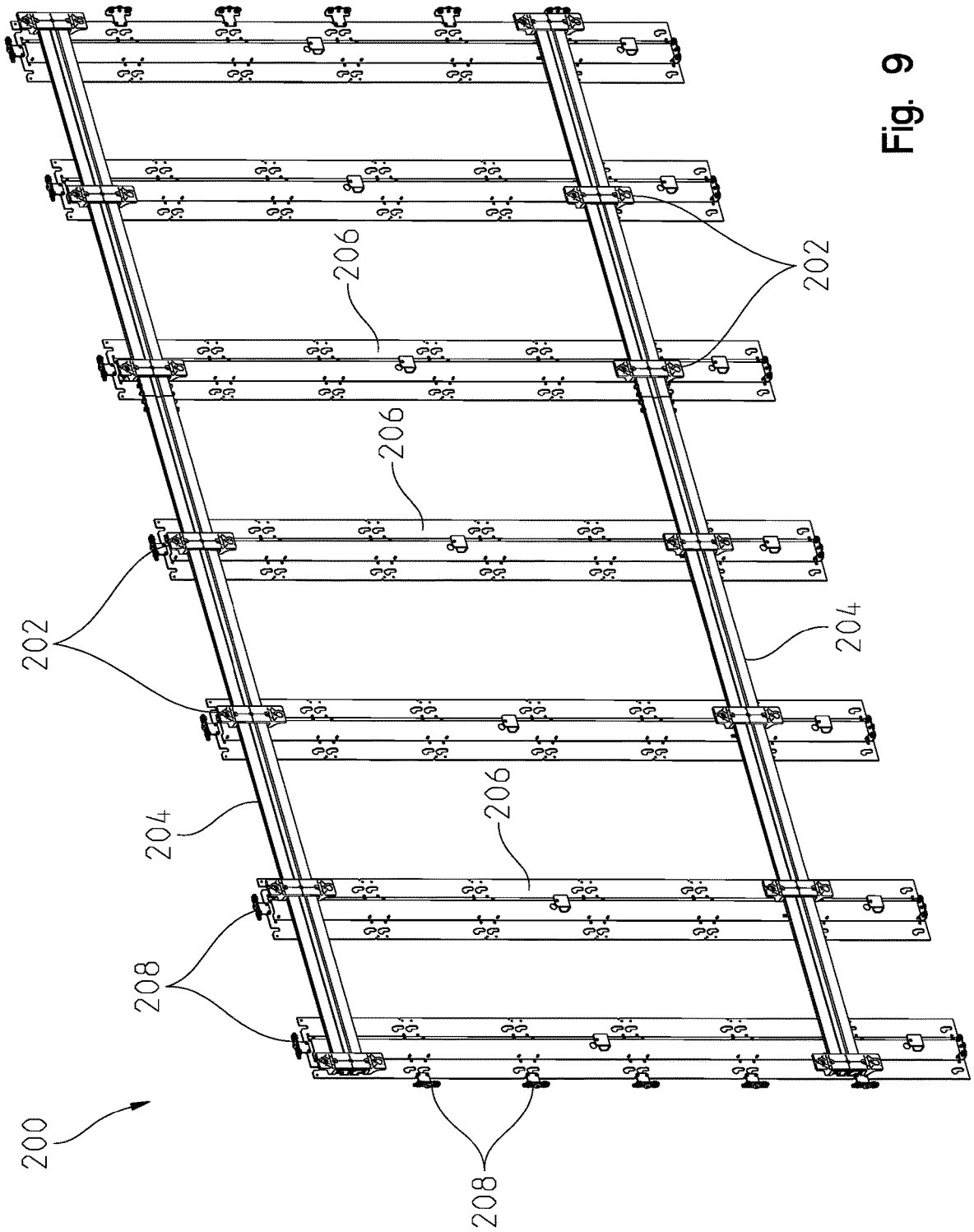
FIG. 9 illustrates a rear, perspective view of an exemplary support system for a plurality of display units.
Figure 10:
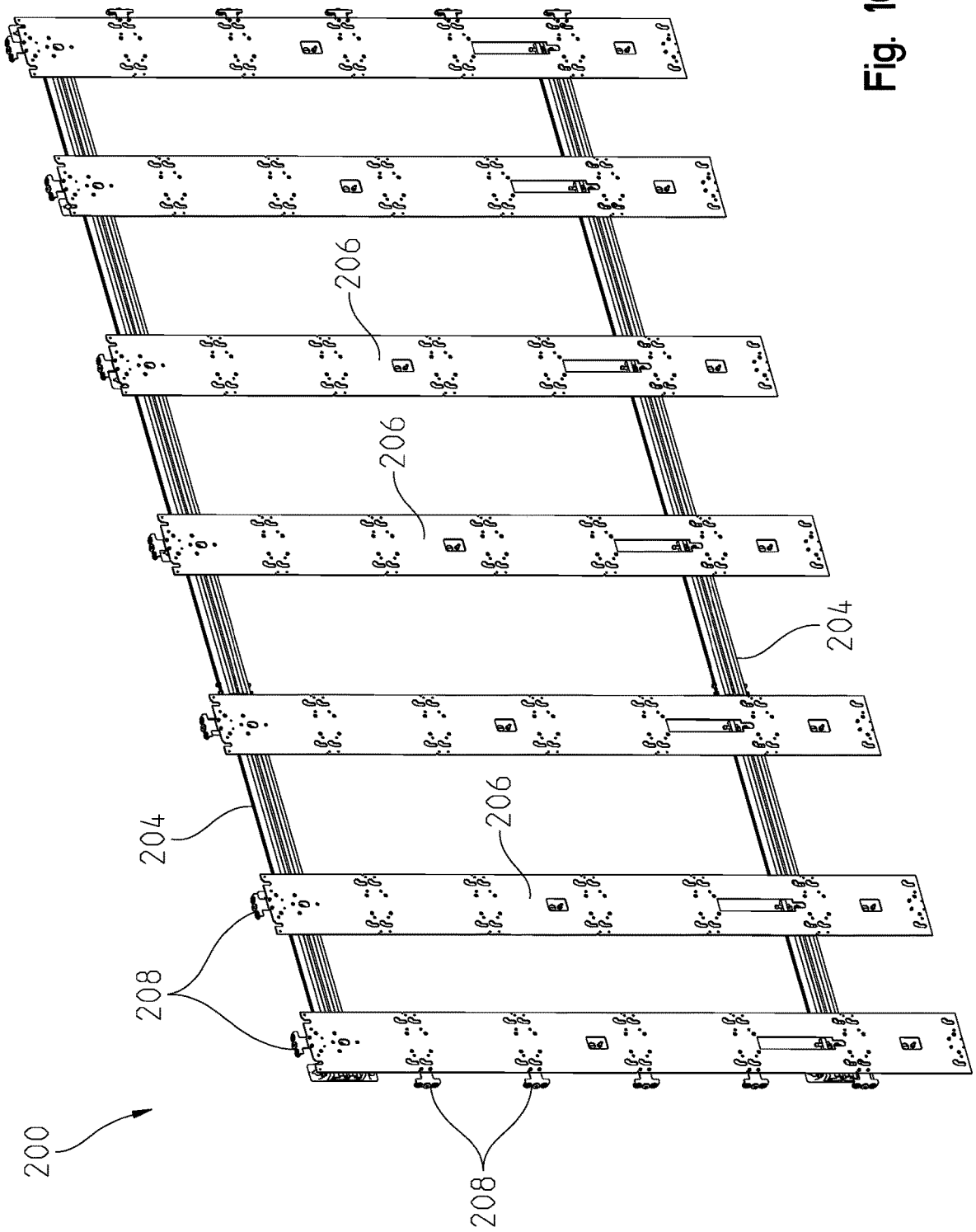
FIG. 10 illustrates a front, perspective view of the support system of FIG. 9.

Referring to FIGS. 9 and 10, an exemplary support system 200 is shown. Support system 200 is an exemplary embodiment of support system 170. Generally, in support system 200 mounting structure 152 includes a plurality of structural mounts 202 (four of which are identified in FIG. 9) that are adapted to be supported by environmental support structure 70 (shown elsewhere—for example, a wall). In support system 200, frame 102 includes a plurality of frame members 204, which may also be referred to as horizontal rails. Frame members 204 are supported by structural mounts 202. Frame members 204 support a plurality of display mounts 206 (three of which are identified), which are an exemplary embodiment of components that provide one or more of mounts 190, and which may also be referred to as vertical rails. Display mounts 206 are adapted to support display units 10 (shown elsewhere). Additionally, as explained in more detail herein, display mounts 206 support various trim brackets 208 (four of which are identified) for coupling trim components (shown elsewhere) to support system 200.

Exemplary support system 200 is shown as including fourteen structural mounts 202 (arranged in two rows and seven columns of structural mounts 202), four frame members 204 (each row of structural mounts 202 supporting two frame members 204 coupled to each other by fasteners and brackets (not shown)), and seven mounts. However, support systems may include various other arrangements and/or numbers of structural mounts, frame members, and display mounts. Although not illustrated, a specific example of such a support system includes twenty seven structural mounts (arranged in three rows and nine columns of structural mounts), nine frame members (each row of structural mounts supporting three frame members coupled to each other by fasteners and brackets), and eighteen display mounts (arranged in nine columns of two display mounts coupled to each other by fasteners and brackets).

Figure 11:
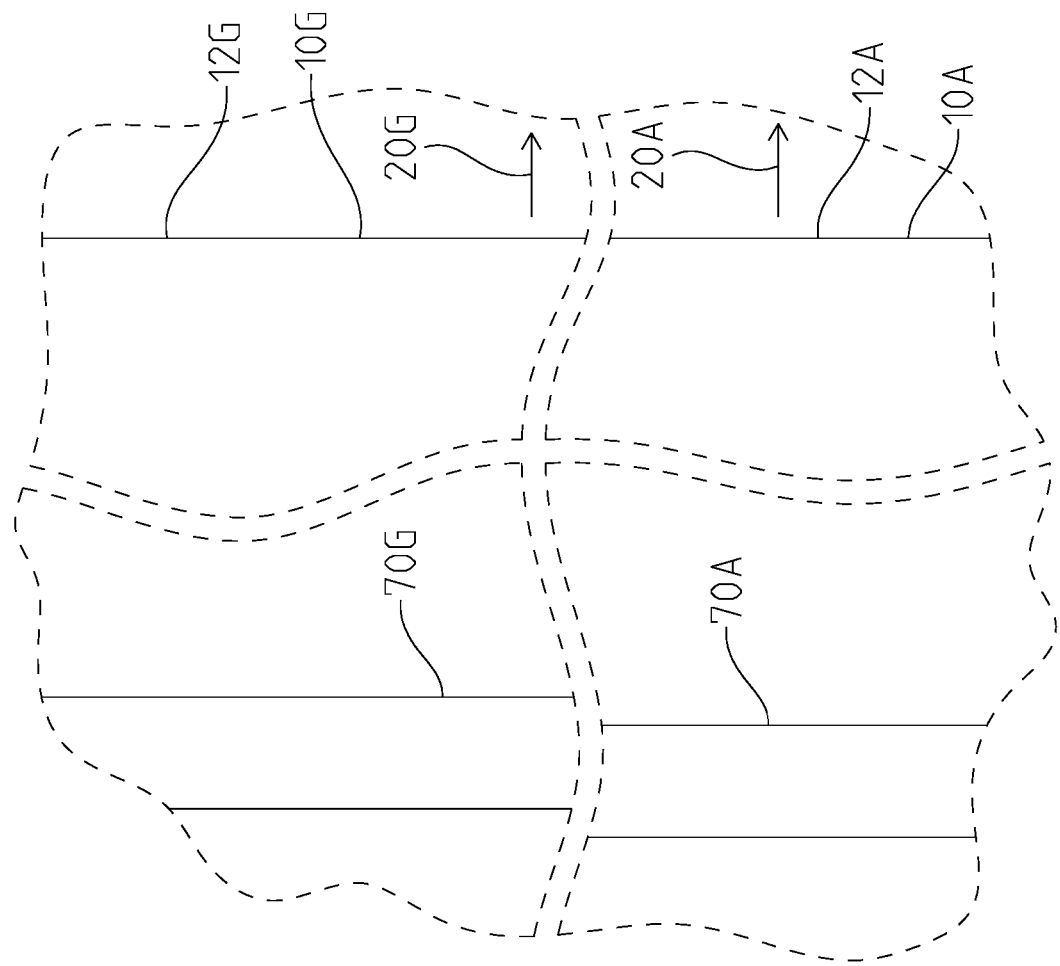
FIG. 11 illustrates a partial side view of viewing screens of display units in a common plane despite the support system of FIG. 9 coupled to a support structure having uneven portions.

As explained in more detail herein, support system 200 is adjustable in various directions to facilitate precise alignment of display units 10 (shown elsewhere) relative to each other. For example and referring to FIG. 11, such adjustability may facilitate positioning viewing screens of display units in a common plane (viewing screens 12G and 12A of display units 10G and 10A being illustrated, for example) and providing display units with parallel viewing directions 20G and 20A in situations in which support system 200 is coupled to a support structure including uneven portions (two uneven portions 70G and 70A being illustrated, for example). Such unevenness may be due to waviness of the surface of the support structure, the presence of imperfections on the surface of the support structure, the presence of repair materials (for example, spackling) on the surface of the support structure, or the like.

Figure 12:
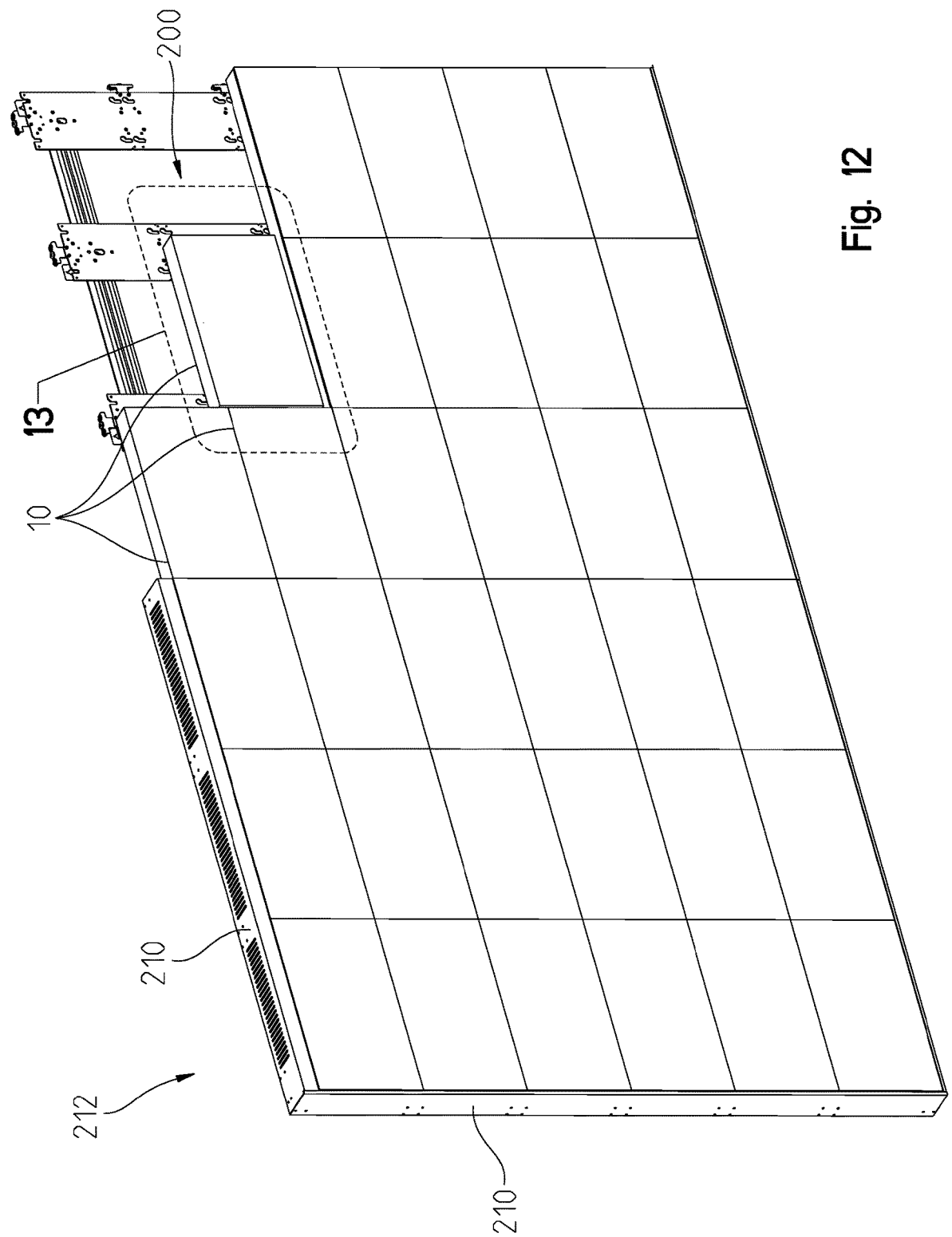
FIG. 12 illustrates a front, perspective view of a plurality of display units and a plurality of trim components coupled to the support system of FIG. 9 to provide a display wall.
Figure 13:
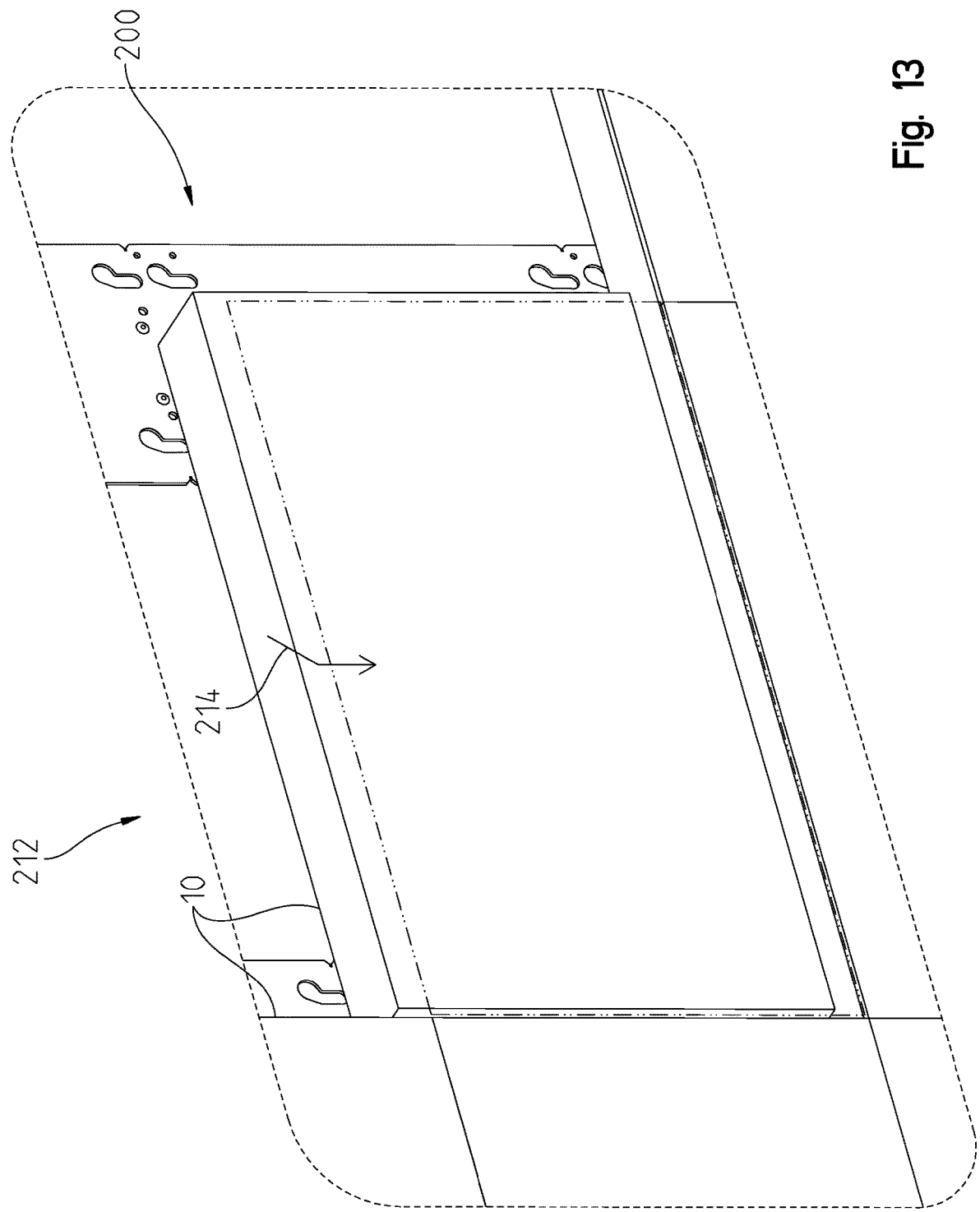
FIG. 13 illustrates a front, perspective detail view of the support system and a display unit within detail area 13 of FIG. 12.

FIGS. 12 and 13 illustrate display units 10 and trim components 210 being coupled to support system 200 to provide a display wall 212. Display units are coupled to support system 200 separately (that is, not simultaneously) and positioned edge-to-edge. With specific reference to FIG. 13 and as explained in more detail herein, support system 200 facilitates coupling display units to support system 200 by moving display units in a generally diagonal direction 214 relative to support system 200. Advantageously, such an action may reduce contact between a display unit being coupled to support system 200 and adjacent display units already coupled to support system 200, which may inhibit damaging display units. Illustratively, the diagonal direction 214 is a downward-and-left direction. Alternatively, the diagonal direction 214 could be a downward-and-right direction by providing various features, as described below, or all of the features of support system 200, as mirror images of the illustrated features.

Figure 14:
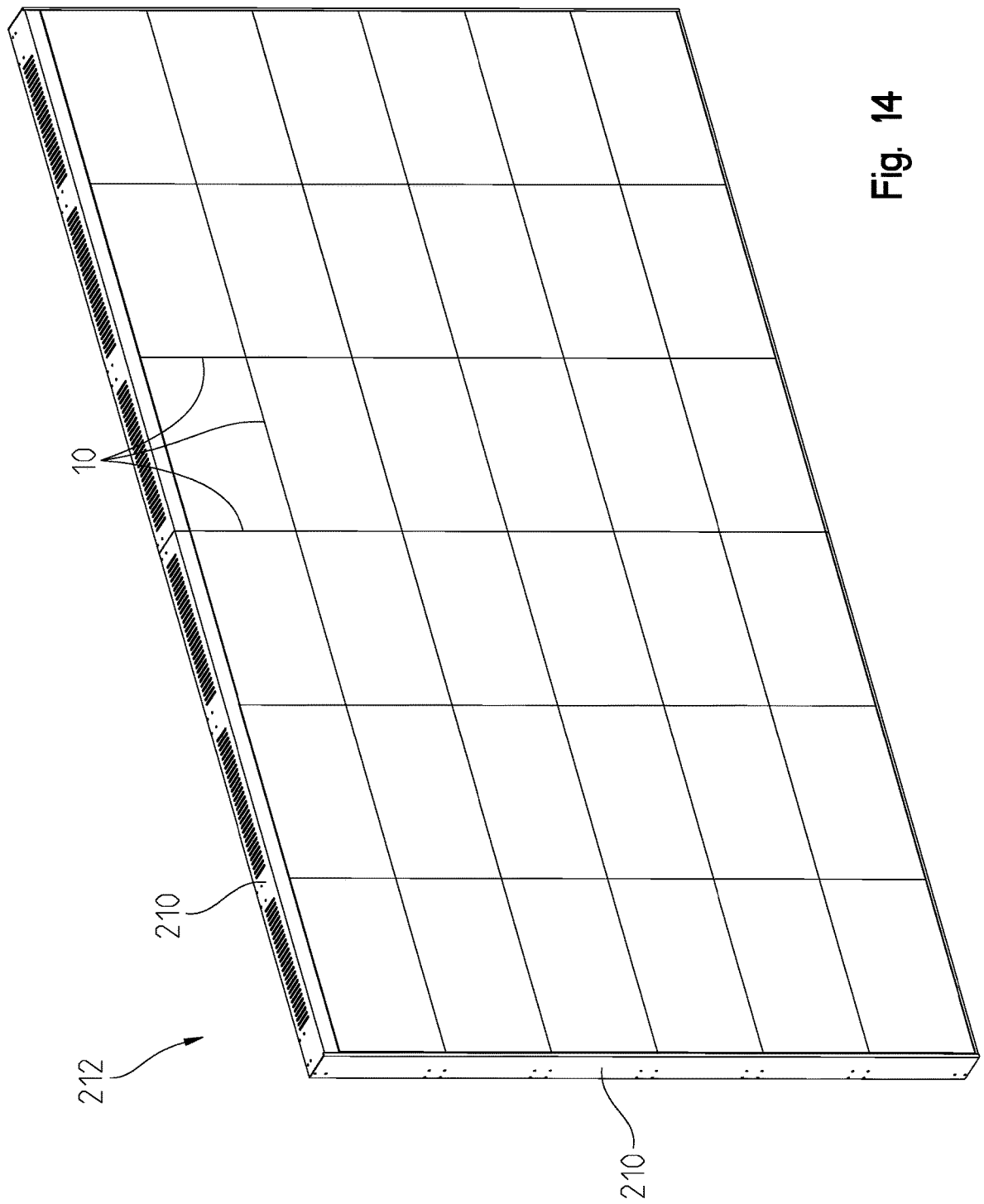
FIG. 14 illustrates a front, perspective view of the display wall of FIG. 12 after coupling each of the display units to the support system.
Figure 15:
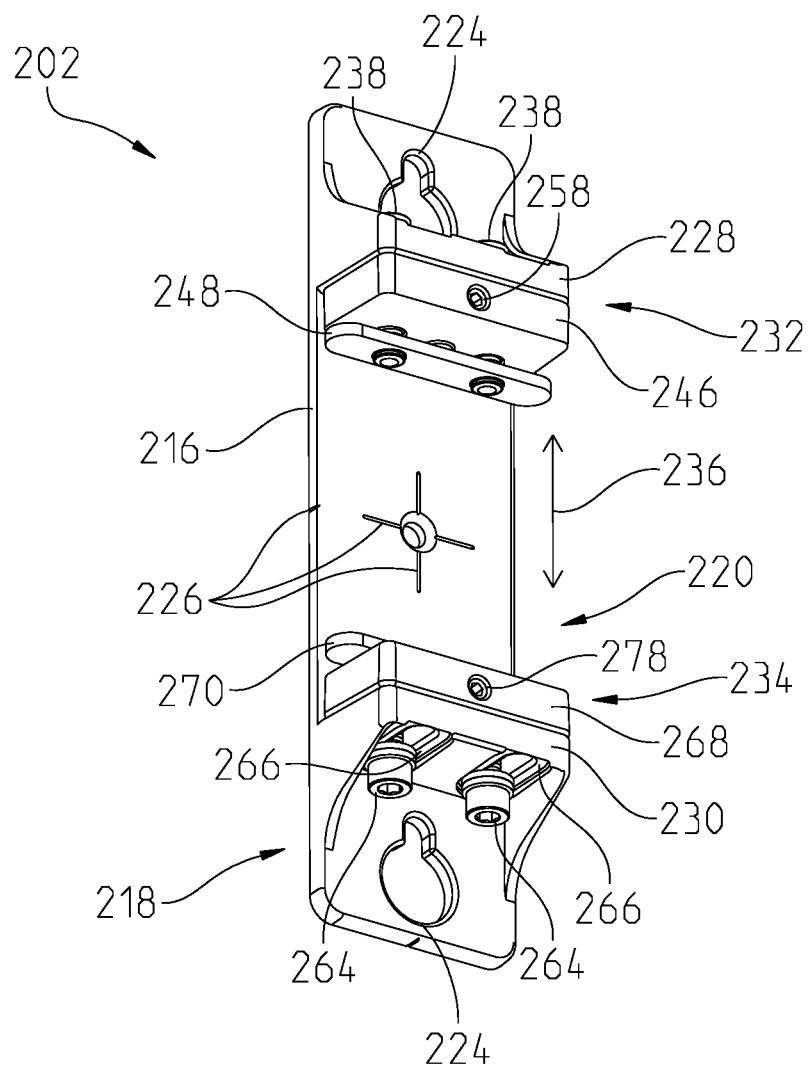
FIG. 15 illustrates a front, perspective view of an exemplary structural mount of the support system of FIG. 9.

FIG. 14 illustrates display wall 212 after coupling each of display units 10 and trim components 210 to support system 200 (obscured here, shown elsewhere). Display wall 212 illustratively includes thirty six display units, more specifically six rows of six display units. However, display walls may include various other arrangements and/or numbers of display units, particularly for support systems that include other arrangements and/or numbers of structural mounts, frame members, and display mounts (all shown elsewhere), as described above.

FIGS. 15-19 illustrate various views of exemplary structural mount 202. Each structural mount 202 of support system 200 may include, for example, the same or similar features as the illustrated structural mount 202. Structural mount 202 is adapted to be supported by an environmental support structure 70 (shown elsewhere) and couple support system 200 to support structure 70. More specifically, structural mount 202 includes a base 216 having a first side portion 218 and a second side portion 220. First side portion 218 includes a mounting surface 222 that is adapted to be positioned adjacent or abut support structure 70, and second side portion 220 is adapted to face away from support structure 70. Base 216 further includes coupling apertures 224 for receiving fasteners (not shown) for coupling structural mount 202 to support structure 70. Base 216 further includes one or more alignment features 226, illustratively, horizontal alignment grooves and/or vertical alignment grooves. Such alignment features may be used to align structural mount 202 with other structural mounts 202 and/or a vertical direction (for example, by generating a laser line using a rotating laser level).

Second side portion 220 of structural mount 202 includes an upper mounting boss 228 and a lower mounting boss 230, which support an upper adjustment mounting assembly 232 and a lower adjustment mounting assembly 234, respectively. Upper adjustment mounting assembly 232 and lower adjustment mounting assembly 234 are offset in offset direction 236, which may be aligned with a vertical direction. As described in further detail below, upper adjustment mounting assembly 232 and lower adjustment mounting assembly 234 couple to opposite sides of a frame member 204 (shown elsewhere) and support frame member 204 therebetween. Upper adjustment mounting assembly 232 and lower adjustment mounting assembly 234 facilitate adjustment of frame members 204 relative to support structure 70 (shown elsewhere). As described in further detail below, such adjustment advantageously facilitates aligning frame members 204 in a vertical plane, which in turn facilitates precise alignment of display units 10 (shown elsewhere) relative to each other and providing display units with parallel viewing directions.

Figure 16:
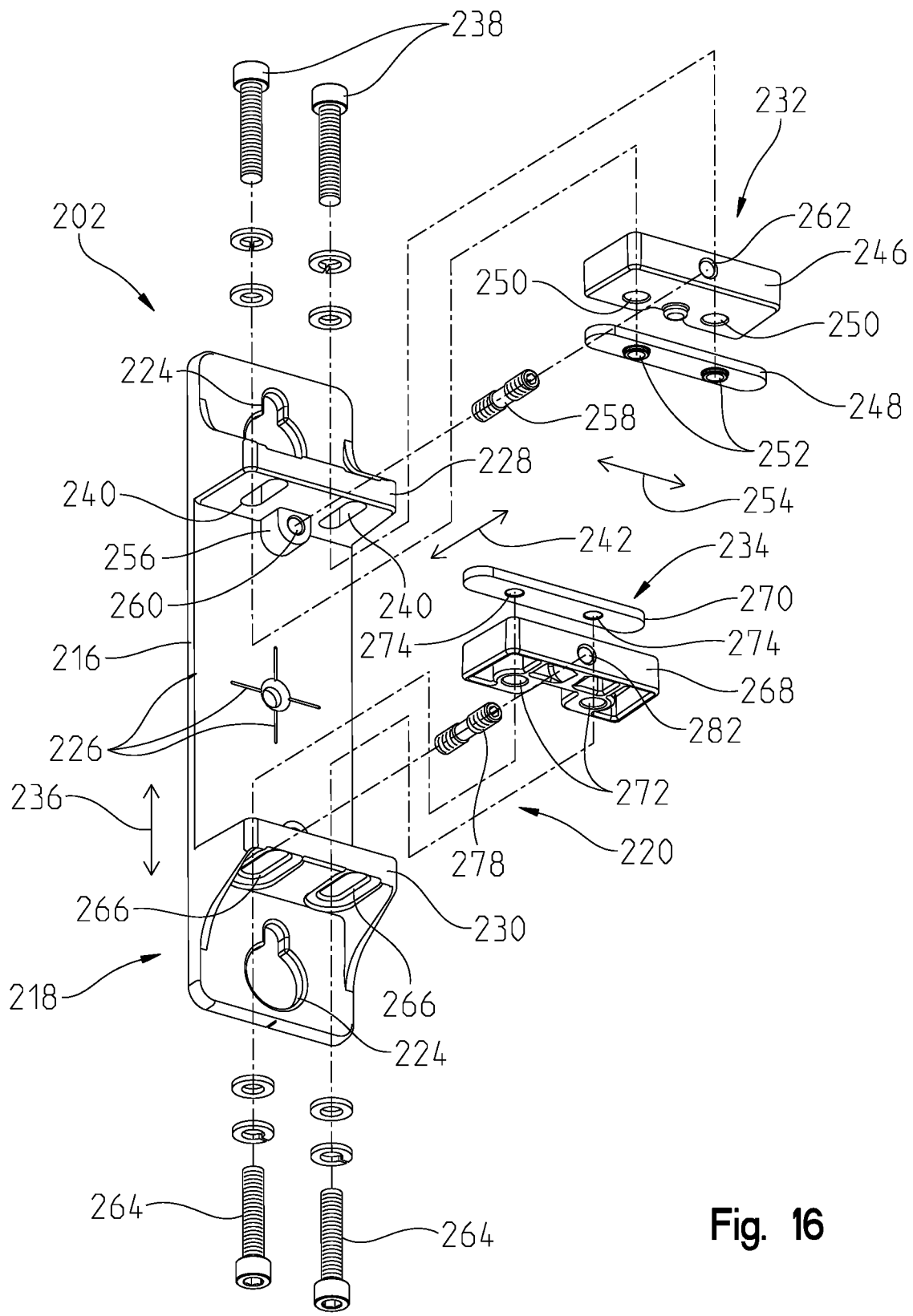
FIG. 16 illustrates an exploded front, perspective view of the structural mount of FIG. 15.
Figure 19:
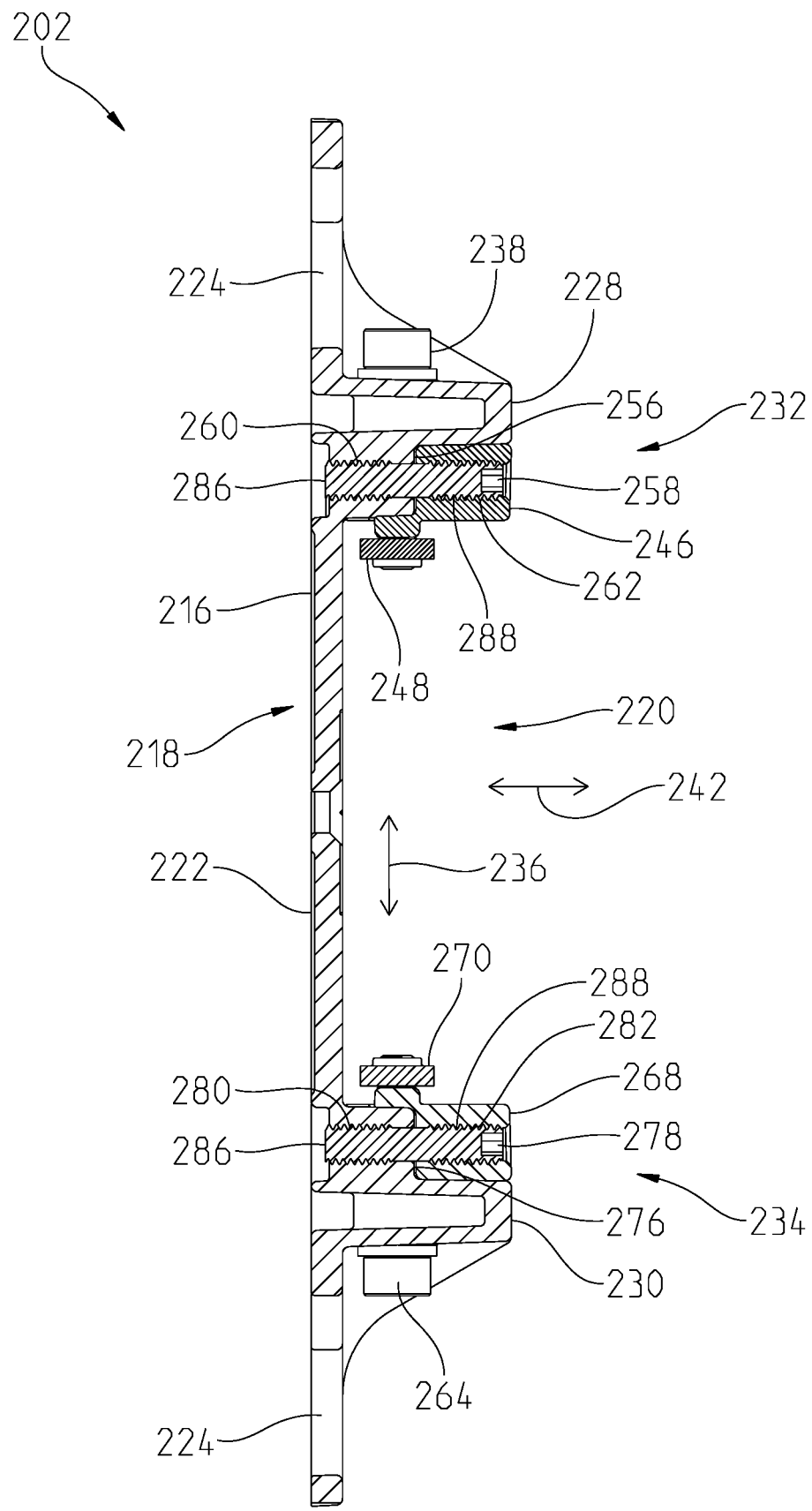
FIG. 19 illustrates a side sectional view of the structural mount of FIG. 15 along line 19-19 of FIG. 18.

Turning first to upper adjustment mounting assembly 232 and with particular reference to FIG. 16, upper adjustment mounting assembly 232 includes one or more upper securement fasteners 238 (illustratively, two fasteners, more specifically screws) that each freely extend through an elongated aperture 240 of upper mounting boss 228 (that is, the fasteners do not threadably engage upper mounting boss 228). Each aperture 240 is elongated, and each upper securement fastener 238 is slidable therein relative to upper mounting boss 228 in an adjustment direction 242 (also referred to as a support plane adjustment direction 242). Each upper securement fastener 238 also couples to an upper adjustment block 246 and an upper coupler 248, illustrated as a mounting plate, of upper adjustment mounting assembly 232. Each upper securement fastener 238 freely extends through an aperture 250 of upper adjustment block 246. Each aperture 250 is slightly larger than corresponding fastener (stated another way, each aperture 250 provides a clearance fit with corresponding fastener). Each upper securement fastener 238 also threadably engages a threaded aperture 252 of upper coupler 248. Accordingly, upper coupler 248 and upper adjustment block 246 are movable with upper securement fasteners 238 relative to upper mounting boss 228 in adjustment direction 242.

With continued particular reference to FIG. 16, upper coupler 248 couples structural mount 202 to frame member 204 (shown elsewhere). Upper coupler 248 slidably supports and facilitates adjustment of frame member 204 in transverse direction 254 relative to base 216, which is perpendicular to adjustment direction 242 and offset direction 236. Upper coupler 248 and upper adjustment block 246, when upper securement fasteners 238 are loosened, may be moved in adjustment direction 242 relative to base 216 to move frame member 204 in adjustment direction 242 relative to base 216. To facilitate this adjustment, upper adjustment block 246 couples to an upper adjustment boss 256 via an upper adjustment element 258. Upper adjustment element 258 may be manipulated or adjusted to move upper adjustment mounting assembly 232 and, as a result, frame member 204 in adjustment direction 242 relative to base 216. Illustratively, upper adjustment element 258 is a fastener. More specifically and as described in further detail below, upper adjustment element 258 may be a differential screw, even more specifically a differential screw including left-handed threads and right-handed threads on opposite end portions. Such a differential screw threadably engages threaded apertures 260 and 262 of upper adjustment boss 256 and upper adjustment block 246, respectively. Upper securement fasteners 238 may be tightened to inhibit further movement of upper adjustment mounting assembly 232 and frame in adjustment direction 242.

With further particular reference to FIG. 16, lower adjustment mounting assembly 234 is a mirror image of upper adjustment mounting assembly 232 over a plane including adjustment direction 242 and transverse direction 254. Otherwise, lower adjustment mounting assembly 234 is generally similar to upper adjustment mounting assembly 232. More specifically, lower adjustment mounting assembly 234 includes one or more lower securement fasteners 264 (illustratively, two fasteners, more specifically screws) that each freely extend through an elongated aperture 266 of lower mounting boss 230. Each aperture 266 is elongated, and each lower securement fastener 264 is slidable therein relative to lower mounting boss 230 in adjustment direction 242. Each lower securement fastener 264 also couples to a lower adjustment block 268 and a lower coupler 270, illustrated as a mounting plate, of lower adjustment mounting assembly 234. Each lower securement fastener 264 freely extends through an aperture 272 of lower adjustment block 268. Each aperture 272 is slightly larger than corresponding fastener (stated another way, each aperture 272 provides a clearance fit with corresponding fastener). Each lower securement fastener 264 also threadably engages a threaded aperture 274 of lower coupler 270. Accordingly, lower coupler 270 and lower adjustment block 268 are movable with lower securement fasteners 264 relative to lower mounting boss 230 in adjustment direction 242.

With continued particular reference to FIG. 16, lower coupler 270 couples structural mount 202 to frame member 204 (shown elsewhere). Lower coupler 270 slidably supports and facilitates adjustment of frame members 204 in transverse direction 254 relative to base 216. Lower coupler 270 and lower adjustment block 268, when lower securement fasteners 264 are loosened, may be moved in adjustment direction 242 relative to base 216 to move frame in adjustment direction 242 relative to base 216. To facilitate this adjustment, lower adjustment block 268 couples to a lower adjustment boss 276 (see FIG. 19) via a lower adjustment element 278. Lower adjustment element 278 may be manipulated or adjusted to move lower adjustment mounting assembly 234 and, as a result, frame in adjustment direction 242 relative to base 216. Illustratively, lower adjustment element 278 is a fastener. More specifically and as described in further detail below, lower adjustment element 278 may be a differential screw, even more specifically a differential screw including left-handed threads and right-handed threads on opposite end portions. Such a differential screw threadably engages threaded apertures 280 and 282 (see FIG. 19) of lower adjustment boss 276 and lower adjustment block 268, respectively. Lower securement fasteners 264 may be tightened to inhibit further movement of lower adjustment mounting assembly 234 and frame in adjustment direction 242.

Figure 20:
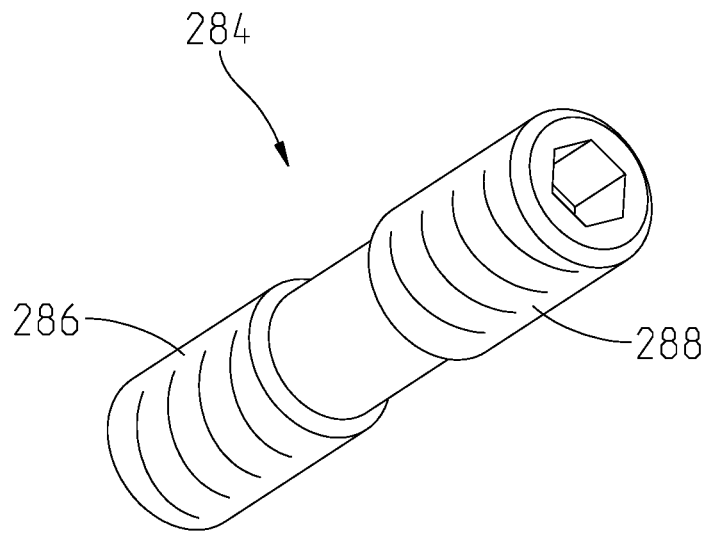
FIG. 20 illustrates a front, perspective view of an exemplary adjustment element of the structural mount of FIG. 15.
Figure 21:
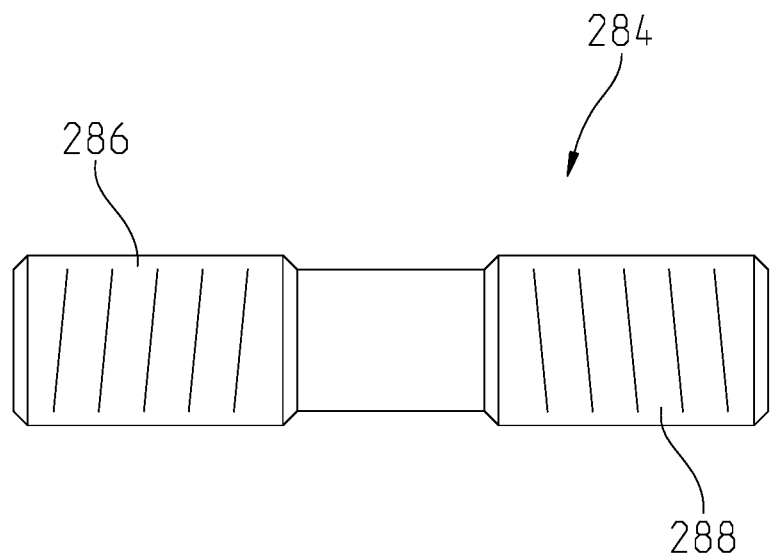
FIG. 21 illustrates a side view of the adjustment element of FIG. 20.

FIGS. 20-21 illustrate various views of an exemplary adjustment element 284. Upper adjustment element 258 and lower adjustment element 278 may include, for example, the same or similar features as adjustment element 284. Illustratively, adjustment element 284 is a differential screw that includes a left-handed thread portion 286 and right-handed thread portion 288. Generally, differential screw is adapted to couple two adjacent components and double the relative linear displacement, compared to a typical screw, between the components per turn of differential screw. Referring again briefly to FIG. 19, for upper adjustment element 258 left-handed thread portion 286 threadably engages threaded aperture 260 of upper adjustment boss 256 and right-handed thread portion 288 threadably engages threaded aperture 262 of upper adjustment block 246. For lower adjustment element 278 left-handed thread portion 286 threadably engages threaded aperture 280 of lower adjustment boss 276 and right-handed thread portion 288 threadably engages threaded aperture 282 of lower adjustment block 268. Adjustment elements 284 double the relative linear displacement per turn, compared to a typical screw, between adjustment bosses and adjustment blocks, respectively. Accordingly, adjustment elements 284 facilitate ease of adjustment of upper and lower adjustment mounting assemblies 232 and 234 and, accordingly, frame members 204 (shown elsewhere), in adjustment direction 242.

Figure 24:
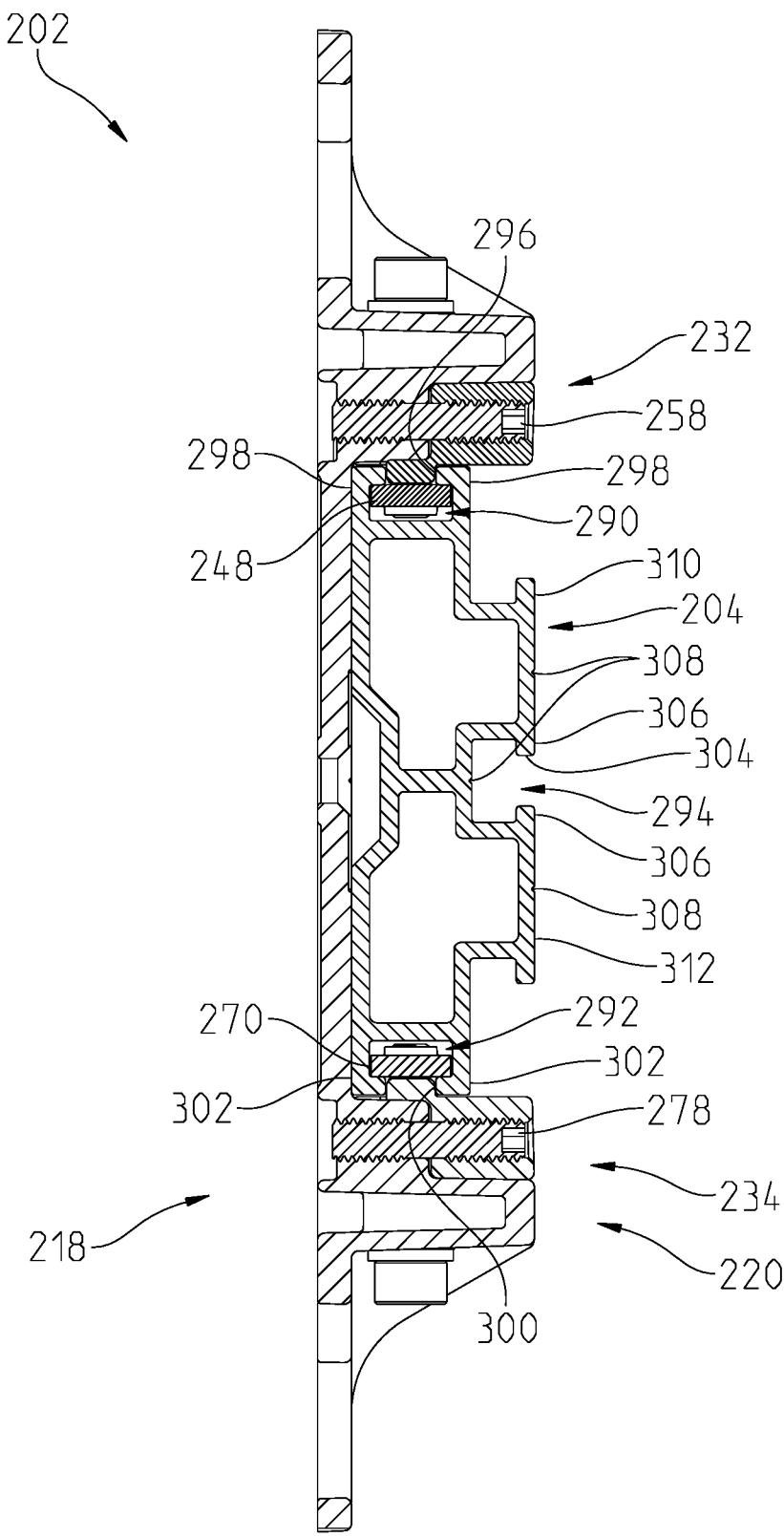
FIG. 24 illustrates a side sectional view of the frame member of FIG. 22 coupled to the structural mount of FIG. 15, the structural mount being shown as the side sectional view along line 19-19 of FIG. 18.

FIGS. 22-23 illustrate various views of frame member 204, and FIG. 24 illustrates frame member 204 coupled to structural mount 202. Each frame member 204 of support system 200 (shown elsewhere) may include, for example, the same or similar features as the illustrated frame member 204. Frame member 204 is generally an elongated component, and frame member 204 may have a uniform shape along its length (that is, as viewed from the side and, for example, as shown in FIG. 22). Frame member 204 includes several interfaces for cooperating with couplers (shown elsewhere) and thereby coupling frame to other components of support system 200. More specifically, frame member 204 includes an upper interface 290 and a lower interface 292 to facilitate coupling frame member 204 to structural mount 202 and a side interface 294 for coupling frame member 204 to display mounts 206 (shown elsewhere).

Upper interface 290 is illustratively an upper channel having an upwardly facing opening 296. Upper channel further includes inwardly extending feet 298 disposed on opposite sides of opening 296. As shown specifically in FIG. 24, upper channel receives upper coupler 248 of structural mount 202 and feet 298 slidably engage upper coupler 248. Similarly, lower interface 292 is illustratively a lower channel having a downwardly facing opening 300. Lower channel further includes inwardly extending feet 302 disposed on opposite sides of opening 300. As shown specifically in FIG. 24, lower channel receives lower coupler 270 of structural mount 202 and feet 302 slidably engage lower coupler 270. Side interface 294 is illustratively a side channel having a horizontally facing opening 304. Side channel further includes inwardly extending feet 306 disposed on opposite sides of opening 304. As described in further detail below and shown elsewhere, side channel receives couplers for coupling frame member 204 to display mounts 206. Although interfaces 290, 292, and 294 are shown as channels, any of interfaces 290, 292, and 294 may include other types of apertures and/or one or more protrusions to cooperate with corresponding features on a coupler to couple frame member 204 to structural mount 202 or display mounts 206.

Frame member 204 also illustratively includes one or more alignment features 308, more specifically horizontal alignment grooves disposed in side channel of side interface 294 and on upper and lower side surfaces 310, 312. Such alignment features 308 may be used to align frame member 204 with a horizontal direction (for example, by generating a laser line using a rotating laser level).

FIG. 24 also illustrates how structural mount 202 and frame member 204 may provide a relatively narrow structure that does not protrude significantly from environmental support structure 70 (shown elsewhere). As illustrated, the structure formed by structural mount 202 and frame member 204 may have a thickness (that is, a dimension between first side portion 218 and second side portion 220 of structural mount 202) that largely corresponds to the thickness of upper and lower adjustment mounting assemblies 232 and 234 (more specifically, the length of upper adjustment element 258 and lower adjustment element 278). The thickness of the structure may also correspond to the amount of adjustability provided by upper and lower adjustment mounting assemblies 232 and 234. By providing a relatively narrow structure, support system 200 may be largely obscured when display units 10 are mounted thereto, which may be considered aesthetically pleasing.

Figure 25:
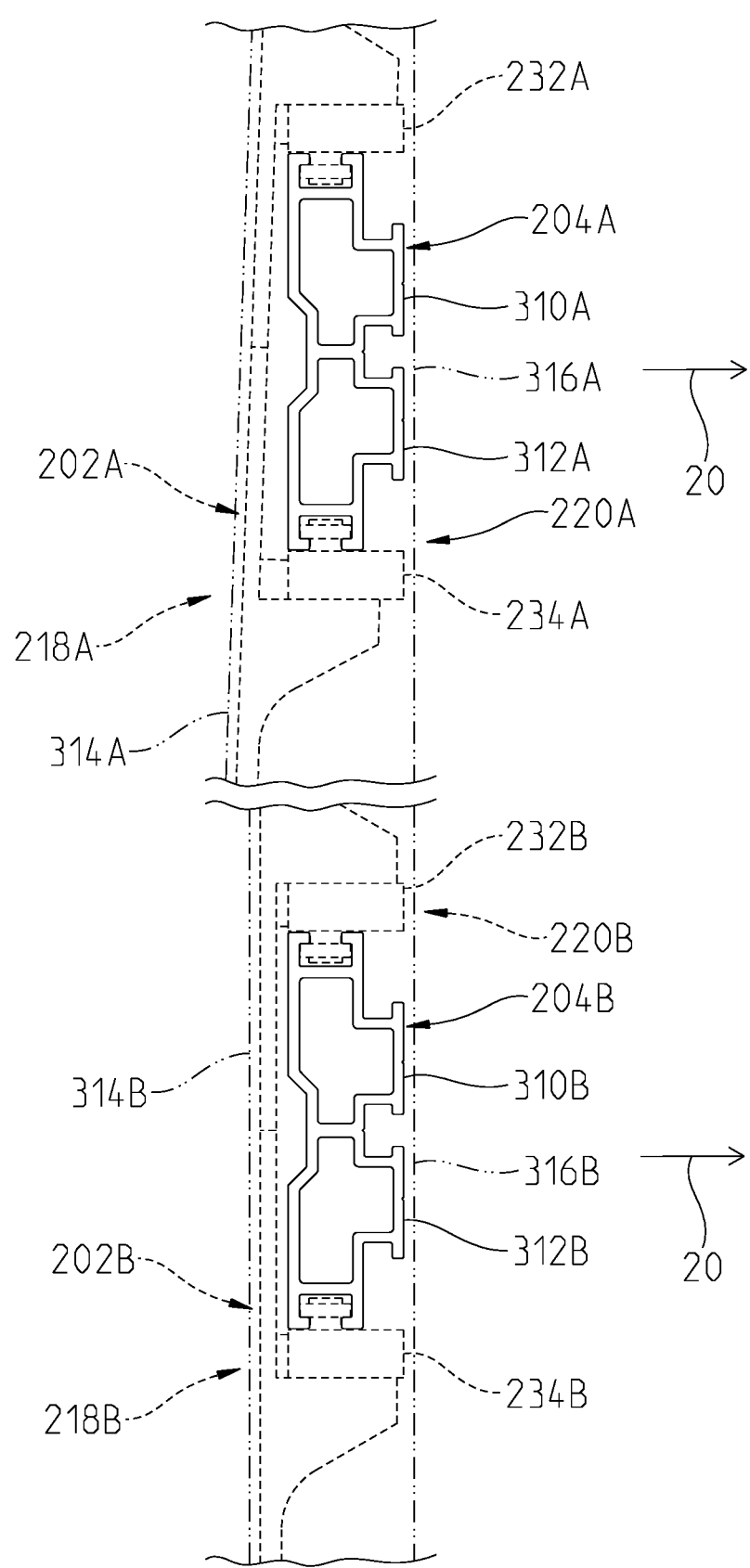
FIG. 25 illustrates a partial side view of frame members of FIG. 22 providing parallel support planes despite structural mounts of FIG. 15 being disposed with angled environmental mounting planes.

In addition to facilitating adjustment as described above, structural mounts 202 also facilitate adjustment of frame members 204 in other manners. For example, for a structural mount 202 supported by a slanted portion of an environmental support structure, upper and lower adjustment mounting assemblies 232 and 234 can be adjusted by different amounts to adjust the angle of a supported frame member 204 relative to the support structure and thereby precisely align the frame member 204 with frame members 204 supported by other structural mounts 202. FIG. 25 illustrates an example of structural mounts 202A, 202B aligning frame members 204A, 204B in such a manner. More specifically, first, or upper, structural mount 202A and second, or lower, structural mount 202B include first side portions 218A, 218B that define environmental mounting planes 314A, 314B, respectively. The first side portions 218A, 218B are adapted to be positioned adjacent or abut an environmental support structure 70 (shown elsewhere). The first structural mount 202A and the second structural mount 202B also include second side portions 220A, 220B that support frame members 204A, 204B, respectively. Second side portions 220A, 220B also include upper adjustment mount assemblies 232A, 232B and lower adjustment mount assemblies 234A, 234B, respectively. Upper adjustment mount assemblies 232A, 232B and lower adjustment mount assemblies 234A, 234B may be adjusted, potentially by different amounts, to precisely align frame members 204A, 204B. More specifically, for example, upper adjustment mounting assembly 232A and lower adjustment mounting assembly 234A may be adjusted by different amounts such that first structural mount 202A positions a first support plane 316A of first frame member 204A parallel to (illustratively, in a coplanar orientation with) a second support plane 316B of second frame member 204B and angled relative to environmental mounting plane 314A of first structural mount 202A. As illustrated, first support plane 316A and second support plane 316B may be parallel to upper side surfaces 310A, 310B and lower side surfaces 312A, 312B of first structural mount 202A and second structural mount 202B, respectively. As described in further detail below, aligned support planes 316A, 316B facilitate positioning display units 10 (shown elsewhere) with parallel viewing directions 20.

Figure 26:
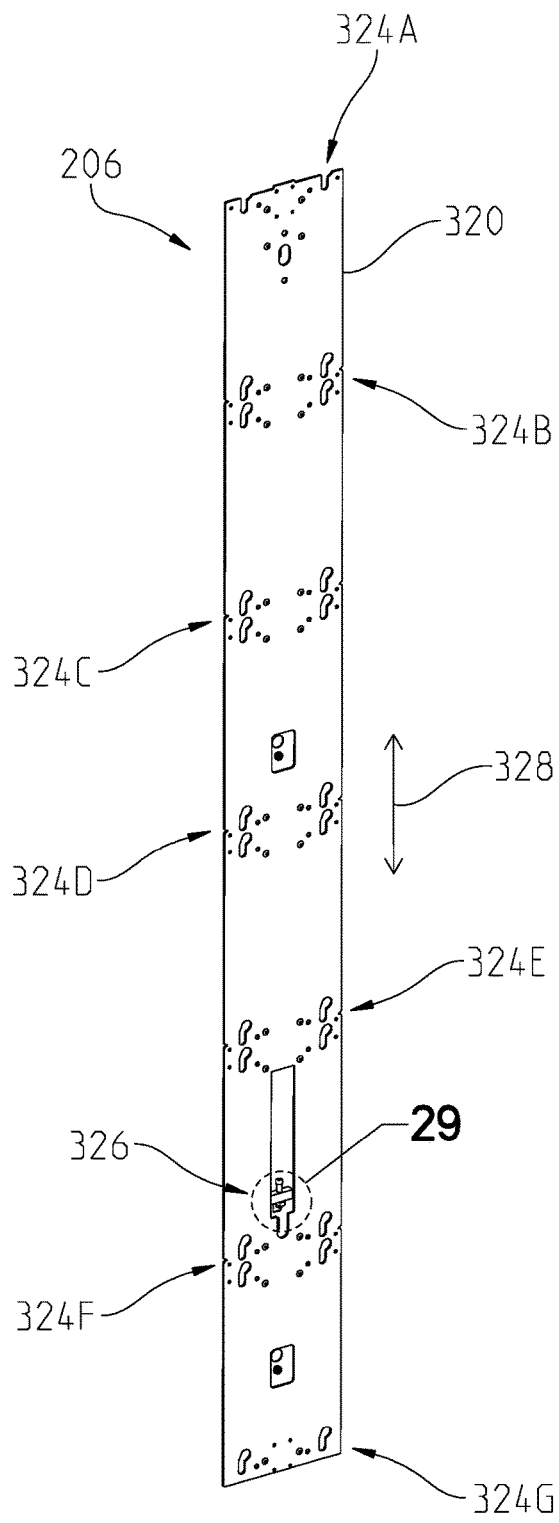
FIG. 26 illustrates a front, perspective view of an exemplary display mount of the support system of FIG. 9.
Figure 27:
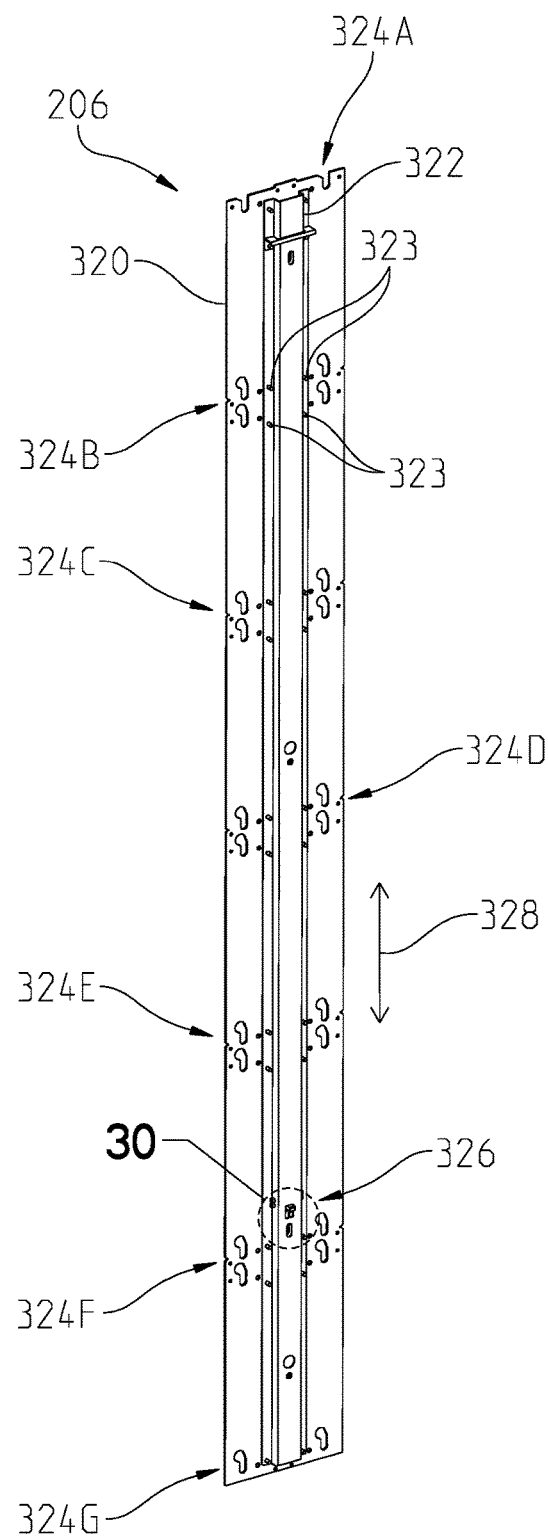
FIG. 27 illustrates a rear, perspective view of the display mount of FIG. 26.
Figure 32:
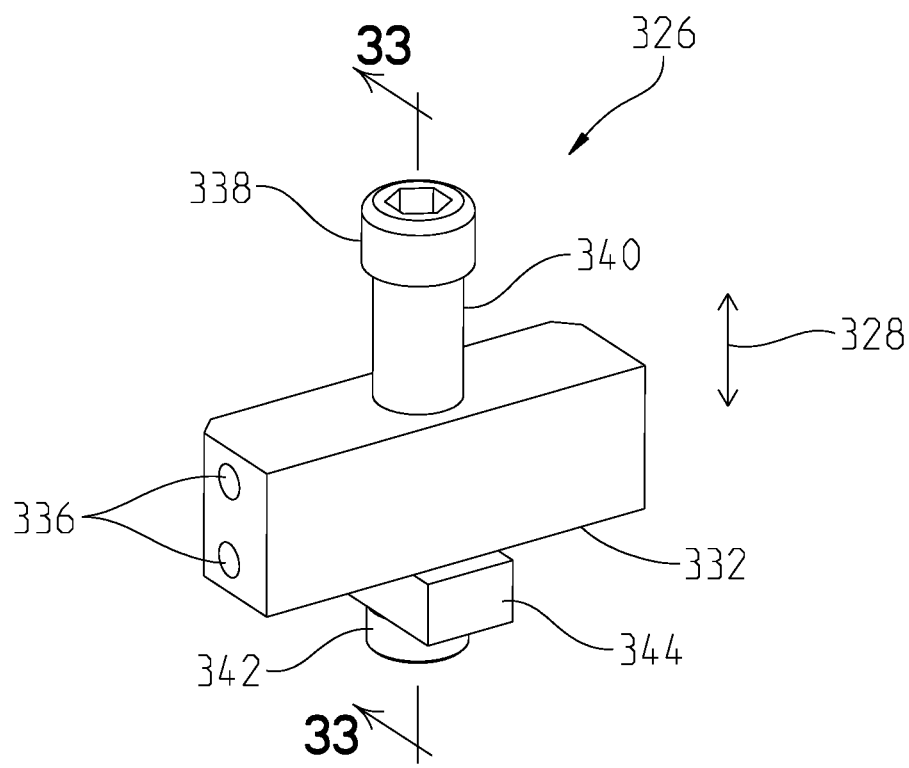
FIG. 32 illustrates a front, perspective view of the adjuster of FIGS. 29-30.
Figure 33:
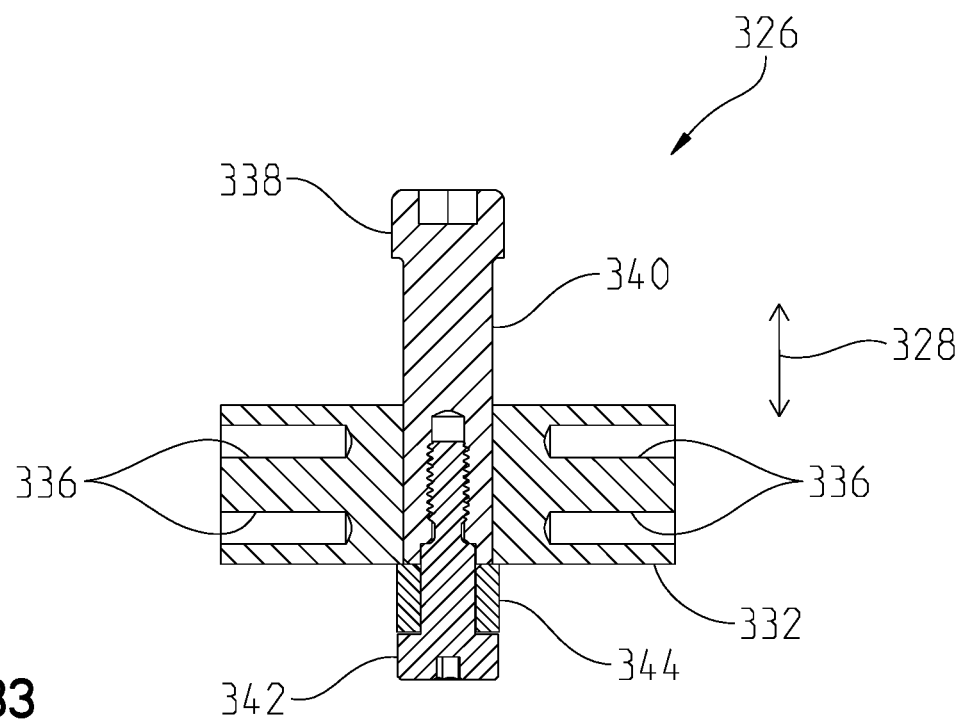
FIG. 33 illustrates a section view of the adjuster along line 33-33 of FIG. 32.

FIGS. 26-28 illustrate various views of exemplary display mount 206. Each display mount 206 of support system 200 may include, for example, the same or similar features as the illustrated display mount 206. Display mount 206 generally includes an elongated main body 320 coupled to an elongated rear bracket 322 (see FIG. 27) via fasteners 323 (four of which are identified—illustratively, rivets). As described in further detail below, display mount 206 also includes features for coupling to frame members 204 (shown elsewhere) and display units 10 (shown elsewhere). Briefly, display mount 206 includes a plurality of groups of display unit interfaces for coupling to display units 10 (shown elsewhere). Illustratively, display mount 206 includes a first group of display unit interfaces 324A, a second group of display unit interfaces 324B, a third group of display unit interfaces 324C, a fourth group of display unit interfaces 324D, a fifth group of display unit interfaces 324E, a sixth group of display unit interfaces 324F, and a seventh group of display unit interfaces 324G. Groups of display unit interfaces 324B-324F are exemplary embodiments of mount 110 (shown elsewhere). Stated another way, display mount 206 provides a plurality of mounts 110. As described in further detail below, groups of display unit interfaces 324B-324F may each include four display unit interfaces. First and seventh groups of display unit interfaces 324A, 324G may each include a fewer display unit interfaces than the other groups. Illustratively, first and seventh groups of display unit interfaces 324A, 324G each include two display unit interfaces. In alternative embodiments, display mount 206 may include a different number of groups of display unit interfaces.

With brief continued reference to FIGS. 26-28 and additional reference to FIGS. 29-33, display mount 206 includes an adjuster 326 for adjusting the position of display mount 206 relative to frame (shown elsewhere). More specifically, adjuster 326 facilitates adjusting the position of display mount 206 relative to frame members 204 in an adjustment direction 328 (also referred to as a vertical adjustment direction 328), which may be perpendicular to support plane adjustment direction 242 and transverse direction 254 defined by structural mounts 202 (shown elsewhere). With specific reference now to FIGS. 29-33, adjuster 326 is accessible via a front aperture 330 formed in main body 320 of display mount 206. Adjuster 326 illustratively includes an adjuster body 332 that couples to rear bracket 322 (see FIG.

30) of display mount 206 (illustratively, by receiving threaded fasteners 334, see FIG. 30, in blind holes 336). Adjuster body 332 supports an adjustment device 338, which illustratively includes a first threaded fastener 340 that is fixedly supported by adjuster body 332. First threaded fastener 340 threadably engages a second threaded fastener 342, which carries a foot 344. As shown specifically in FIGS. 30 and 31, foot 344 extends through a rear aperture 346 formed in rear bracket 322 and contacts frame member 204. More specifically, foot 344 rests upon an upper finger 347 adjacent upper side surface 310 of frame member 204. As such, second threaded fastener 342 may be rotated relative to first threaded fastener 340 to displace foot 344 relative to adjuster body 332 and thereby move display mount 206 relative to frame member 204 in direction 328.

Figure 34:
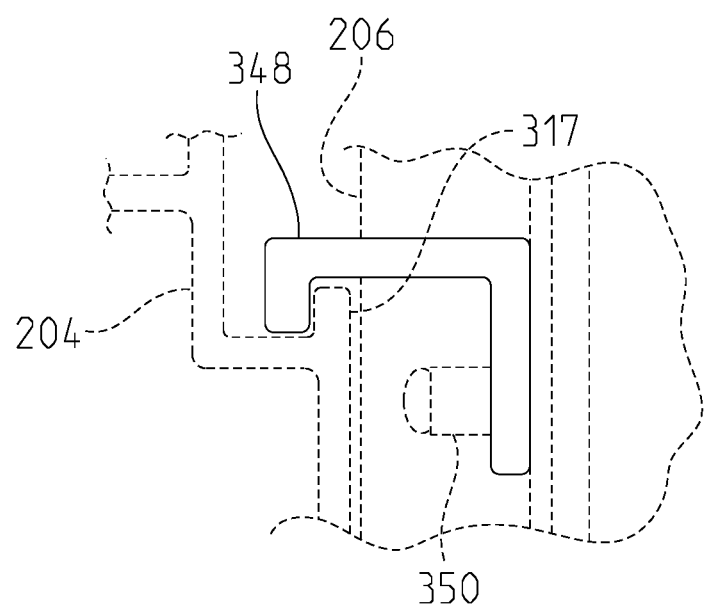
FIG. 34 illustrates a side view of a support bracket of the display mount of FIG. 26.

FIG. 34 illustrates an exemplary support bracket 348 positioned on rear of display mount 206. Support bracket 348 facilitates supporting display mount 206 from frame member 204 before and while adjusting the position of display mount 206 relative to frame member 204 (for example, by adjusting adjuster 326—shown elsewhere). Stated another way, support bracket 348 may couple display mount 206 to frame member 204 so that display mount 206 does not need be manually supported while adjusting the position of display mount 206 relative to frame member 204. Support bracket 348 couples to display mount 206 via one or more fasteners 350, illustratively rivets. As illustrated, support bracket 348 may have an inverted J-shape appearance as viewed from the side. As illustrated, support bracket 348 may contact frame member 204 behind upper finger 347.

FIGS. 35-38 illustrate an exemplary adjustment bracket 352 positioned on rear of display mount 206. Adjustment bracket 352 couples to display mount 206 via an adjustment element 354 (see FIG. 36—which may have, for example, the same or similar features as adjustment element 284). Adjustment element 354 may be accessed via a front aperture 356 (see FIG. 36) of main body 320 of display mount 206. Adjustment element 354 may be adjusted to cause a rear surface 358 of adjustment bracket 352 to contact support structure 70 (shown elsewhere) and facilitate positioning various portions of display mount 206 (such as groups of display unit interfaces 324A-324G—shown elsewhere) in a common plane. Adjustment bracket 352 also includes a through aperture 360, which is accessible via front aperture 330 and a rear aperture 362 of rear bracket 322 of display mount 206. Through aperture 360 is adapted to receive a threaded fastener (not shown) for coupling adjustment bracket 352 to support structure 70. Adjustment bracket 352 may have a J-shape appearance as viewed from the side.

Figure 39:
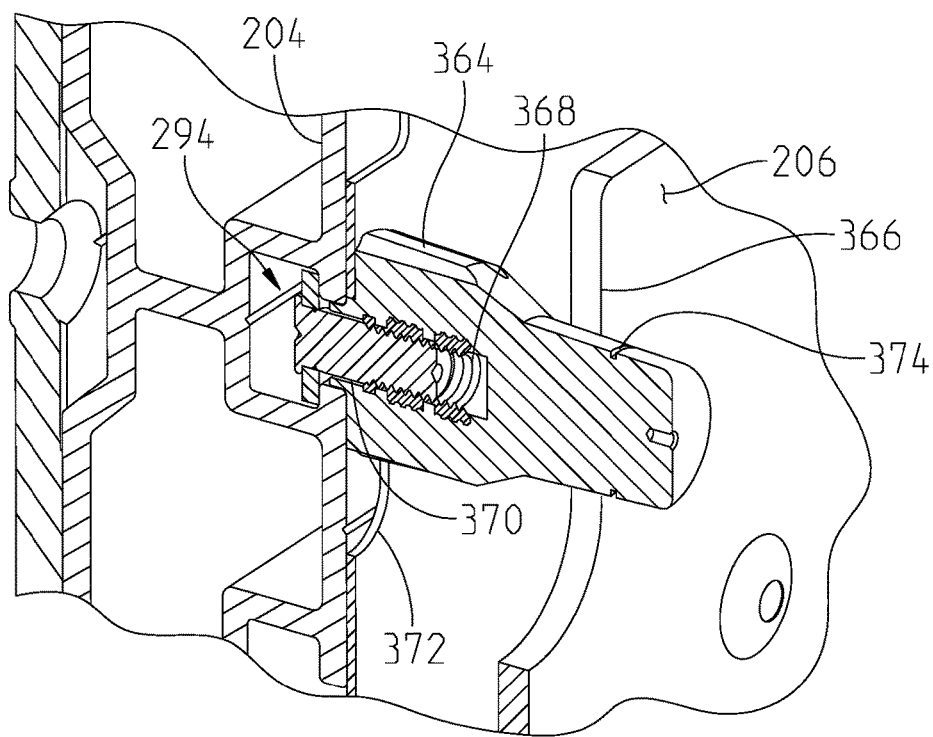
FIG. 39 illustrates a partial front, perspective sectional view of the display mount of FIG. 26, the frame member of FIG. 22, and an exemplary alignment tool.
Figure 40:
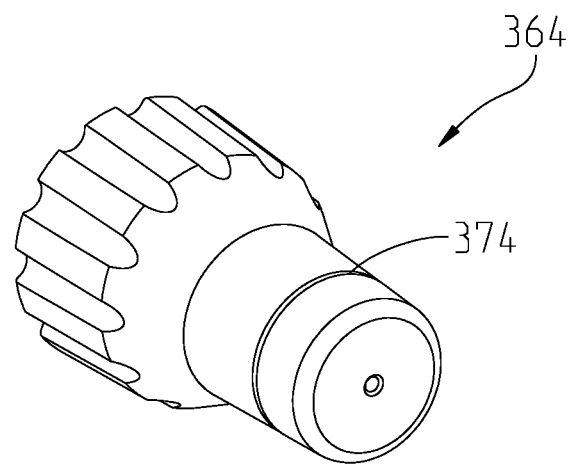
FIG. 40 illustrates a front, perspective view of the alignment tool of FIG. 39.
Figure 41:
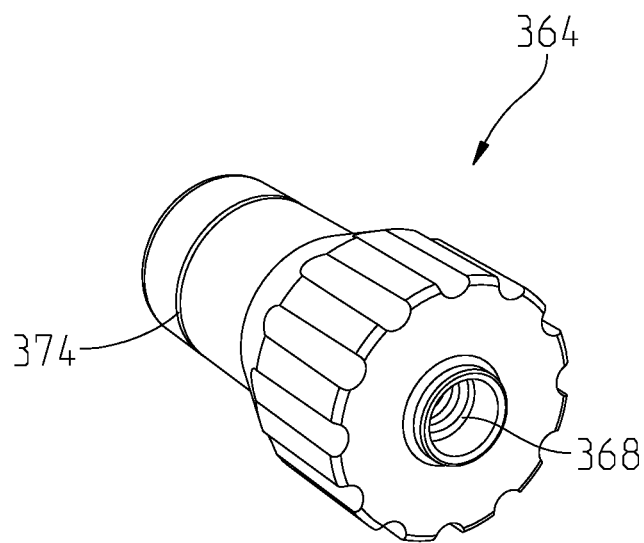
FIG. 41 illustrates a rear, perspective view of the alignment tool of FIG. 39.

FIG. 39 illustrates display mount 206, frame member 204, and an exemplary alignment tool 364 that is selectively attachable thereto, and FIGS. 40-41 illustrate the alignment tool 364 separately. Alignment tool 364 facilitates aligning display mounts 206 in a common plane. Alignment tool 364 is received in a front aperture 366 of display mount 206 and includes a threaded aperture 368. Threaded aperture 368 couples to a threaded fastener 370 that is received through a rear aperture 372 of display mount 206 and supported by side interface 294 of frame member 204. Alignment tool 364 may be tightened and urged into contact with display mount 206 adjacent rear aperture 372. Thereafter, an alignment feature 374 of alignment tool 364 (illustratively, a circumferentially extending groove), and alignment features 374 of other alignment tools 364 (not shown) attached to display mounts 206 and frame members 204, may be used to align frame members 204 and display mounts 206 (for example, by generating a laser line using a rotating laser level and by using, for example, any of the adjustment features described herein).

Figure 42:
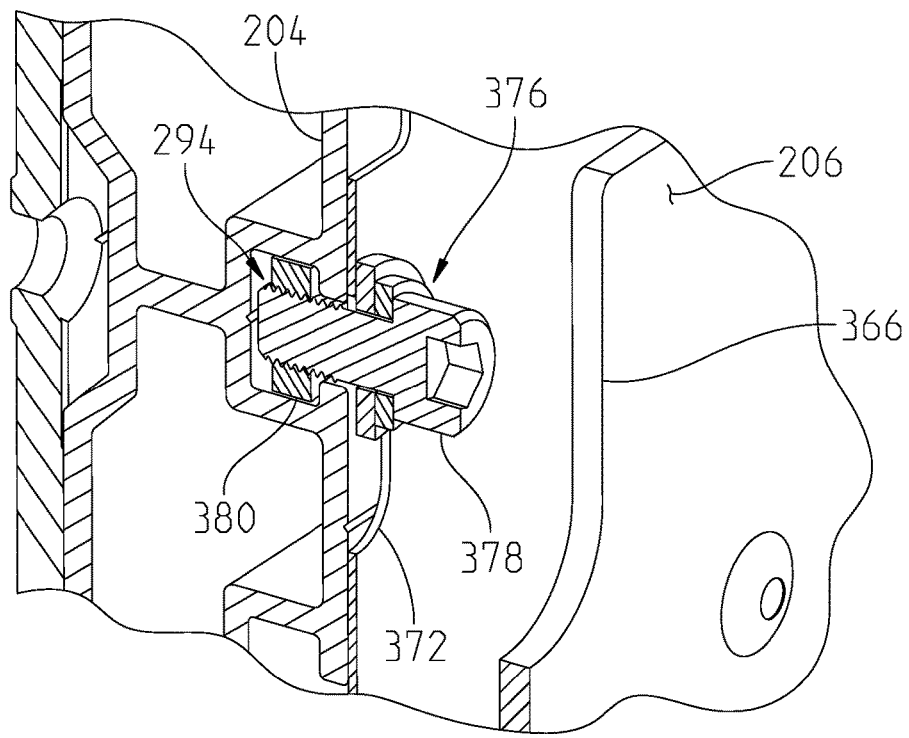
FIG. 42 illustrates a partial front, perspective sectional view of the display mount of FIG. 26, the frame member of FIG. 22, and an exemplary coupler coupling the display mount and the frame member.

FIG. 42 illustrates display mount 206, frame member 204, and an exemplary coupler 376 coupling the display mount 206 and the frame member 204. Coupler 376 may be coupled to display mount 206 and frame member 204, for example, after detaching alignment tool 364 (shown elsewhere). Coupler 376 is illustratively a threaded fastener assembly including a threaded fastener 378 and a nut 380. Threaded fastener 378 extends through front aperture 366 and rear aperture 372 of display mount 206, and nut 380 is carried in side interface 294 of frame member 204.

Figure 43:
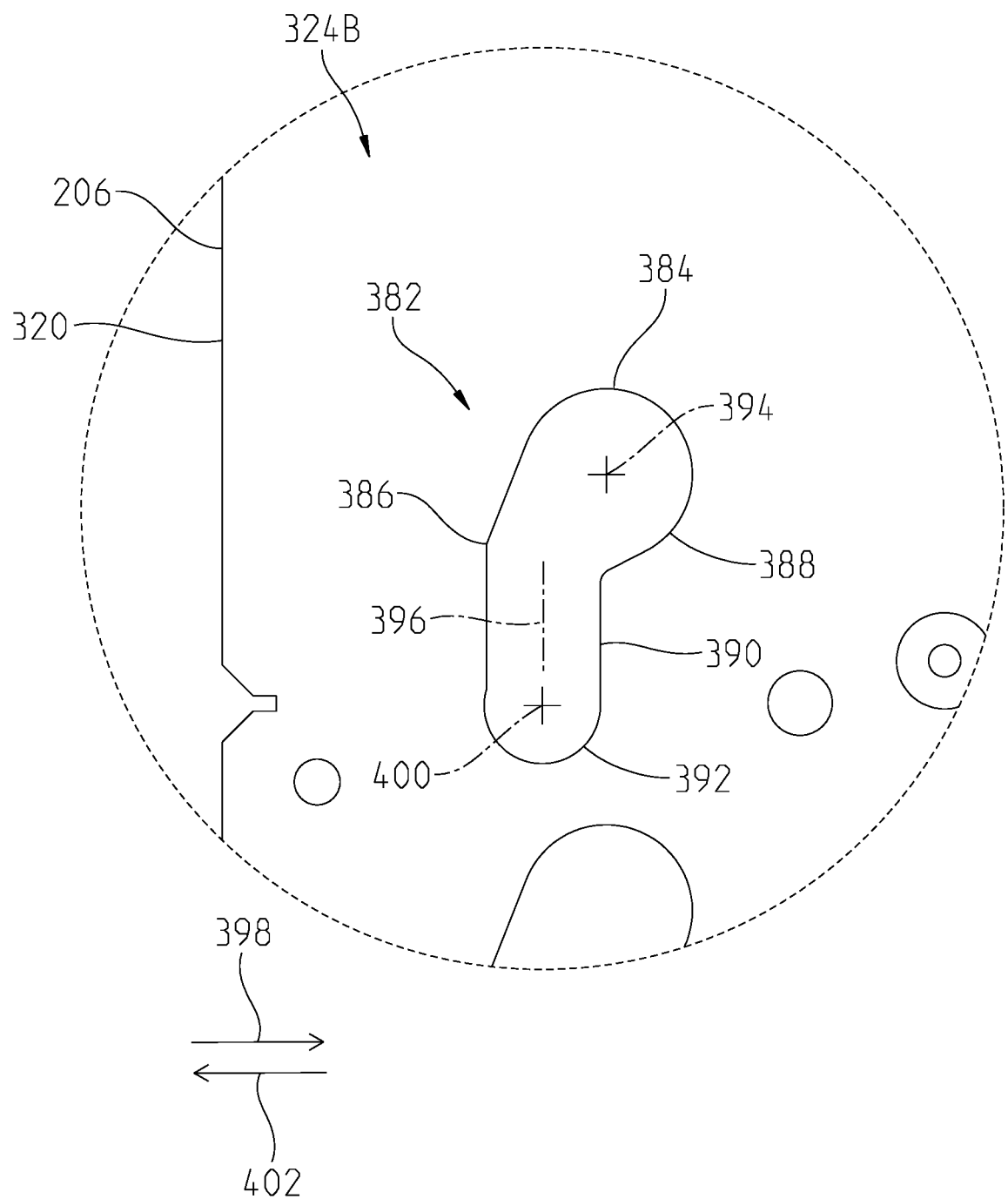
FIG. 43 illustrates a front view of an exemplary receiver of a display unit interface of the display mount of FIG. 26.

FIG. 43 illustrates an exemplary receiver 382 of group of display unit interfaces 324B of display mount 206. Each receiver 382 of display mount 206 may include, for example, the same or similar features as the illustrated receiver 382. Illustratively, receiver 382 is an aperture formed in main body 320 of display mount 206, and the aperture is adapted to receive a coupler (shown elsewhere) coupled to display unit 10 (shown elsewhere). Generally, receiver 382 has an asymmetric shape (relative to adjustment direction 328 (see FIG. 28), or a vertical direction). Such a shape advantageously facilitates coupling display units 10 to support system 200 in a generally diagonal direction 214, as described herein above and shown elsewhere. Generally, receiver 382 includes a dog leg-like shape. More specifically, receiver 382 includes an enlarged receiver portion 384, an angled intermediate portion 386 including an upper segment 388 and a lower segment 390, and a securement portion 392. Enlarged receiver portion 384 may have a relatively large diameter compared to other portions of receiver 382. A center 394 of enlarged receiver portion 384 may be offset from an upright axis 396 of receiver 382 (defined by lower segment 390 of intermediate portion 386) in a first offset direction 398. Upper segment 388 of intermediate portion 386 is accessible from enlarged receiver portion 384. Upper segment 388 of intermediate portion 386 may taper from enlarged receiver portion 384 inwardly to lower segment 390 of intermediate portion 386. Lower segment 390 of intermediate portion 386 is accessible from upper segment 388 of intermediate portion 386. Lower segment 390 and upper segment 388 of intermediate portion 386 may define an internal angle of about 25 degrees (that is, 25 degrees±10 degrees). Lower segment 390 of intermediate portion 386 may have a width that is substantially uniform. Securement portion 392 is accessible from lower segment 390 of intermediate portion 386. Securement portion 392 may have a diameter that is slightly larger than the width of lower segment 390 of intermediate portion 386. A center 400 of securement portion 392 may be offset from upright axis 396 of receiver 382 in a second offset direction 402. In alternative embodiments, a receiver may be provided with different sizes and/or shapes. For example, a receiver may have other types of asymmetric shapes or non-linear shapes, such as, for example, curved shapes. Although receiver 382 functions to secure a modular display unit 10 to display mount 206, portions of the shape of receiver 382 are non-functional and therefore may be selected based on their ornamental appeal. For example, in embodiments, enlarged receiver portion 384 functionally must be large enough to receive a head of a coupler (shown elsewhere) which, in turn, is coupled to a display unit 10, but the shape of enlarged receiver portion 384 may take on many aesthetically pleasing ornamental forms. In another example, in embodiments, securement portion 392 must be limited in size such that a head of a coupler may not pass through display mount 206, but the shape of securement portion 392 may take on many aesthetically pleasing ornamental forms.

Figure 44:
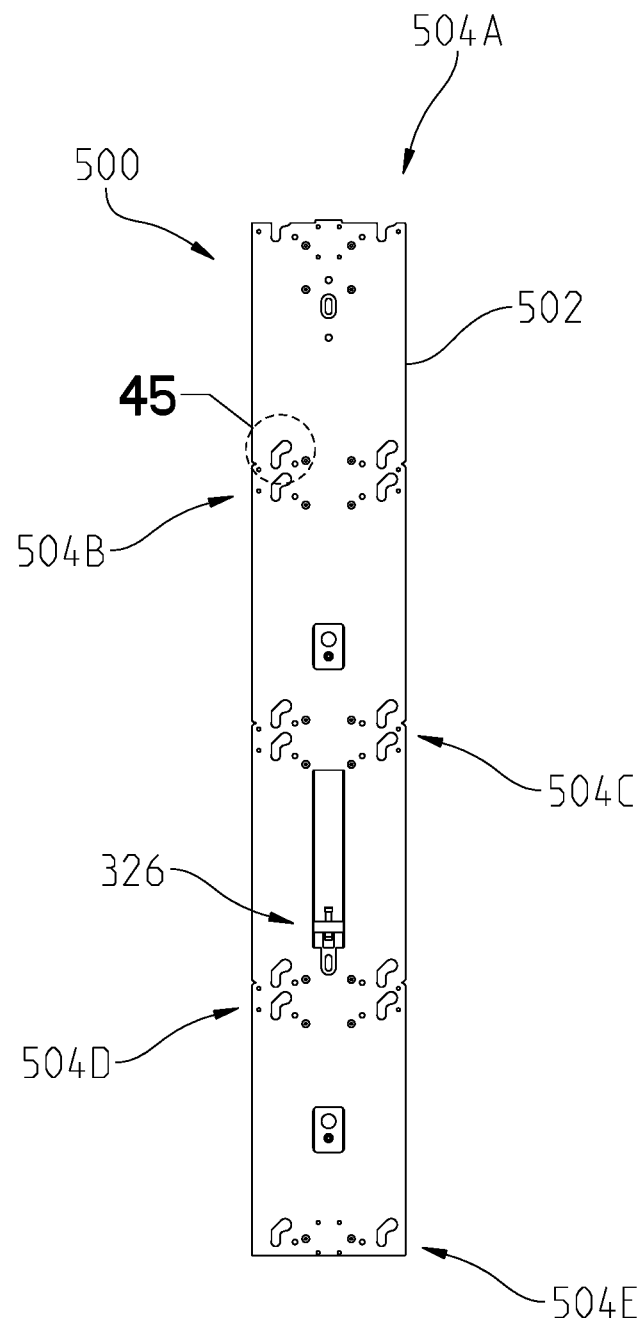
FIG. 44 illustrates a front view of another exemplary display mount of the support system of FIG. 9.

FIG. 44 illustrates another exemplary display mount 500. Support system 200 may include display mount 500, or a plurality of display mounts 500, instead of display mount 206. Generally, display mount 500 includes similar features as display mount 206. More specifically, display mount 500 includes an elongated main body 502 coupled to an elongated rear bracket (not shown). Display mount 500 also includes adjuster 326 and support bracket 348 (shown elsewhere). Display mount 500 may couple to alignment tool 364 (shown elsewhere) and/or adjustment bracket 352 (shown elsewhere). Display mount 500 also includes features for coupling to frame members 204 (shown elsewhere) and display units 10 (shown elsewhere). More specifically, display mount 500 includes a plurality of groups of display unit interfaces for coupling to display units 10 (shown elsewhere). Illustratively, display mount 500 includes a first group of display unit interfaces 504A, a second group of display unit interfaces 504B, a third group of display unit interfaces 504C, a fourth group of display unit interfaces 504D, and a fifth group of display unit interfaces 504E. Groups of display unit interfaces 504B-504D are exemplary embodiments of mount 110 (shown elsewhere). Stated another way, display mount 500 provides a plurality of mounts 110. As described in further detail below, groups of display unit interfaces 504B-504D may each include four display unit interfaces. First and fifth groups of display unit interfaces 504A, 504E may each include a fewer display unit interfaces than the other groups. Illustratively, first and fifth groups of display unit interfaces 504A, 504E each include two display unit interfaces. In alternative embodiments, display mount 500 may include a different number of groups of display unit interfaces.

Figure 45:
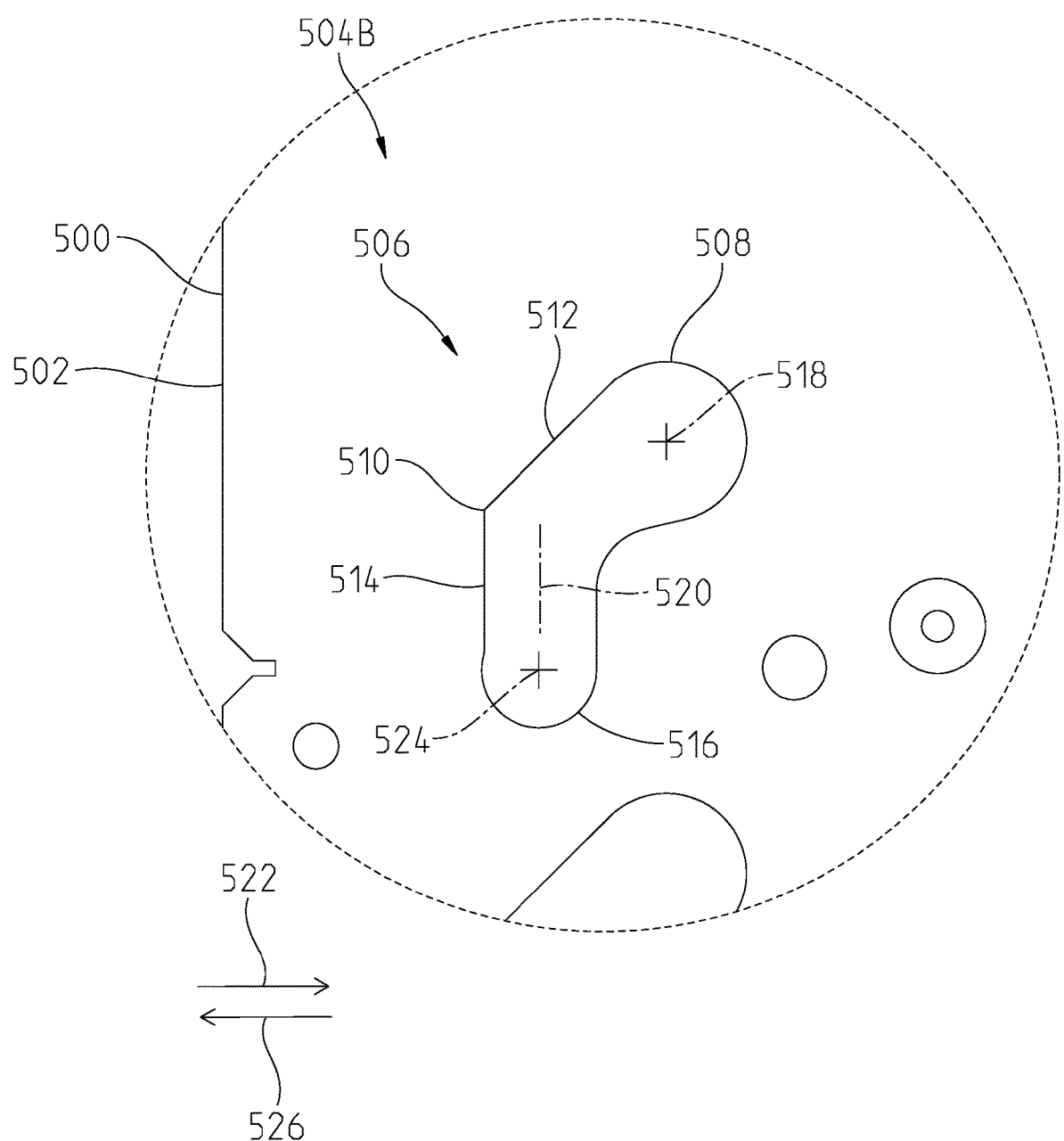
FIG. 45 illustrates a front view of an exemplary receiver of a display unit interface of the display mount of FIG. 44.

FIG. 45 illustrates an exemplary receiver 506 of group of display unit interfaces 504B of display mount 500. Each receiver 506 of display mount 500 may include, for example, the same or similar features as the illustrated receiver 506. Illustratively, receiver 506 is an aperture formed in main body 502 of display mount 500, and the aperture is adapted to receive a coupler (shown elsewhere) coupled to display unit 10 (shown elsewhere). Generally, receiver 506 has an asymmetric shape (relative to adjustment direction or a vertical direction). Such a shape advantageously facilitates coupling display units 10 to support system 200 in a generally diagonal direction 214, as described herein above and shown elsewhere. Generally, receiver 506 includes a dog leg-like shape. More specifically, receiver 506 includes an enlarged receiver portion 508, an angled intermediate portion 510 including an upper segment 512 and a lower segment 514, and a securement portion 516. Enlarged receiver portion 508 may have a relatively large diameter compared to other portions of receiver 506. A center 518 of enlarged receiver portion 508 may be offset from an upright axis 520 of receiver 506 (defined by lower segment 514 of intermediate portion 510) in a first offset direction 522. Upper segment 512 of intermediate portion 510 is accessible from enlarged receiver portion 508. Upper segment 512 of intermediate portion 510 may taper from enlarged receiver portion 508 inwardly to lower segment 514 of intermediate portion 510. Lower segment 514 of intermediate portion 510 is accessible from upper segment 512 of intermediate portion 510. Lower segment 514 and upper segment 512 of intermediate portion 510 may define an internal angle of about 105 degrees (that is, 105 degrees±10 degrees). Lower segment 514 of intermediate portion 510 may have a width that is substantially uniform. Securement portion 516 is accessible from lower segment 514 of intermediate portion 510. Securement portion 516 may have a diameter that is slightly larger than the width of lower segment 514 of intermediate portion 510. A center 524 of securement portion 516 may be offset from upright axis 520 of receiver 506 in a second offset direction 526. In alternative embodiments, a receiver may be provided with different sizes and/or shapes. For example, a receiver may have other types of asymmetric shapes or non-linear shapes, such as, for example, curved shapes. Although receiver 506 functions to secure a modular display unit 10 to display mount 500, portions of the shape of receiver 506 are non-functional and therefore may be selected based on their ornamental appeal. For example, in embodiments, enlarged receiver portion 508 functionally must be large enough to receive a head of a coupler (shown elsewhere) which, in turn, is coupled to a display unit 10, but the shape of enlarged receiver portion 508 may take on many aesthetically pleasing ornamental forms. In another example, in embodiments, securement portion 516 must be limited in size such that a head of a coupler may not pass through display mount 500, but the shape of securement portion 516 may take on many aesthetically pleasing ornamental forms.

Figure 46:
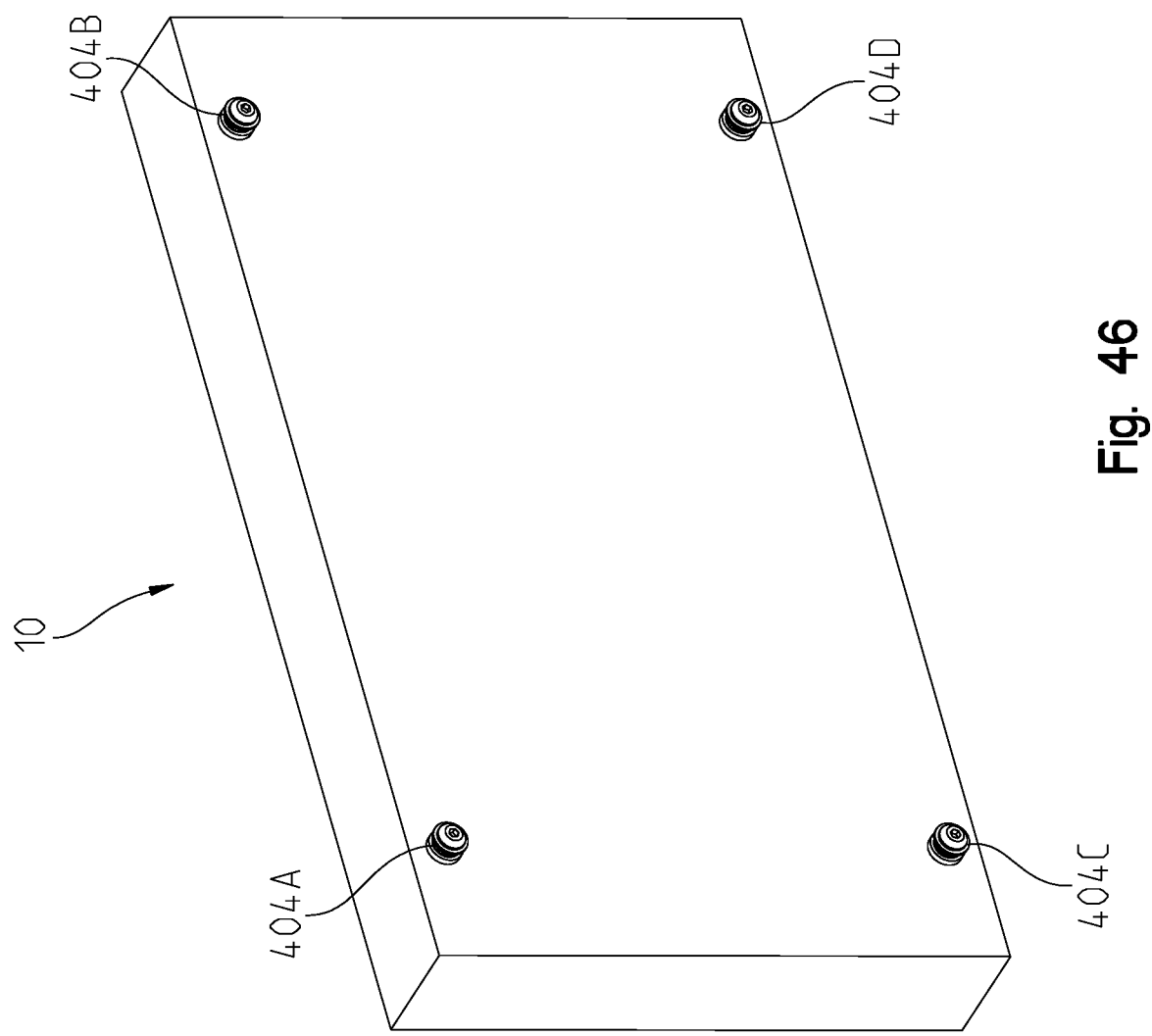
FIG. 46 illustrates a representative rear, perspective view of the exemplary display unit of FIG. 1 coupled to exemplary couplers.

Referring to FIG. 46, a representative rear, perspective view of display unit 10 is provided. In addition, couplers 404A-D are illustrated coupled to display unit 10. Couplers 404A-D are adapted to couple display unit 10 to display mounts 206 via interfaces (for example, receivers 382—shown elsewhere). Alternatively, couplers 404A-D may be adapted to couple to display mounts 206 and display units 10 may include interfaces (for example, receivers 382), and couplers 404A-D may couple display mounts 206 to display unit 10 via interfaces.

Figure 47:
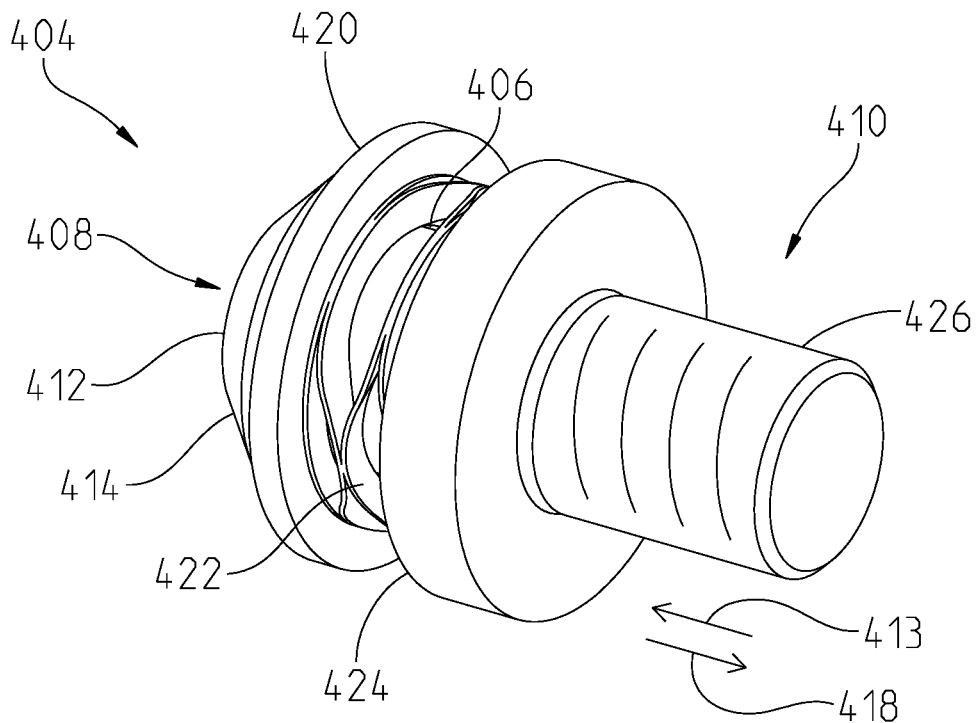
FIG. 47 illustrates a front, perspective view of an exemplary coupler adapted to couple a display unit to a mount.
Figure 48:
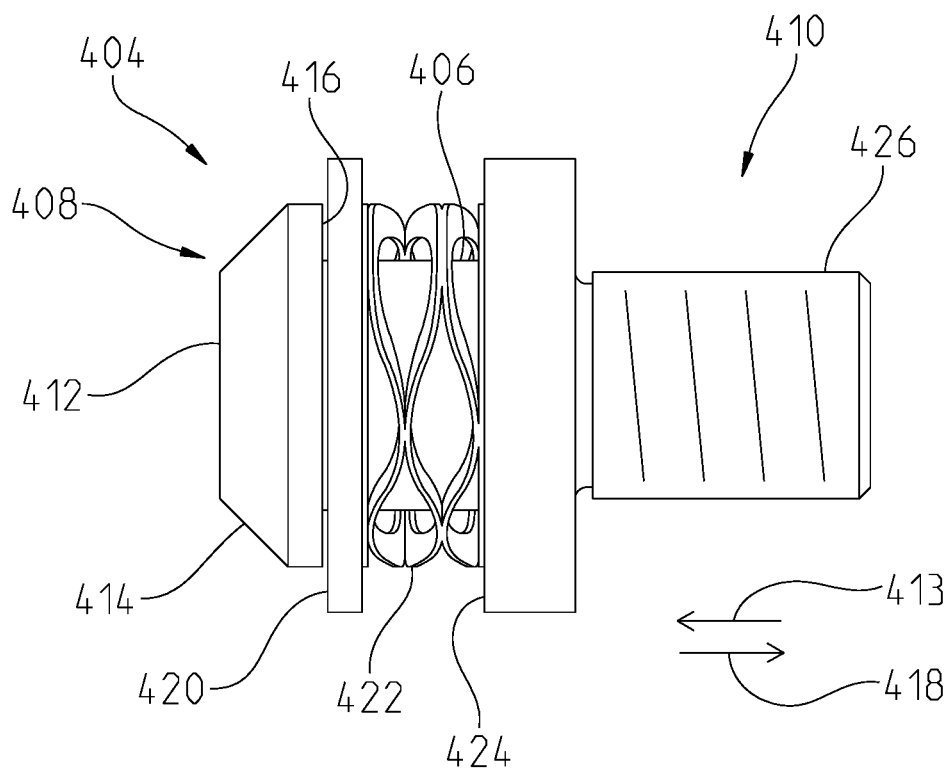
FIG. 48 illustrates a side view of the coupler of FIG. 47.
Figure 49:
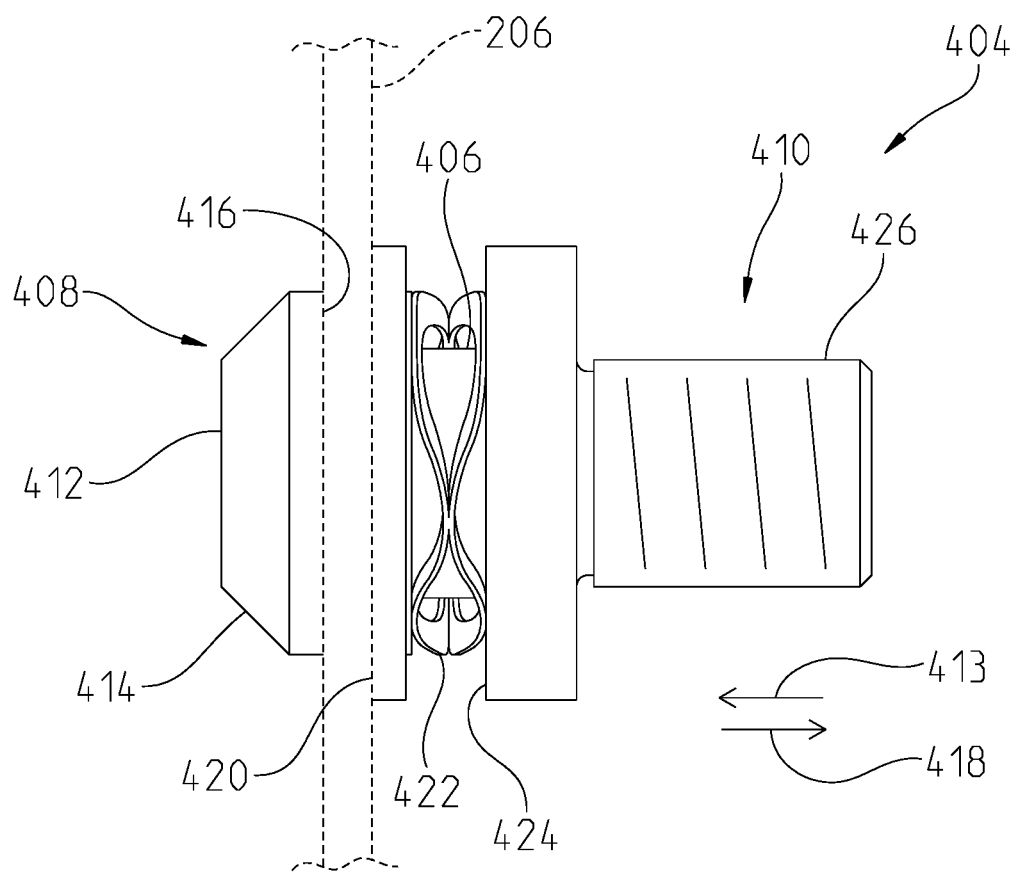
FIG. 49 illustrates a side view of the coupler FIG. 47 coupled to a display mount (illustrated with phantom lines).

FIGS. 47-48 illustrate various views of an exemplary coupler 404 that is adapted to couple a display unit 10 (shown elsewhere) to a mount, and FIG. 49 illustrates coupler 404 coupled to display mount 206. Each coupler 404A-D may include, for example, the same or similar features as illustrated coupler 404.

Generally, coupler 404 includes a central body 406 that couples a first end portion 408 to a second end portion 410. First end portion 408 includes an enlarged head 412 that is adapted to pass through enlarged receiver portion 384 of receiver 382 (shown elsewhere) of display mount 206 in direction 413. Enlarged head 412 also illustratively includes a tapered portion 414 on first end portion 408. Tapered portion 414 assists in aligning coupler 404 with receiver portion of receiver of display mount 206. Enlarged head 412 also includes a first shoulder 416 opposite tapered portion 414. First shoulder 416 is larger than securement portion 392 of receiver 382 (shown elsewhere) of display mount 206 such that when coupler 404 is positioned in securement portion 392 coupler 404 it is inhibited from being extracted from display mount 206 along direction 418.

Central body 406 is relatively small and is adapted to be received and translate through receiver perpendicularly to directions 413 and 418. Central body 406 movably carries a second shoulder 420, which is illustratively provided as a portion of a washer. Second shoulder 420 is larger than receiver portion of receiver and securement portion 392 of receiver 382 to inhibit second shoulder 420 from entering receiver along direction 413. Second shoulder 420 is urged toward first shoulder 416 by a biasing element 422 disposed between second shoulder 420 and a fixed, enlarged third shoulder 424. Biasing element 422 causes coupler 404 to compressively engage display mount 206 between first shoulder 416 and second shoulder 420. Illustratively, biasing element 422 is a compression spring, more specifically a crest-to-crest wave spring. Alternatively, biasing element 422 may take other forms, such as a Belleville washer, a helical spring, or the like.

Second end portion 410 of coupler 404 includes third shoulder 424, which is illustrated as a portion of an enlarged annular section. Second end portion 410 also includes a coupling section 426 that is adapted to couple to a display unit (shown elsewhere), which is illustrated as a threaded surface.

Figure 50:
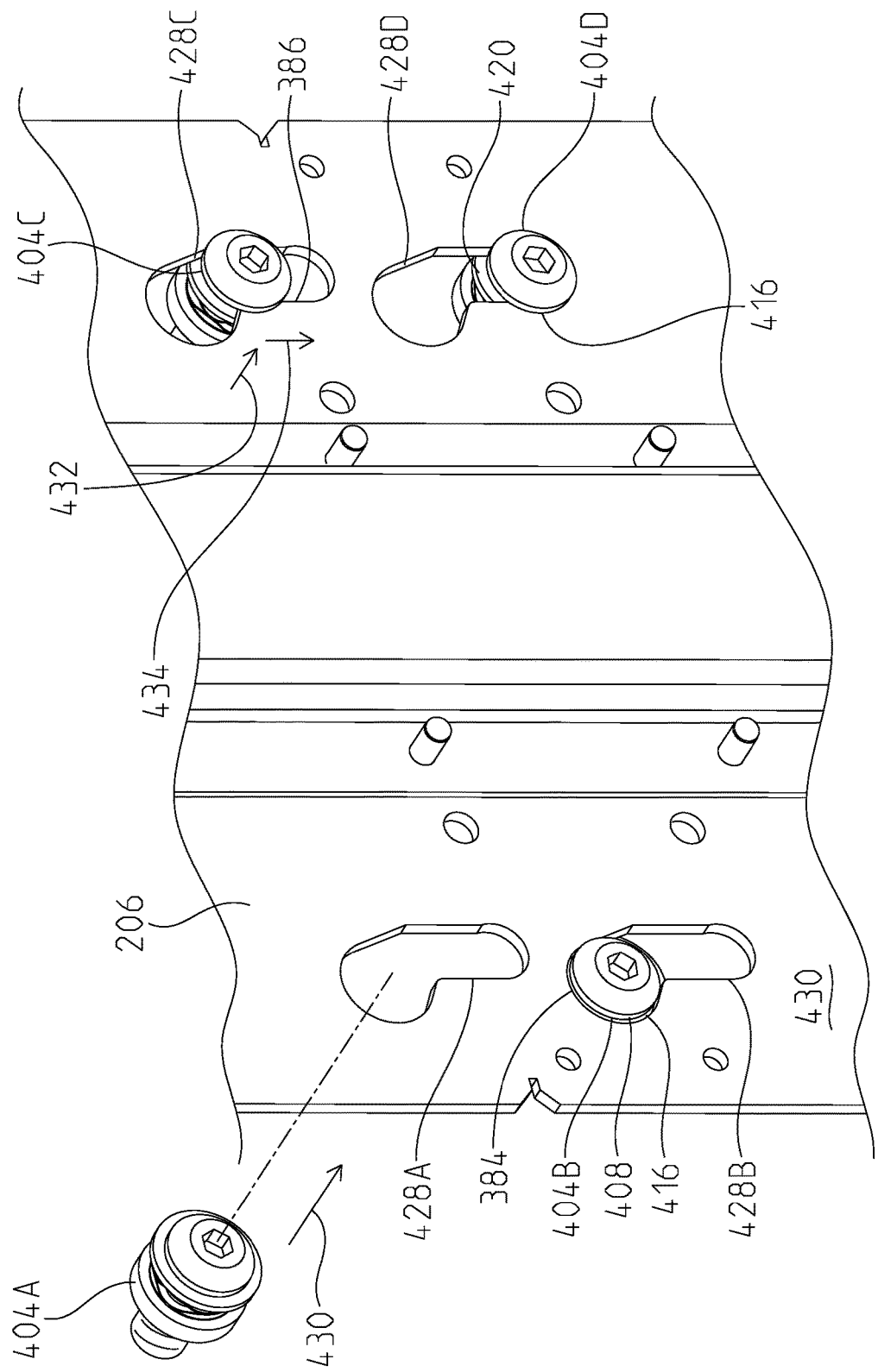
FIG. 50 illustrates a rear, perspective view of the display mount of FIG. 26 and a plurality of couplers of FIG. 47.

FIG. 50 illustrates a progression of the position of coupler 404 relative to display mount 206 when coupling coupler 404, and a display unit 10 (shown elsewhere) coupled to coupler 404, to display mount 206. First, coupler 404, as represented by a first coupler 404A, is aligned with any one of first display unit interface or receiver 428A, second display unit interface or receiver 428B, third display unit interface or receiver 428C, and fourth display unit interface or receiver 428D of display mount 206, each of which may include similar or the same features as receiver 382. Illustratively, first coupler 404A is aligned with first receiver 428A. First coupler 404A is then piloted towards display mount 206 along direction 430 and first receiver 428A of display mount 206. Next, first end portion 408 of coupler 404, as represented by a second coupler 404B, is received by display mount 206, illustratively by enlarged receiver portion 384 of second receiver 428B. First end portion 408 passes through second receiver 428B until first shoulder 416 is positioned rearward a rear surface 430 of display mount 206 and second shoulder 420 (shown elsewhere) is urged by biasing element 422 (shown elsewhere) into contact with a front surface (shown elsewhere) of display mount 206. Thereafter, coupler 404, as represented by a third coupler 404C, is moved downward and transversely in directions 432 and 434 and, illustratively, through intermediate portion 386 of third receiver 428C. Finally, central body 406 (shown elsewhere) of coupler 404, as represented by a fourth coupler 404D, is received, illustratively, in securement portion 392 (shown elsewhere) of fourth receiver 428D, and display mount 206 remains compressed between first shoulder 416 and second shoulder 420 of coupler 404. Using a plurality of couplers 404 to compressively engage display mounts 206 facilitates coupling display units 10 to display mounts 206 in a consistent manner, which advantageously facilitates precisely aligning display units 10 with each other.

Figure 51:
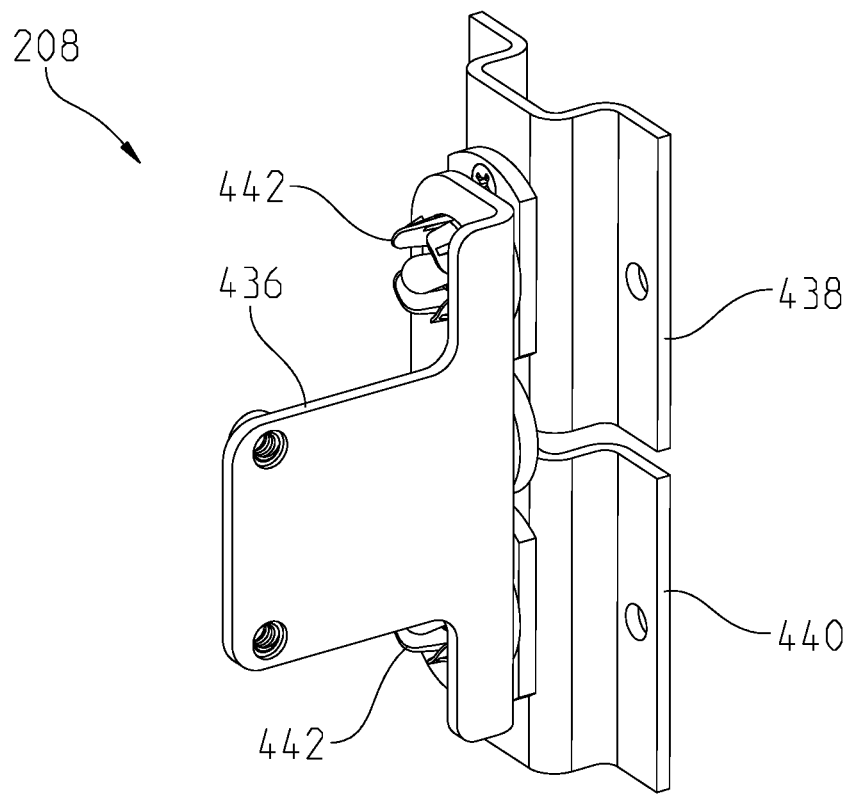
FIG. 51 illustrates a front, perspective view of an exemplary trim bracket of the support system of FIG. 9.
Figure 52:
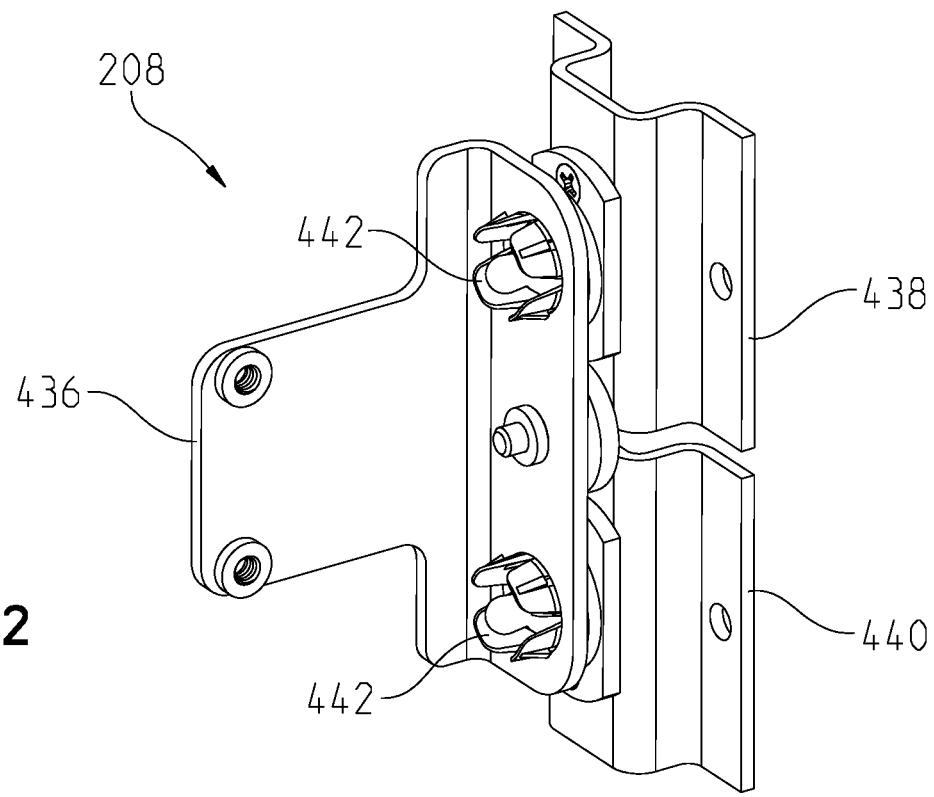
FIG. 52 illustrates a rear, perspective view of the trim bracket of FIG. 9.

FIGS. 51-52 illustrate various views of trim bracket 208. Each trim bracket 208 of support system 200 (shown elsewhere) may include, for example, the same or similar features as the illustrated trim bracket 208. Trim bracket 208 includes a first bracket portion 436 that couples to display mount 206, for example, via fasteners (not shown). Trim bracket 208 further also a second bracket portion 438 and a third bracket portion 440 that couples to trim components 210 (shown elsewhere), for example, via fasteners (not shown). Trim bracket 208 further includes joints 442 that couple first bracket portion 436 to second bracket portion 438 and third bracket portion 440. Joints 442 may be, for example, magnetic ball and socket joints.

Figure 53:
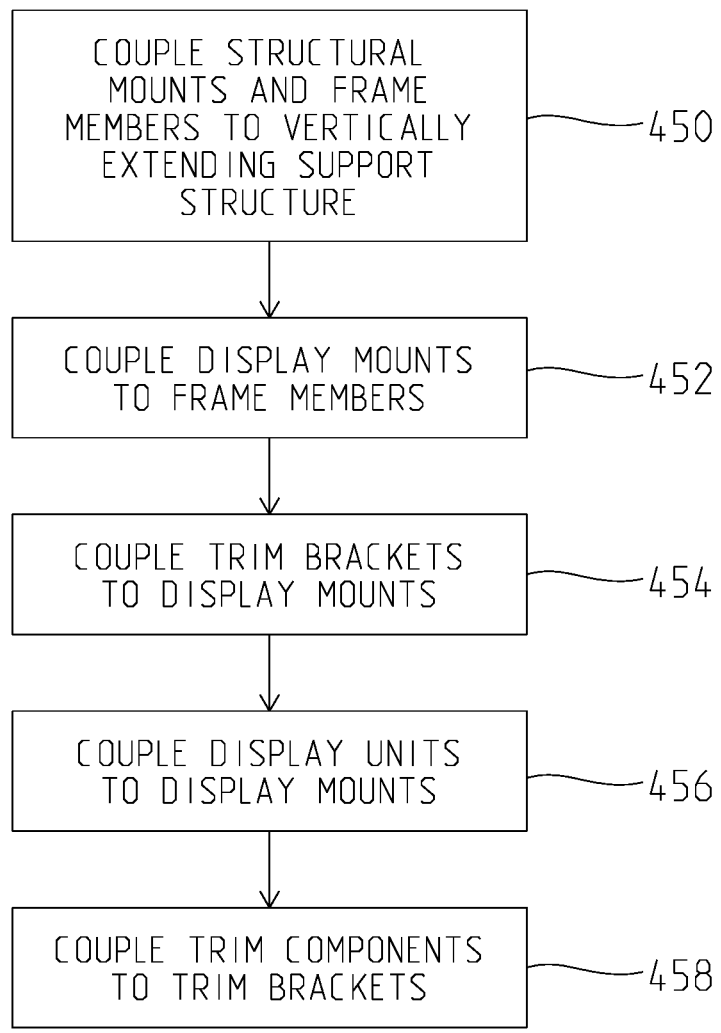
FIG. 53 illustrates an exemplary method for assembling a display wall.
Figure 54:
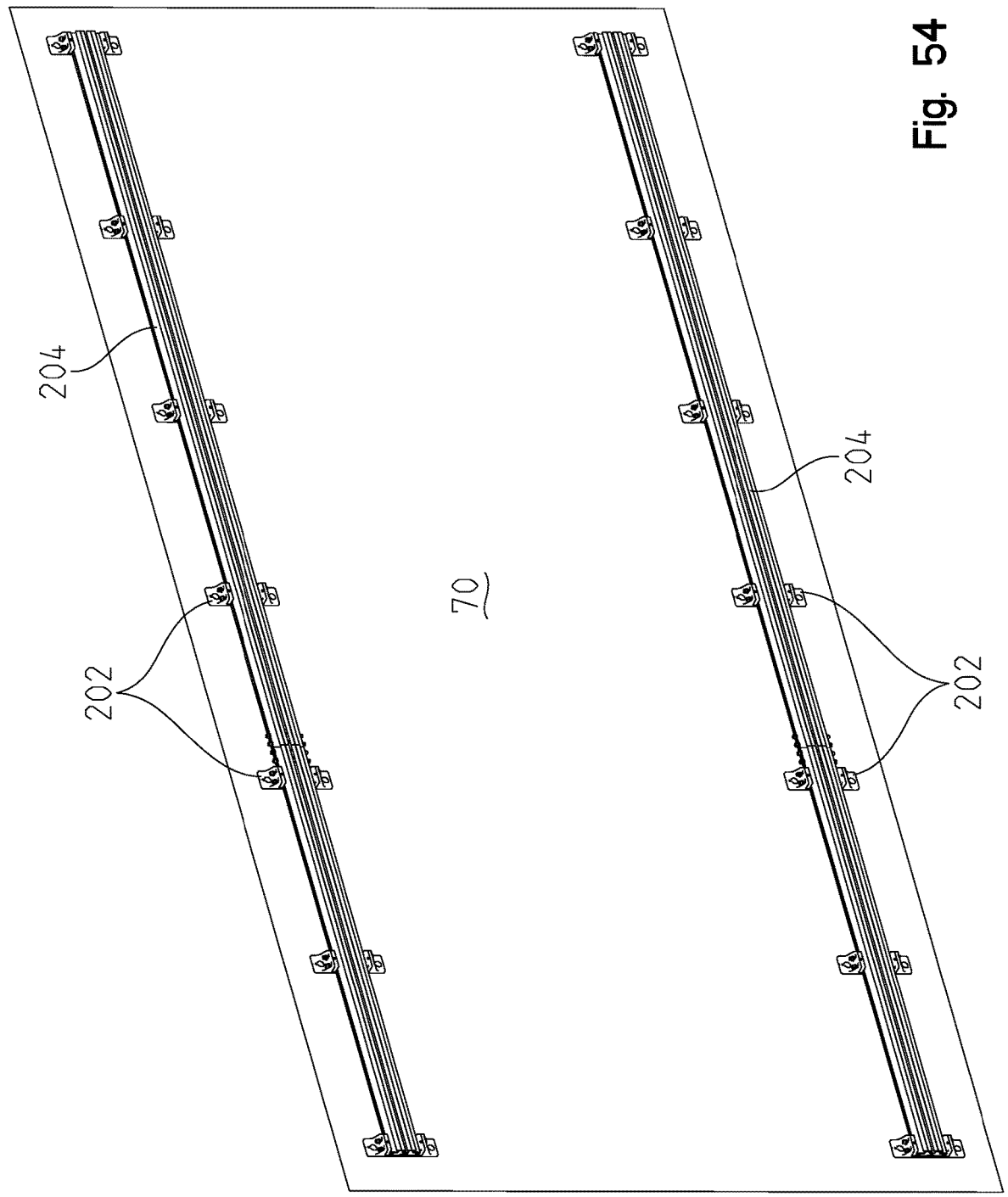
FIGS. 54-58 illustrate actions associated with the method of FIG. 53.
Figure 55:
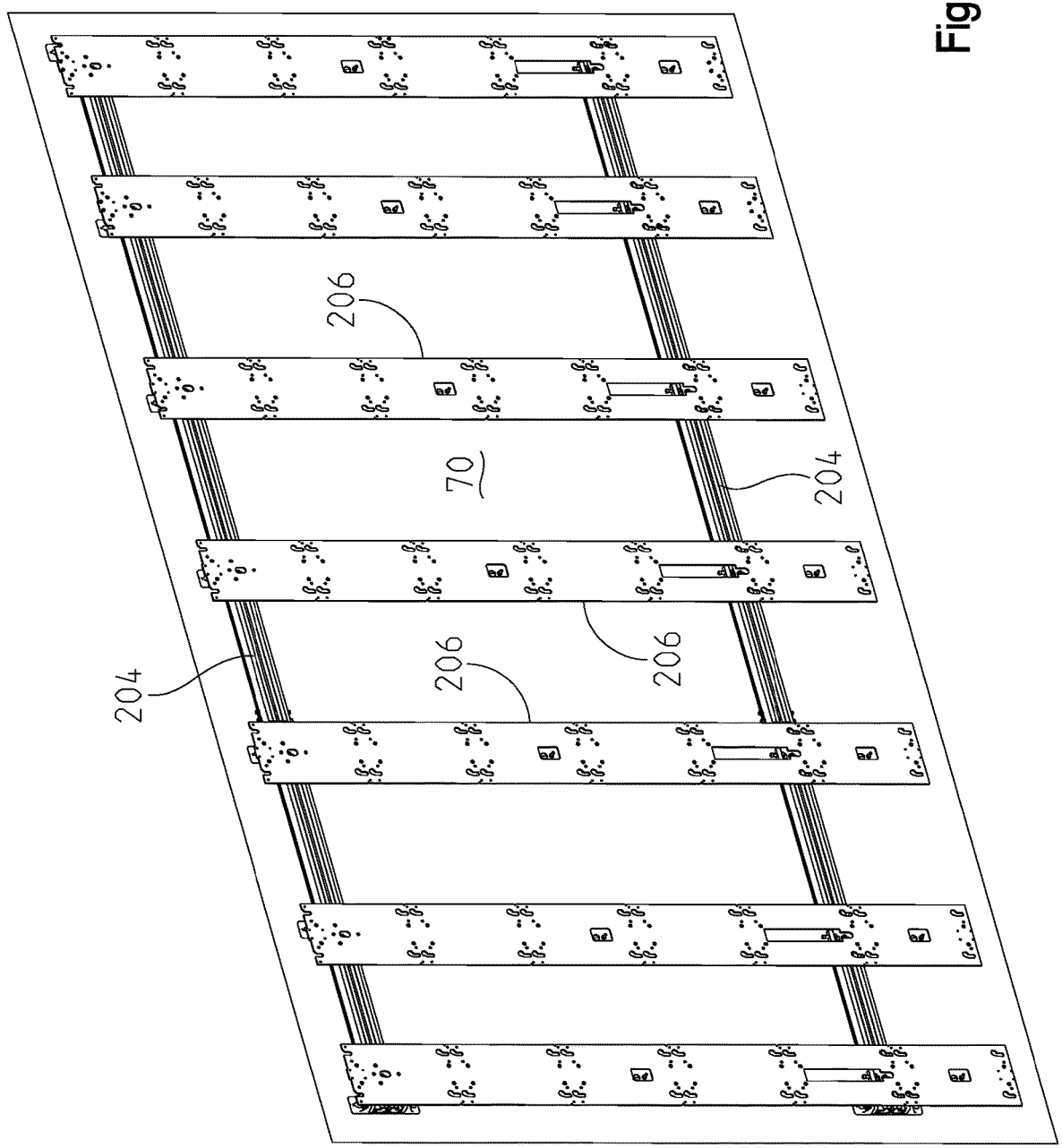
Figure 56:
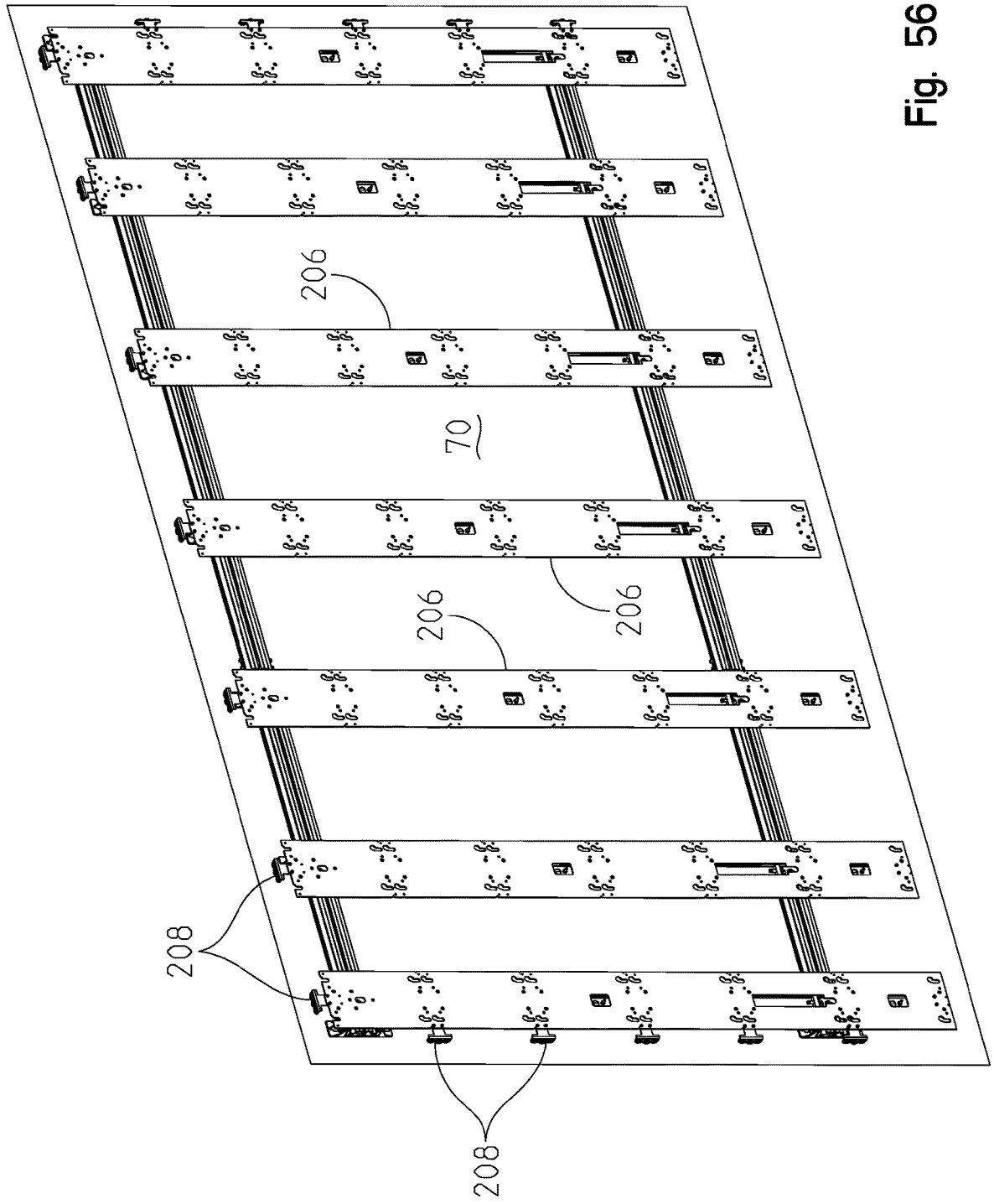
Figure 57:
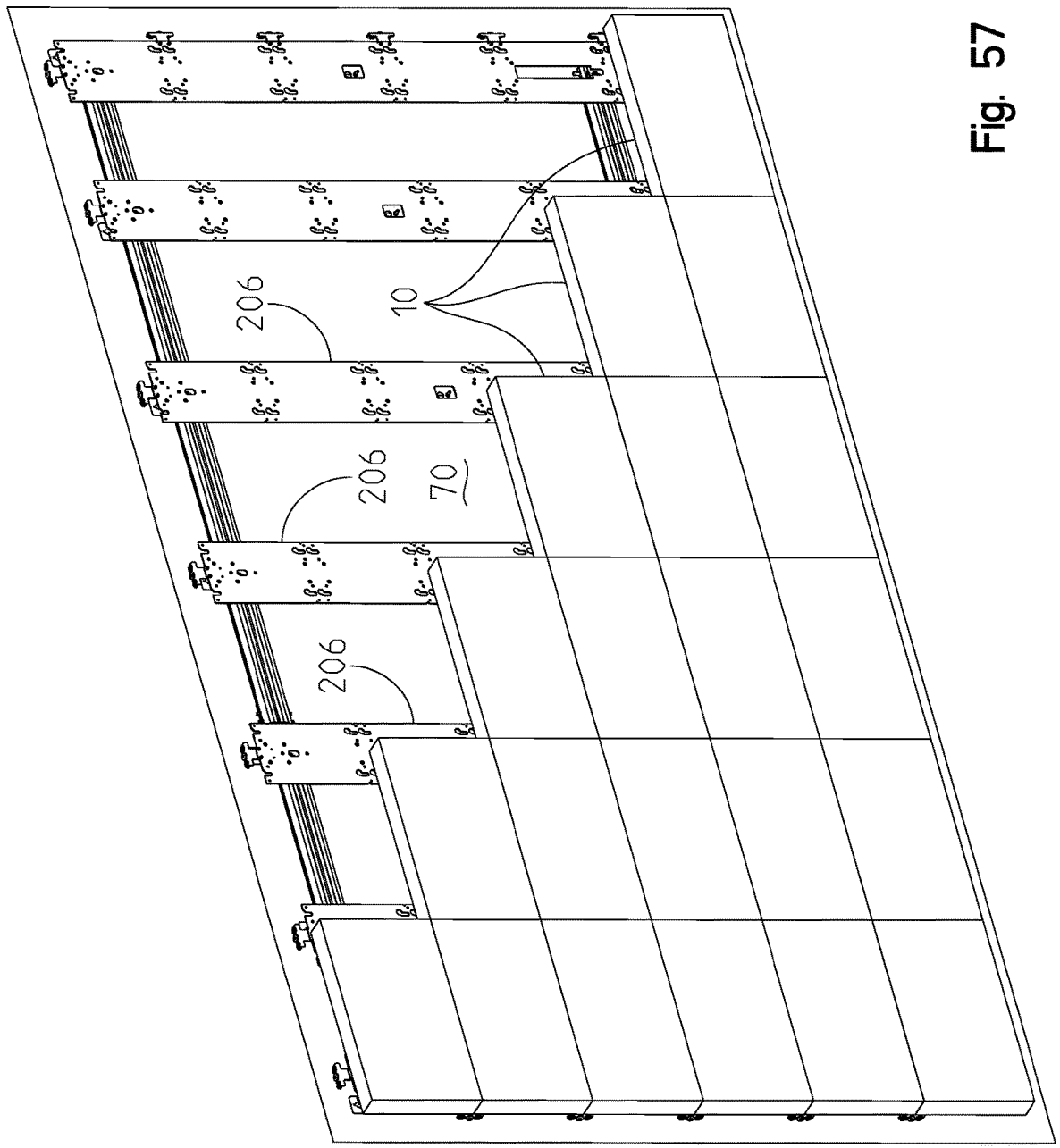
Figure 58:
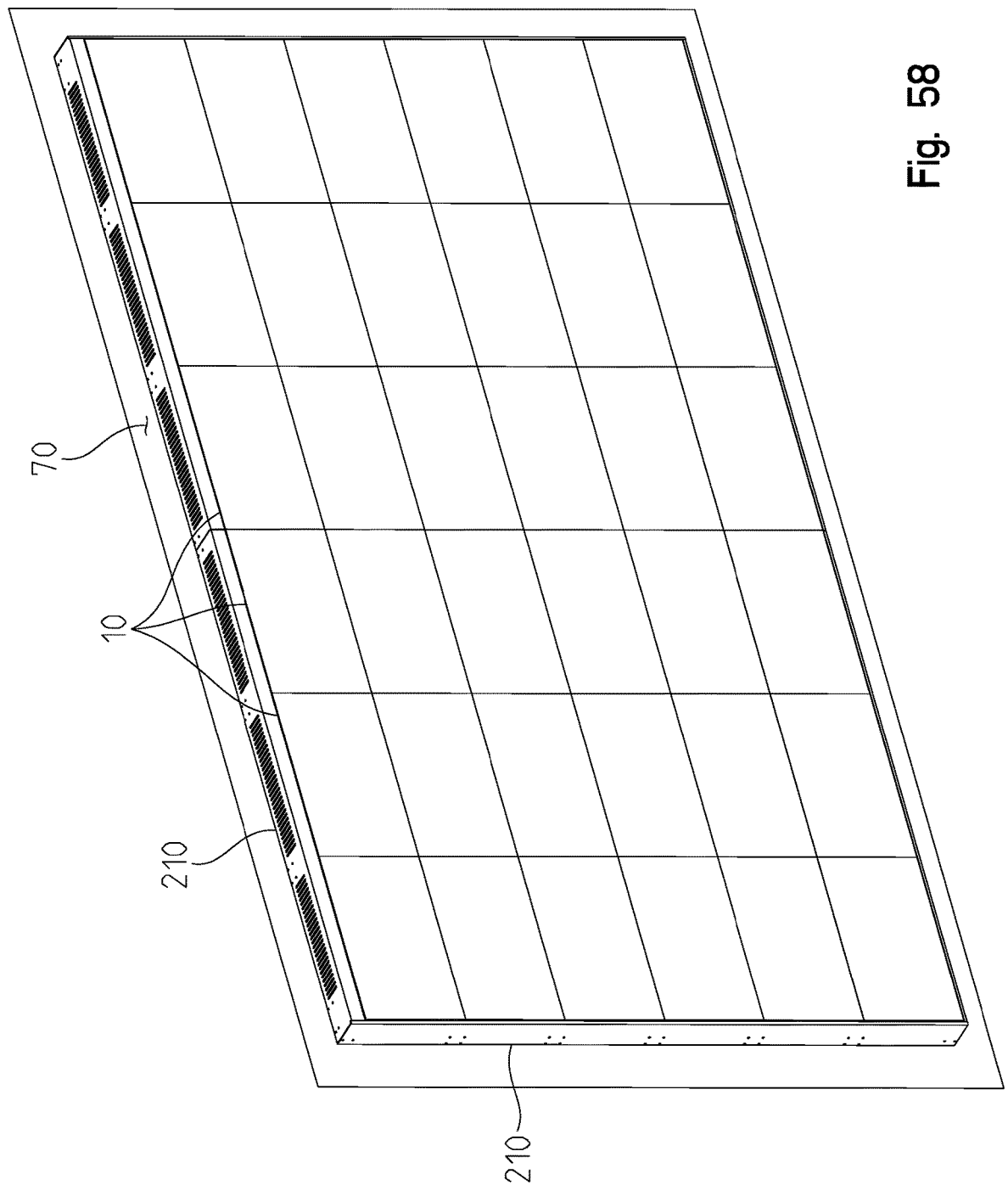

FIG. 53 illustrates an exemplary method for assembling a display wall, and FIGS. 54-58 illustrate actions associated with the method. The method begins at method block 450 and as shown in FIG. 54 by coupling structural mounts 202 and frame members 204 to a support structure 70. Such an action may include coupling a row of structural mounts 202 to one of frame members 204, simultaneously positioning the row of structural mounts 202 against support structure 70, and coupling the row of structural mounts 202 to support structure 70 via fasteners (not shown). Such an action may additionally or alternatively include adjusting upper adjustment mounting assemblies 232 and/or lower adjustment mounting assemblies 234 (shown elsewhere) of structural mounts 202 to reposition one or more of frame members 204. The method continues at method block 452 and as shown in FIG. 55 by coupling display mounts 206 to frame members 204. This action may include repositioning display mounts 206 relative to frame members 204 in one or more of the manners described herein above. The method continues at method block 454 and as shown in FIG. 56 by coupling trim brackets 208 to display mounts 206. The method continues at method block 456 and as shown in FIG. 57 by coupling display units 10 to display mounts 206. Such an action may include, for example, coupling display units 10 to display mounts 206 via couplers 404 in the manner described above in connection with FIG. 50. Finally, the method ends at method block 458 and as shown in FIG. 58 by coupling trim components 210 to trim brackets 208.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A support system for a plurality of display units adapted to be coupled to an environmental support structure, the support system comprising:
   a frame adapted to support the plurality of display units, the frame comprising a first frame member and a second frame member spaced apart from the first frame member, the first frame member defining a first support plane and the second frame member defining a second support plane, wherein a viewing direction of the plurality of display units is angled relative to the second support plane; and
   a plurality of mounts adapted to be supported by the environmental support structure and to support the frame, the plurality of mounts comprising a first mount and a second mount,
   the first mount comprising:
      a first side defining an environmental mounting plane, the first side adapted to be positionable adjacent the environmental support structure;
      a second side, the first frame member being coupled to the second side of the first mount; and
      an adjustment assembly which provides an offset adjustment of the first support plane relative to the environmental mounting plane and an angular adjustment of the first support plane relative to the environmental mounting plane; and
   the second mount comprising:
      a first side adapted to be positionable adjacent the environmental support structure; and
      a second side, the second frame member coupled to the second side of the second mount, wherein the adjustment assembly of the first mount is adapted to position the first support plane of the first frame member parallel to the second support plane of the second frame member and angled relative to the environmental mounting plane of the first mount.

2. The support system of claim 1, wherein the viewing direction of the plurality of display units is substantially perpendicular to the second support plane.

3. The support system of claim 1, wherein the adjustment assembly of the first mount is adapted to position the first support plane of the first frame member in a coplanar orientation relative to the second support plane of the second frame member and angled relative to the environmental mounting plane of the first mount.

4. The support system of claim 1, further comprising a display mount adapted to support the plurality of display units, the display mount coupled to the first frame member and the second frame member, and the display mount defining a mounting plane parallel to the second support plane of the second frame member.

5. The support system of claim 4, wherein the display mount comprises:
   a main body adapted to support the plurality of display units; and
   an adjuster coupled to the main body, the adjuster providing a transverse adjustment of the display mount relative to the first frame member and the second frame member in the mounting plane.

6. A support system for a plurality of display units adapted to be coupled to an environmental support structure, the support system comprising:
   a frame adapted to support the plurality of display units, the frame comprising a first frame member; and
   a plurality of mounts adapted to be supported by the environmental support structure and to support the frame, the plurality of mounts comprising a first mount, the first mount comprising:
      a first side portion comprising a mounting surface adapted to be positioned adjacent the environmental support structure; and
      a second side portion comprising an adjustment mounting assembly supporting the first frame member, the adjustment mounting assembly being movable in an adjustment direction relative to the mounting surface to move the first frame member in the adjustment direction relative to the mounting surface, the adjustment direction being substantially perpendicular to the mounting surface.

7. The support system of claim 6, wherein the first frame member is slidable along the adjustment mounting assembly in a transverse direction substantially perpendicular to the adjustment direction.

8. The support system of claim 6, wherein the adjustment mounting assembly is a first adjustment mounting assembly, and wherein the second side portion further comprises a second adjustment mounting assembly supporting the first frame member, the second adjustment mounting assembly being movable in the adjustment direction relative to the mounting surface to move the first frame member in the adjustment direction relative to the mounting surface.

9. The support system of claim 6, wherein the adjustment mounting assembly comprises a differential screw, the differential screw being adjustable in the adjustment direction relative to the mounting surface to move the first frame member in the adjustment direction relative to the mounting surface.

10. The support system of claim 9, wherein the differential screw comprises left-handed threads on a first end and right-handed threads on a second end opposite the first end.

11. A support system for a plurality of display units adapted to be coupled to an environmental support structure, the support system comprising:
   a frame adapted to support the plurality of display units, the frame comprising a first frame member; and
   a plurality of mounts adapted to be supported by the environmental support structure and to support the frame, the plurality of mounts comprising a first mount, the first mount comprising:
      a base adapted to be positioned adjacent the environmental support structure; and
      an adjustment mounting assembly movably coupled to the base, the adjustment mounting assembly slidably supporting the first frame member relative to the base in a first direction, and the adjustment mounting assembly being movable in a second direction relative to the base to move the first frame member in the second direction relative to the base, the second direction being substantially perpendicular to the first direction.

12. The support system of claim 11, further comprising a display mount adapted to be supported by the frame and adapted to support the plurality of display units, and the display mount being adjustable relative to the frame in a third direction, the third direction being substantially perpendicular to the first direction and the second direction.

13. The support system of claim 11, wherein the adjustment mounting assembly comprises a differential screw, the differential screw being adjustable in the second direction relative to the base to move the first frame member in the second direction relative to the base.

14. A support system for a plurality of display units, the support system comprising:
   a plurality of mounts adapted to support the plurality of display units, a first mount of the plurality of mounts including a plurality of display unit interfaces, a first display unit interface of the plurality of display unit interfaces comprising a receiver which receives a coupler adapted to be coupled to a first display unit of the plurality of display units, the receiver comprising:
      a receiver portion adapted to receive the coupler upon the coupler moving in a first direction relative to the first mount;
      an intermediate portion accessible from the receiver portion; and
      a securement portion accessible from the intermediate portion, the securement portion being offset from the receiver portion in (1) a second direction transverse relative to the first direction, and (2) a third direction transverse relative to the first direction and the second direction.

15. The support system of claim 14, wherein the receiver portion receives the coupler such that a coupler axis is in a first orientation, and the securement portion holds the coupler relative to the first mount while the coupler axis is in a second orientation different from the first orientation in a plurality of degrees of freedom.

16. The support system of claim 14, wherein the receiver portion is enlarged relative to the securement portion.

17. A support system for a plurality of display units adapted to be coupled to an environmental support structure, the support system comprising:
   a plurality of structural mounts adapted to be supported by the environmental support structure, a first structural mount of the plurality of structural mounts comprising:
      a base adapted to be positioned adjacent the environmental support structure; and
      an adjustment mounting assembly movably coupled to the base;

a frame supported by the plurality of structural mounts, the frame comprising a first frame member being slidably supported by the adjustment mounting assembly of the first structural mount in a first direction relative to the base of the first structural mount, and the adjustment mounting assembly being movable in a second direction relative to the base of the first structural mount to move the first frame member in the second direction relative to the base of the first structural mount, the second direction being substantially perpendicular to the first direction;

a plurality of display mounts supported by the frame, a first display mount of the plurality of display mounts comprising:
    a main body adapted to support the plurality of display units; and
    an adjuster coupled to the main body, the adjuster being adjustable to move the first display mount in a third direction relative to the frame, the third direction being substantially perpendicular to the first direction and the second direction.

18. The support system of claim 17, wherein the adjustment mounting assembly is a first adjustment mounting assembly, and wherein the first structural mount further comprises a second adjustment mounting assembly slidably supporting the first frame member in the first direction relative to the base of the first structural mount, the second adjustment mounting assembly being movable in the second direction relative to the base of the first structural mount to move the first frame member in the second direction relative to the base of the first structural mount.

19. The support system of claim 18, wherein the first adjustment mounting assembly comprises a first differential screw, the first differential screw being adjustable in the second direction relative to the base of the first structural mount to move the first frame member in the second direction relative to the base of the first structural mount, and wherein the second adjustment mounting assembly comprises a second differential screw, the second differential screw being adjustable in the second direction relative to the base of the second structural mount to move the second frame member in the second direction relative to the base of the second structural mount.

20. A coupler for coupling a display unit to a mount, one of the display unit and the mount including an aperture, the coupler comprising:
    a first end portion adapted to be received by the aperture, the first end portion comprising a first shoulder;
    a second end portion opposite the first end portion and adapted to couple to the other of the display unit and the mount;
    a second shoulder movable relative to the first shoulder; and
    a biasing element biasing the second shoulder toward the first shoulder such that the coupler is adapted to compressively engage the one of the display unit and the mount between the first shoulder and the second shoulder.

21. The coupler of claim 20, further comprising a third shoulder, the biasing element being compressed between the second shoulder and the third shoulder.

22. The coupler of claim 20, wherein the biasing element comprises a compression spring.

23. The coupler of claim 22, wherein the compression spring comprises a crest-to-crest wave spring.

24. A method of forming a display wall with a plurality of display units on an environmental support structure, the method comprising:
    (a) coupling a support system to the environmental support structure; the support system including a plurality of display unit interfaces, each display unit interface including a plurality of elongated receivers;
    (b) assembling a first display unit to a first group of the display unit interfaces including a first display unit interface, wherein the first display unit is coupled to the first display unit interface with a first receiver of the first display unit interface, the first group of display unit interfaces supporting the first display unit;
    (c) assembling a second display of the plurality of display units to a second group of the display unit interfaces different than the first group of display unit interfaces, the second group of display unit interfaces including the first display unit interface, wherein the second display unit is coupled to the first display unit interface with a second receiver of the first display unit interface, the second group of display unit interfaces supporting the second display unit; and
    (d) prior to steps (b) and (c) adjusting the support system to position the first group of display unit interfaces and the second group of display unit interfaces to support the first display unit and the second display unit with parallel viewing directions.

25. The method of claim 24, wherein step (a) comprises coupling a first mount and a second mount of the support system to the environmental support structure, and coupling a first frame member and a second frame member of the support system to the first mount and the second mount, respectively; and wherein step (d) comprises prior to steps (b) and (c) adjusting the first frame member via the first mount to position a first support plane of the first frame member parallel to a second support plane of the second frame member.

26. The method of claim 25, wherein step (a) further comprises coupling a display mount to the first frame member and the second frame member, the display mount comprising the first display unit interface; and wherein step (d) further comprises prior to steps (b) and (c) adjusting the display mount in a mounting plane defined by the display mount and parallel to the second support plane of the second frame member.

27. A method of forming a display wall with a plurality of display units on an environmental support structure, the method comprising:
    (a) coupling a support system to the environmental support structure, the support system having an outer envelope and the environmental support having a non-planar contour within the outer envelope of the support system; the support system including a plurality of display unit interfaces;
    (b) supporting a first display unit of the plurality of display units with a first group of the display unit interfaces including a first display unit interface;
    (c) supporting a second display of the plurality of display units with a second group of the display unit interfaces different than the first group of display unit interfaces; and
    (d) prior to steps (b) and (c) adjusting the support system to position the first group of display unit interfaces and the second group of display unit interfaces to support the first display unit and the second display unit with parallel viewing directions.

28. The method of claim 27, wherein step (a) comprises coupling a first mount and a second mount of the support system to the environmental support structure, and coupling a first frame member and a second frame member of the support system to the first mount and the second mount, respectively; and wherein step (d) comprises prior to steps (b) and (c) adjusting the first frame member via the first mount to position a first support plane of the first frame member parallel to a second support plane of the second frame member and angled relative to the non-planar contour of the environmental support.

29. The method of claim 28, wherein the first mount comprises a differential screw, and wherein step (d) comprises prior to steps (b) and (c) adjusting the first frame member by adjusting the differential screw.

30. A method of forming a display wall with a plurality of display units, the method comprising:
  assembling a support system comprising a plurality of mounts; and
  assembling the plurality of display units to the support system, comprising:
    piloting a first display unit of the plurality of display units, along a first direction, to a securable position relative to the plurality of mounts; and
    securing the first display unit by moving the first display unit from the securable position to a secured position along (1) a second direction transverse relative to the first direction, the second direction including a downward component, and (2) a third direction transverse relative to the first direction and the second direction, the third direction including a horizontal component, wherein the secured position is offset from the securable position in both the second direction and the third direction.

31. The method of claim 30, wherein securing the first display unit by moving the first display unit from the securable position to the secured position comprises receiving a coupler in a receiver.

32. The method of claim 31, wherein the receiver comprises a receiver portion, an intermediate portion accessible from the receiver portion, and a securement portion accessible from the intermediate portion, and wherein receiving the coupler in the receiver comprises moving the coupler in the intermediate portion while moving the coupler in both the second direction and the third direction.

33. A method of forming a display wall with a plurality of display units, the method comprising:
  assembling a support system, comprising:
    providing a frame member;
    providing a plurality of mounts, a first mount of the plurality of mounts comprising a base and an adjustment mounting assembly movably coupled to the base;
    slidably coupling the frame member to the adjustment mounting assembly in a first direction;
    coupling the first mount to an environmental support structure;
    moving the adjustment mounting assembly in a second direction relative to the base to move the first frame member in the second direction relative to the base, the second direction being substantially perpendicular to the first direction; and
  assembling the plurality of display units to the support system.

34. The method of claim 33, wherein the frame member is a first frame member, and further comprising:
  coupling a second frame member to a second mount of the plurality of mounts; and
  coupling the second mount to the environmental support structure;
  wherein moving the adjustment mounting assembly in the second direction relative to the base to move the first frame member in the second direction relative to the base comprises aligning the first frame member with the second frame member.

35. The method of claim 34, wherein coupling the first mount to the environmental support structure comprises coupling the first mount to a non-planar contour of the environmental support structure.

36. The method of claim 33, wherein moving the adjustment mounting assembly in the second direction relative to the base to move the first frame member in the second direction relative to the base comprises moving a differential screw in the second direction relative to the base.

* * * * *